(12) United States Patent
Sato et al.

(10) Patent No.: US 7,118,386 B2
(45) Date of Patent: Oct. 10, 2006

(54) SOCKET FOR SEMICONDUCTOR DEVICE

(75) Inventors: Masaru Sato, Yokohama (JP); Ryo Ujike, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/735,882

(22) Filed: Dec. 16, 2003

(65) Prior Publication Data

US 2004/0248435 A1 Dec. 9, 2004

(30) Foreign Application Priority Data

Dec. 17, 2002 (JP) .............................. 2002-365724
Nov. 21, 2003 (JP) .............................. 2003-393067

(51) Int. Cl.
*H01R 12/00* (2006.01)
(52) U.S. Cl. ......................................... 439/73; 439/331
(58) Field of Classification Search ................. 439/73, 439/266, 265, 267, 268, 330, 331, 259, 260
See application file for complete search history.

(56) References Cited

U.S. PATENT DOCUMENTS

| 4,715,823 A | 12/1987 | Ezura et al. |
| 4,887,969 A | 12/1989 | Abe |
| 5,249,972 A | 10/1993 | Walker |
| 5,301,416 A | 4/1994 | Foerstel |
| 5,458,499 A | 10/1995 | Matsuoka |
| 5,482,471 A | 1/1996 | Mori et al. |
| 5,493,237 A | 2/1996 | Volz et al. |
| 5,518,410 A | 5/1996 | Masami |

(Continued)

FOREIGN PATENT DOCUMENTS

EP          0 069 711 A2      1/2000

(Continued)

OTHER PUBLICATIONS

Official Notice of Rejection from Japanese Patent Office for Japanese Patent Application No. 2003-393067, dated Jul. 8, 2005.

(Continued)

*Primary Examiner*—Briggitte R. Hammond
(74) *Attorney, Agent, or Firm*—Finnegan, Henderson, Farabow, Garrett & Dunner LLP

(57) ABSTRACT

Lengths of arms of pressing members held at a lower end of an arm section of a cover member are determined in correspondence to the retention of semiconductor devices having contour dimensions different from each other, and are shorter than a length of the arm section so that part of the pressing members is projected outside through a recess of the socket body.

4 Claims, 67 Drawing Sheets

U.S. PATENT DOCUMENTS

| | | | |
|---|---|---|---|
| 5,531,608 A | 7/1996 | Abe | |
| 5,573,427 A | 11/1996 | Sagano | |
| 5,807,104 A | 9/1998 | Ikeya et al. | |
| 5,923,179 A | 7/1999 | Taylor | |
| 6,106,319 A | 8/2000 | Fukunaga et al. | |
| 6,149,449 A | 11/2000 | Abe | |
| 6,155,859 A | 12/2000 | Choy | |
| 6,213,806 B1 | 4/2001 | Choy | |
| 6,243,267 B1 | 6/2001 | Chuang | |
| 6,280,219 B1 * | 8/2001 | Sano et al. | 439/268 |
| 6,280,222 B1 | 8/2001 | Walkup | |
| 6,283,780 B1 * | 9/2001 | Yamamoto et al. | 439/266 |
| 6,296,505 B1 * | 10/2001 | Fukunaga et al. | 439/268 |
| 6,322,384 B1 | 11/2001 | Ikeya | |
| 6,350,138 B1 | 2/2002 | Atobe et al. | |
| 6,383,002 B1 | 5/2002 | Ohashi | |
| 6,439,897 B1 | 8/2002 | Ikeya | |
| 6,443,741 B1 | 9/2002 | Watanabe | |
| 6,517,370 B1 | 2/2003 | Fukunaga | |
| 6,739,894 B1 | 5/2004 | Ogura | |
| 6,752,645 B1 | 6/2004 | Nakamura et al. | |
| 6,758,684 B1 | 7/2004 | Oikawa et al. | |
| 6,776,641 B1 | 8/2004 | Hachuda | |

FOREIGN PATENT DOCUMENTS

| | | |
|---|---|---|
| EP | 0 969 710 A2 | 1/2000 |
| EP | 1 111 724 A2 | 6/2001 |
| JP | 60-189977 | 12/1985 |
| JP | 62-160676 | 7/1987 |
| JP | 63-299257 | 12/1988 |
| JP | 05-029050 | 2/1993 |
| JP | 5-047445 | 2/1993 |
| JP | 05-20286 | 3/1993 |
| JP | 6-020752 | 1/1994 |
| JP | 6-020753 | 1/1994 |
| JP | 6-203936 | 7/1994 |
| JP | 06-290839 | 10/1994 |
| JP | 7-239362 | 9/1995 |
| JP | 8-046335 | 2/1996 |
| JP | 8-138812 | 5/1996 |
| JP | 2665419 | 6/1997 |
| JP | 09-199217 | 7/1997 |
| JP | 09-199250 | 7/1997 |
| JP | 09-211067 | 8/1997 |
| JP | 9-245920 | 9/1997 |
| JP | 10-073635 | 3/1998 |
| JP | 10-256764 | 9/1998 |
| JP | 10-302925 | 11/1998 |
| JP | 11-097818 | 4/1999 |
| JP | 11-126671 | 5/1999 |
| JP | 11-238566 | 8/1999 |
| JP | 2000-113954 | 4/2000 |
| JP | 2000-150092 | 5/2000 |
| JP | 2000-182739 | 6/2000 |
| JP | 2000-340324 | 12/2000 |
| JP | 2001-066346 | 3/2001 |
| JP | 2001-185313 | 7/2001 |
| JP | 2001-326045 | 11/2001 |
| JP | 3257994 | 12/2001 |
| JP | 2002-63975 | 2/2002 |
| JP | 2002-202729 | 7/2002 |
| JP | 2003-007942 | 1/2003 |
| JP | 2003 123926 | 4/2003 |
| JP | 2004-014873 | 1/2004 |

OTHER PUBLICATIONS

Office Action from Japanese Patent Office corresponding to Japanese Patent Application No. 2001-171133.

Office Action from German Patent Office for German Patent Application No. 10223502.3-55 with English. translation.

Office Action dated Aug. 21, 2003, from USPTO for U.S. Appl. No. 10/212,875.

Notice of Allowance dated Feb. 10, 2004, from USPTO for U.S. Appl. No. 10/212,875.

Office Action dated May 5, 2003, from USPTO for U.S. Appl. No. 10/161,641.

Office Action dated Oct. 17, 2003, from USPTO for U.S. Appl. No. 10/161,641.

Notice of Allowance dated Feb. 17, 2004, from USPTO for U.S. Appl. No. 10/161,641.

Office Action dated Jun. 30, 2003, from USPTO for U.S. Appl. No. 10/153,638.

Notice of Allowance dated Oct. 15, 2003, from USPTO for U.S. Appl. No. 10/153,638.

Supplemental Notice of Allowance dated Mar. 26, 2004, from USPTO for U.S. Appl. No. 10/153,638.

* cited by examiner

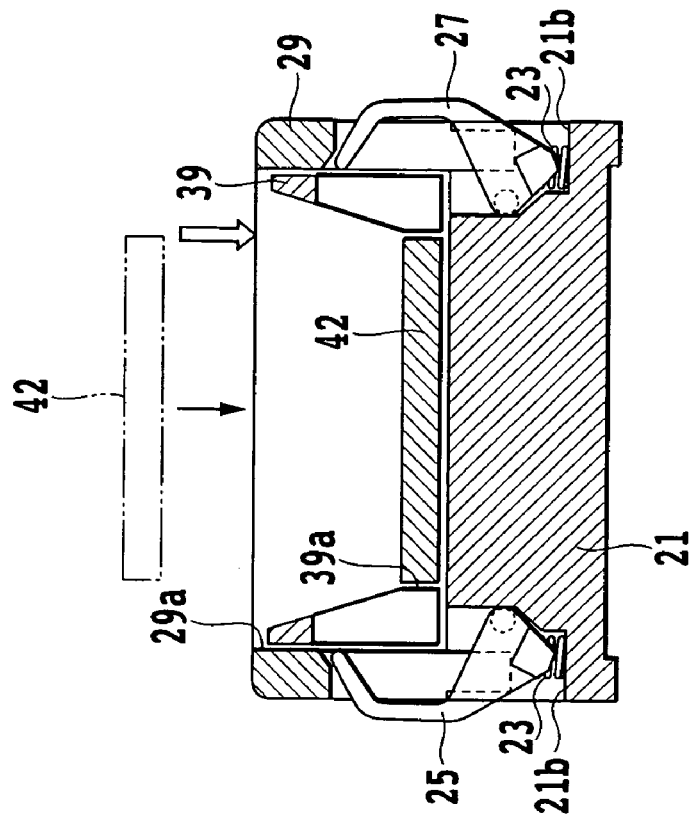
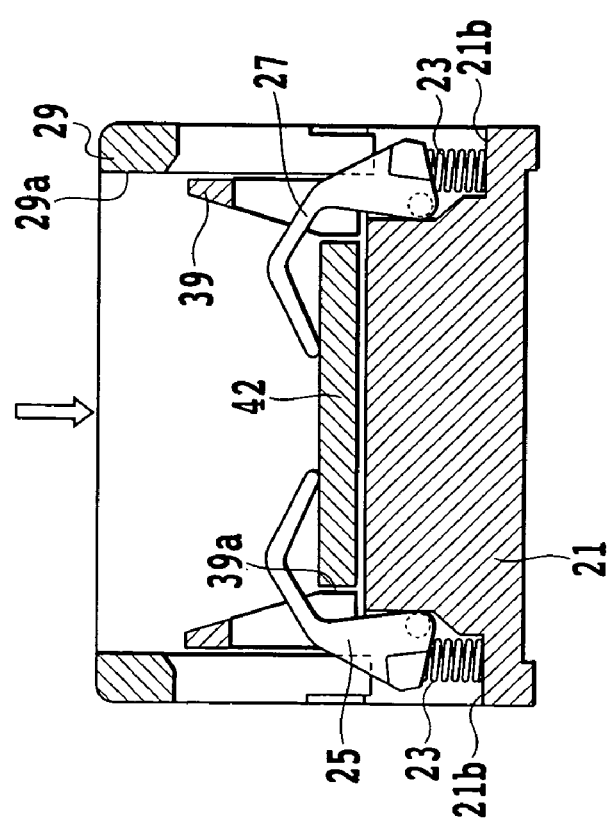

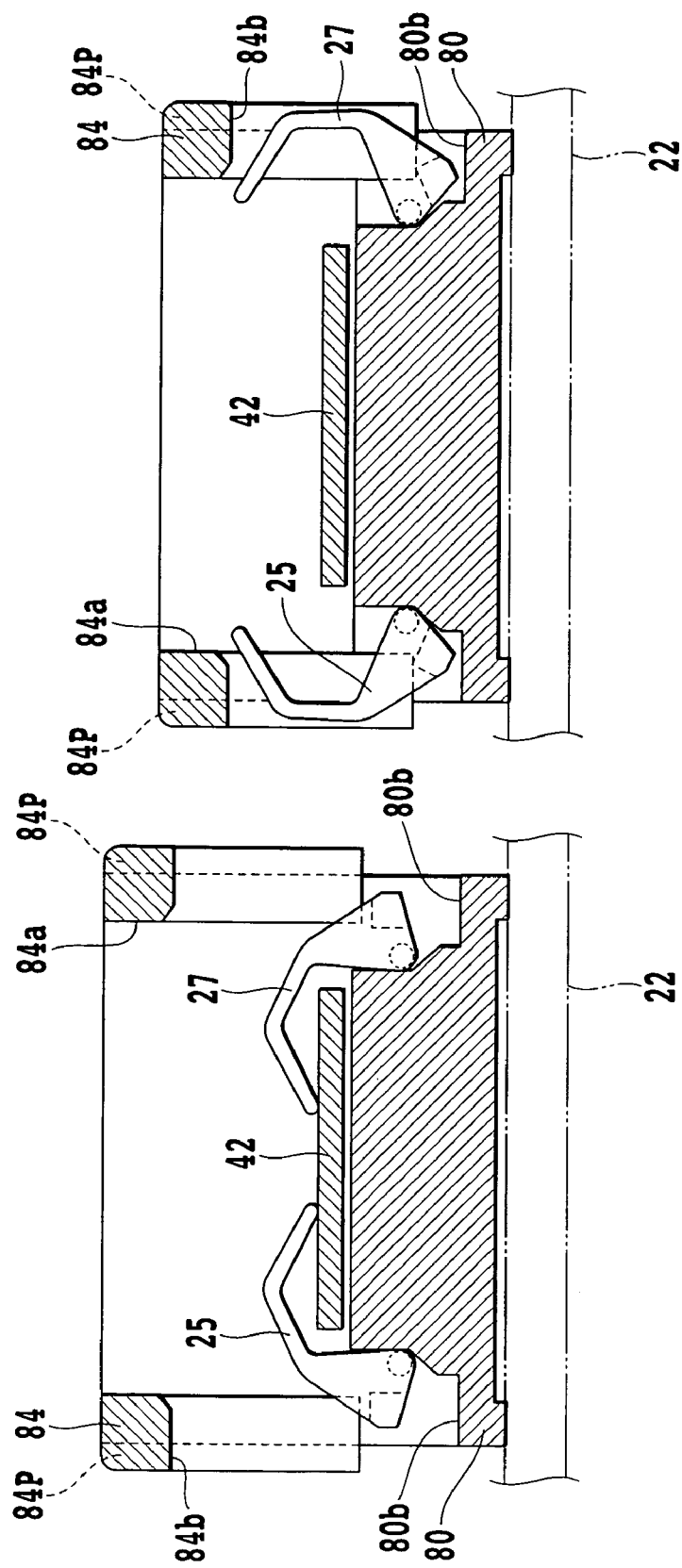

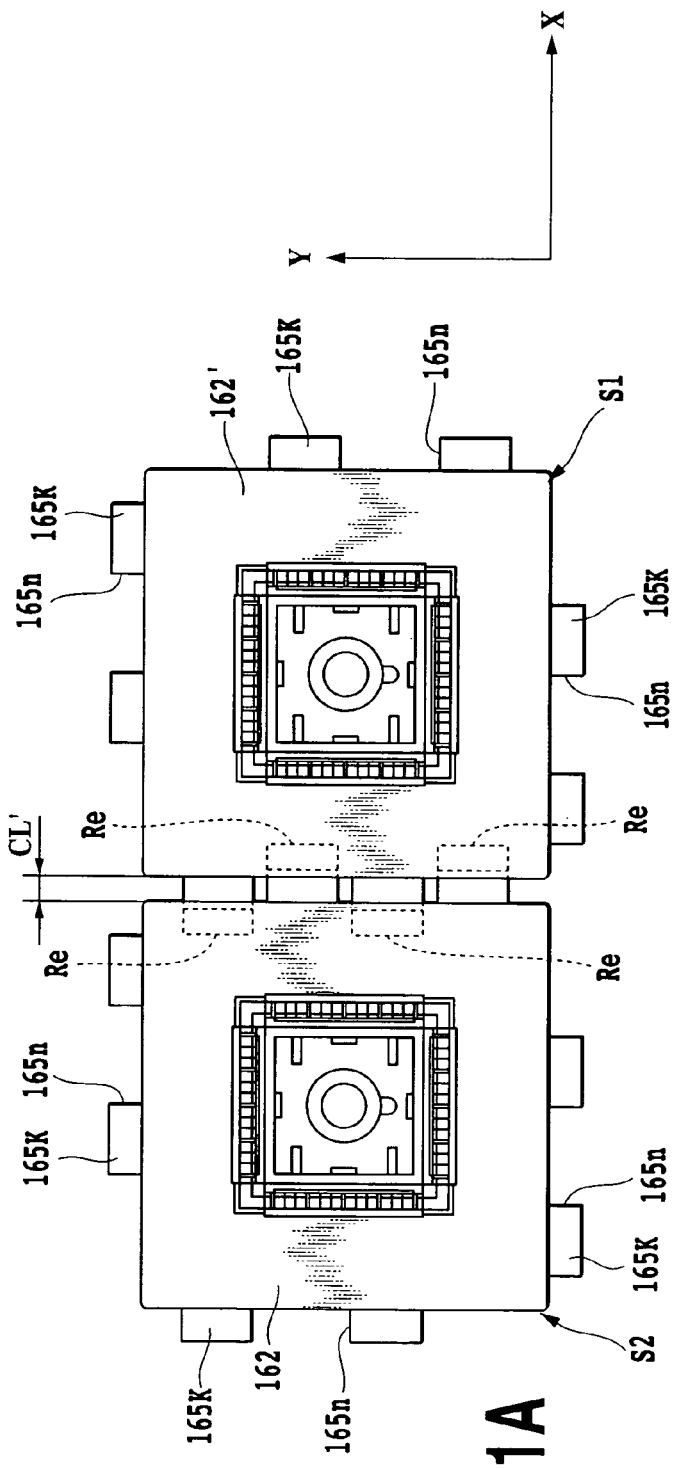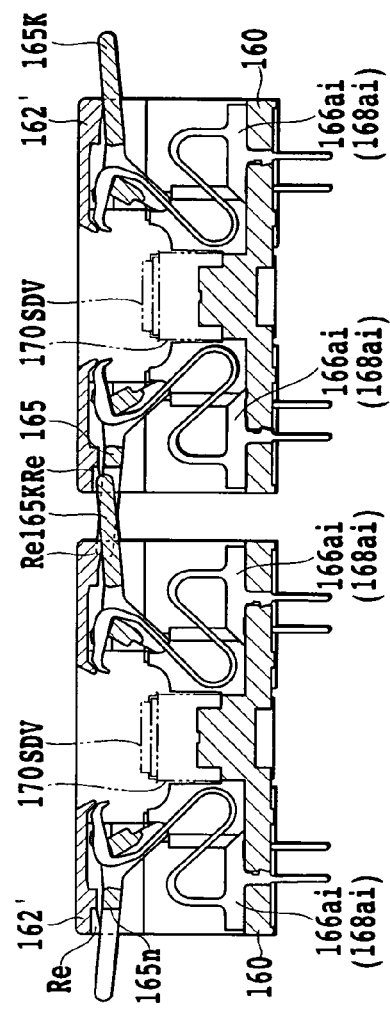
FIG.61A
FIG.61B

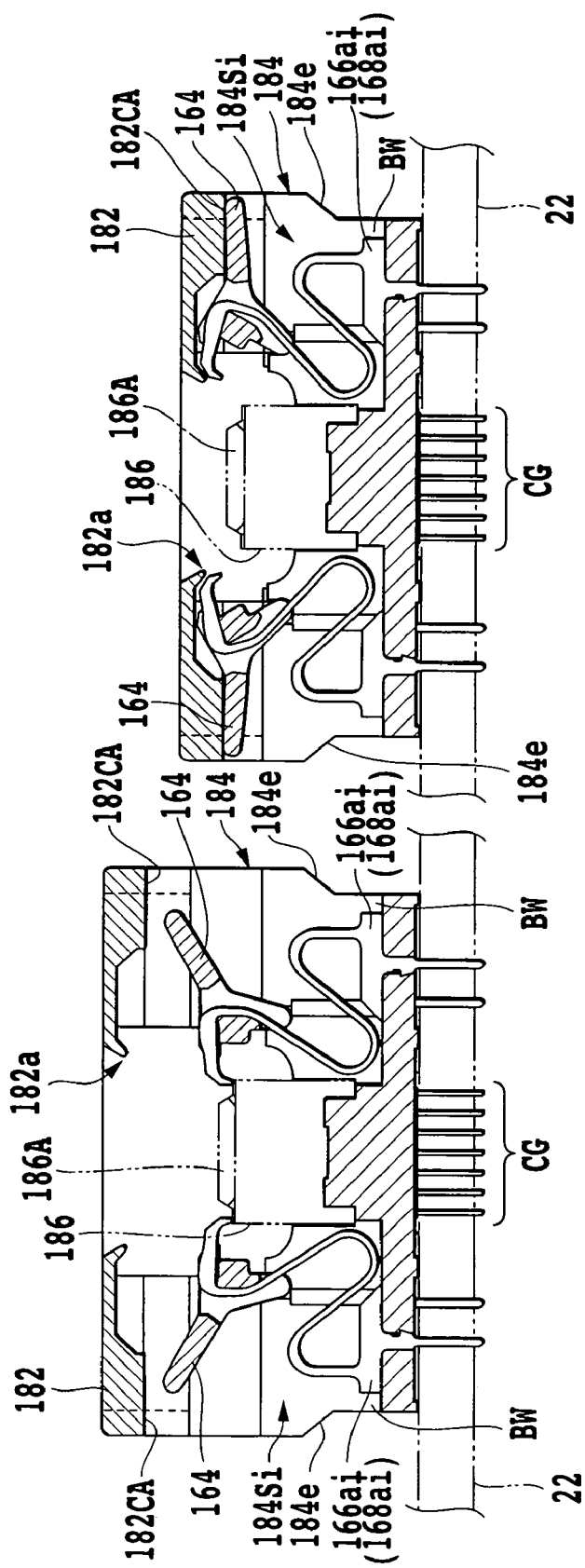

SOCKET FOR SEMICONDUCTOR DEVICE

This application claims priority from Japanese Patent Application Nos. 2002-365724 and 2003-393067 filed Dec. 17, 2002 and Nov. 21, 2003, respectively, which are incorporated hereinto by reference.

BACKGROUND OF THE INVENTION

1. Field of the Invention

The present invention relates to a socket for a semiconductor device capable of selectively mounting one of a plurality of semiconductor devices, each having a different contour dimension from the other.

2. Description of the Related Art

Semiconductor devices to be mounted to electronic equipments are subjected to various tests prior to being actually mounted so that latent defects thereof are to be removed. Such tests are carried out in a non-destructive manner by the application of voltage stress, the operation in a hot environment or the hot holding in accordance with the thermal or mechanical environmental inspections. Of these tests, one effective for the removal of an integrated circuit having an infant mortality failure is a burn-in test as the operation test carried out for a predetermined period in a high-temperature condition.

A socket for a semiconductor device subjected to such a test is generally referred to as an IC socket which is disposed on a printed wiring board having an input/output section for receiving a predetermined test voltage into a semiconductor device to be tested and transmitting an abnormality detection signal representing a short-circuit or others generated from the semiconductor device as disclosed, for example, in Japanese Patent Application Laid-open No. 2001-185313.

As shown in FIG. 67, the socket for a semiconductor device includes a socket body 4 disposed on a printed wiring board not illustrated and accommodating a group of contact terminals (not shown) for the electric connection of a semiconductor device 2 with the printed wiring board, a positioning member 6 disposed above the contact terminal group within the socket body 4 and having an accommodating section 6a for mounting the semiconductor device 2 therein, a latch mechanism disposed around the positioning member 6 and having a pair of pressing members 8 for selectively holding the semiconductor device 2 relative to the accommodating section 6a of the positioning member 6, and a cover member 10 for transmitting the operative force via a drive mechanism to the latch mechanism 8 so that the pressing members 8 are operated.

The positioning member 6 is fixed to the socket body 4 so that the relative position of the terminals of the semiconductor device 2 to the contact terminal group is determined by locating the outer periphery of the semiconductor device 2 mounted within the accommodating section 6a at a desired position.

The pair of pressing members 8 of the latch mechanism are arranged opposite to each other while interposing the semiconductor device 2 between the both. The pressing member 8 comprises of a proximal end 8B supported rotational moveably by the socket body 4 and coupled to the above-mentioned drive mechanism, an touch portion 8P for selectively being in contact with or apart from the outer periphery of the semiconductor device 2, and a connecting portion 8C for coupling the proximal end 8B with the touch portion 8P.

When the semiconductor device 2 is mounted within the accommodating section 6a, the touch portion 8P of the pressing member 8 is located at a position in readiness apart from the accommodating section not to interfere with the semiconductor device 2, and after the semiconductor device 2 has been mounted in the accommodating section, the touch portion 8P of the pressing member 8 enters the accommodating section 6a as shown in FIG. 67 to occupy the holding position.

The cover member 10 has an opening 10a in a central area thereof for allowing the semiconductor device 2 to pass through the same when the semiconductor device 2 is mounted into or removed from the accommodating section 6a of the positioning member 6. The cover member 10 is adapted to be movable upward and downward to the socket body 10 and coupled to a drive mechanism (not shown). The drive mechanism may be, for example, a link mechanism or a cam mechanism for coupling the cover member 10 with the proximal end of the pressing member 8 in the latch mechanism to move rotationaly the pressing member 8 in accordance with the upward/downward motion of the cover member 10.

In such a construction, when the semiconductor device 2 is mounted into the accommodating section 6a of the positioning member 6 through the opening 10a of the cover member 10, it is possible to mount the semiconductor device 2 into the accommodating section 6a because the cover member 10 is pushed downward to be hold from the upper position at a predetermined stroke relative to the socket body 4 and the positioning member 6 to locate the touch portions 8P of the pair of pressing members 8 at the position in readiness apart from each other relative to the accommodating section 6a of the positioning member 6.

Then, if the cover member 10 is released from the holded state, the cover member 10 moves upward by a force of a biasing member not shown to the initial position and the touch portions 8P of the pressing members 8 move from the position in readiness relative to the accommodating section 6a of the positioning member 6 to be close to each other to press the terminals of the semiconductor device 2 located by the positioning member 6 toward the contact terminal group at the holding position. Accordingly, the semiconductor device 2 is held in the accommodating section 6a of the positioning member 6.

When semiconductor devices having various contour dimensions different from each other are tested by using the above-mentioned IC socket, it has been desired that one kind of the IC socket is commonly usable thereto and the more number of IC sockets are mounted at a higher density onto the printed wiring board.

However, since the number of IC sockets mounted onto one printed wiring board is as large as possible at present for the purpose of carrying out the burn-in test at a high efficiency, a mutual distance between the adjacent IC sockets is considerably small.

Under the present conditions, it may be thought to minimize a whole size of the IC socket for the purpose of increasing the number of IC sockets to be mounted. However, such a downsizing of the whole size of the IC socket has a limitation in view of the above-mentioned common use of one kind of the IC socket.

SUMMARY OF THE INVENTION

With reference to the above-mentioned problems, an object of the present invention is to provide a socket for a semiconductor device capable of selectively mounting thereon one of a plurality of semiconductor devices having contour dimensions different from each other, which is capable of reducing an occupation area of a socket body on a printed wiring board and being arranged to be close to the adjacent one for the purpose of realizing the high-density arrangement of the IC sockets. To achieve the above-mentioned object, a socket for a semiconductor device according to the present invention the inventive socket for a semiconductor device, comprises a socket body having a semiconductor device placement section for selectively accommodating one of a plurality of semiconductor devices having contour dimensions different from each other, to be electrically connected to contact terminals, a pressing member having an touch portion brought in contact with the semiconductor device and pressing the semiconductor device toward the contact terminals, the pressing member being driven by a pressing member driving mechanism in accordance with the attachment or detachment of the semiconductor device relative to the semiconductor device placement section, for holding the semiconductor device in the semiconductor device placement section; and wherein, when the pressing member driving mechanism moves the touch portion of the pressing member to be away from the semiconductor device to a position in readiness at which the touch portion of the pressing member is not interfered with the semiconductor device upon the attachment or detachment of the semiconductor device, a portion of the pressing member is bulged outwardly from an end of the socket body via an opening of the socket body.

Also, the inventive socket for a semiconductor device, comprises a socket body having a semiconductor device placement section for selectively accommodating one of a plurality of semiconductor devices having contour dimensions different from each other, to be electrically connected to contact terminals, a pressing member having an touch portion brought in contact with the semiconductor device and pressing the semiconductor device toward the contact terminals, for holding the semiconductor device in the semiconductor device placement section; and a cover member supported by the socket body in a movable manner for bring the touch portion of the pressing member into contact with or away from the semiconductor device in accordance with the attachment or detachment of the semiconductor device relative to the semiconductor device placement section; wherein, the cover member and the socket body have openings, respectively, so that when the cover member causes the touch portion of the pressing member to be away from the semiconductor device to a position in readiness at which the touch portion of the pressing member is not interfered with the semiconductor device, a portion of the pressing member is bulged outwardly from an end of the socket body via the openings.

Also, the inventive socket for a semiconductor device comprises a first pressing member for holding the semiconductor device in the semiconductor device placement section, having a proximal end supported in a moveably rotationally manner at one end of the socket body and an touch portion formed at the proximal end while being deviated in one widthwise direction to be in contact with the semiconductor device so that the semiconductor device is pressed toward the contact terminals; and a second pressing member for holding the semiconductor device in the semiconductor device placement section in association with the first pressing member, having a proximal end supported in a moveably rotationally manner at the other end of the socket body and an touch portion formed at the proximal end corresponding to the touch portion of the first pressing member while being deviated in the other widthwise direction to be in contact with the semiconductor device so that the semiconductor device is pressed toward the contact terminals.

Also, the inventive socket for a semiconductor device comprises a first pressing member for holding the semiconductor device in the semiconductor device placement section, having a proximal end supported in a moveably rotationally manner at one end of the socket body and an touch portion in contact with the semiconductor device and pressing the semiconductor device toward the contact terminals; and a second pressing member for holding the semiconductor device in the semiconductor device placement section in association with the first pressing member, having a proximal end supported in a moveably rotationally manner at the other end of the socket body and an touch portion in contact with the semiconductor device so that the semiconductor device is pressed toward the contact terminals; wherein the second pressing member has a recess for allowing a portion of the first pressing member to enter.

The inventive socket for a semiconductor device comprises a socket body having a semiconductor device placement section for placing the semiconductor device, contact terminals, each having a contact portion movable to be close to or away from the semiconductor device placement section, for electrically connecting terminals of the semiconductor device to a signal input/output section via the contact portions, and a cover member disposed in the socket body in a movable manner for causing the contact portions of the contact terminals to be close to or away from the semiconductor device placement section, wherein when the cover member moves close to the socket body, the contact portions of the contact terminals are away from the semiconductor device placement section and tip ends of engagement end sections of the contact terminals engaged with the cover member are projected outwardly through an opening of the cover member. The inventive socket for a semiconductor device comprises a socket body having a semiconductor device placement section for placing the semiconductor device, contact terminals, each having a contact portion movable to be close to or away from the semiconductor device placement section, for electrically connecting terminals of the semiconductor device to a signal input/output section via the contact portions, and a lever member disposed in the socket body in a moveably rotational manner for causing the contact portions of the contact terminals to be close to or away from the semiconductor device placement section, and a cover member disposed in the socket body in a movable manner for moving rotationally the lever member, wherein when the cover member is made to move close to the socket body, the contact portion of the contact terminal is away from the semiconductor device placement section and one end of the lever member engaged with the cover member is projected outwardly through an opening of the cover member.

As apparent from the above description, according to the inventive socket for a semiconductor device, when the pressing member driving mechanism moves the touch portion of the pressing member to the position in readiness at which the touch portion does not interfere with the semiconductor device during the attachment/detachment of the semiconductor device, part of the pressing member is bulged outward from the end of the socket body through the opening of the socket body. Thereby, since a size of the pressing member is not restricted by the socket body, it is possible to minimize the socket body and thus to reduce an exclusive area of the socket body on the printed wiring board. Also, by arranging the bulged adjacent pressing members in a staggered manner, it is possible to dispose the adjacent IC sockets closer to each other to realize the high-density mounting of the IC sockets.

Also, since the first pressing member having the touch portion formed while deviated to one side in the widthwise direction of the proximal end section to be in contact with the semiconductor device to push the semiconductor device toward the contact terminals, and the second pressing member having the touch portion formed in correspondence to the touch portion of the first pressing member while deviated to the other side in the widthwise direction of the proximal end section to be in contact with the semiconductor device to push the semiconductor device toward the contact terminals, for retaining the semiconductor device in the semiconductor device placement section in association with the first pressing member are provided, it is possible to dispose the adjacent socket bodies closer to each other by approaching the touch portion of the first pressing member in one socket body to the touch portion of the second pressing member in the other socket body. Thus, the IC sockets can be mounted onto a limited mounting area of the printed wiring board at a high density.

The above and other objects, effects, features and advantages of the present invention will become more apparent from the following description of embodiments thereof taken in conjunction with the accompanying drawings.

BRIEF DESCRIPTION OF THE DRAWINGS

FIGS. 19A and 19B are sectional views, respectively, of the socket for a semiconductor device shown in FIGS. 18A and 18B, in which a semiconductor device having a different shape is mounted;

FIGS. 20A and 20B are sectional views, respectively, schematically illustrating a important part of a third embodiment of the socket for a semiconductor device in accordance with the present invention;

FIGS. 61A and 61B are a plan view and a sectional view, respectively, illustrating another modification of the embodiment shown in FIGS. 53A and 53B;

FIGS. 62A and 62B are sectional views, respectively, illustrating a twelfth embodiment of the socket for a semiconductor device in accordance with the present invention;

DETAILED DESCRIPTION OF PREFERRED EMBODIMENTS

Figure 1:
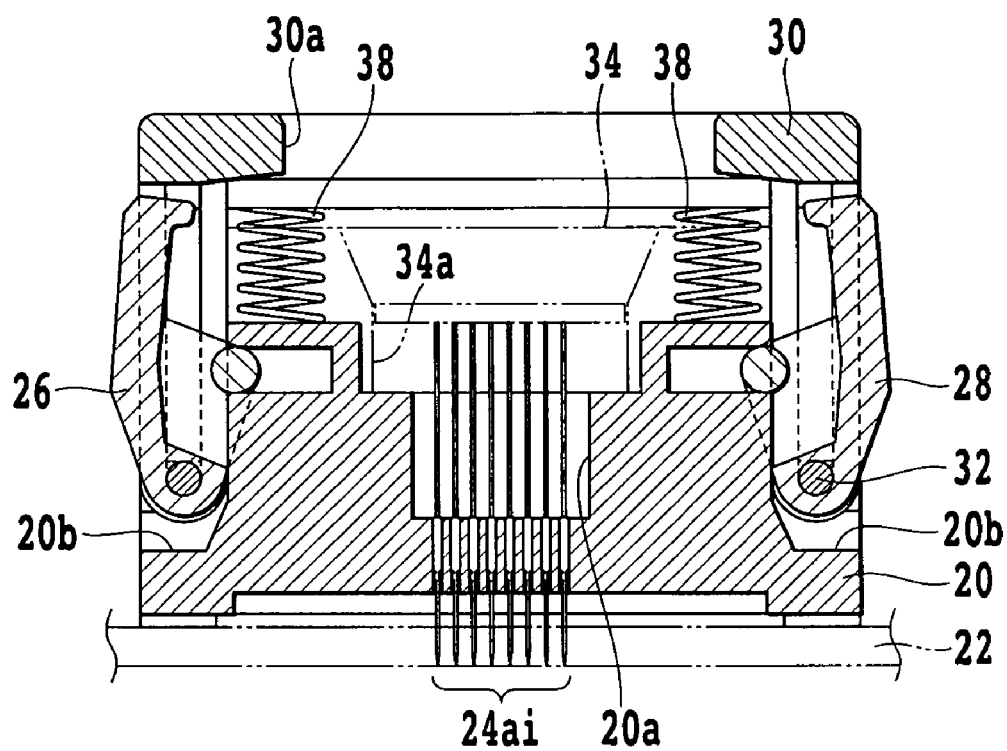
FIG. 1 is a sectional view of a first embodiment of the socket for a semiconductor device in accordance with the present invention, schematically illustrating a whole structure thereof.
Figure 2:
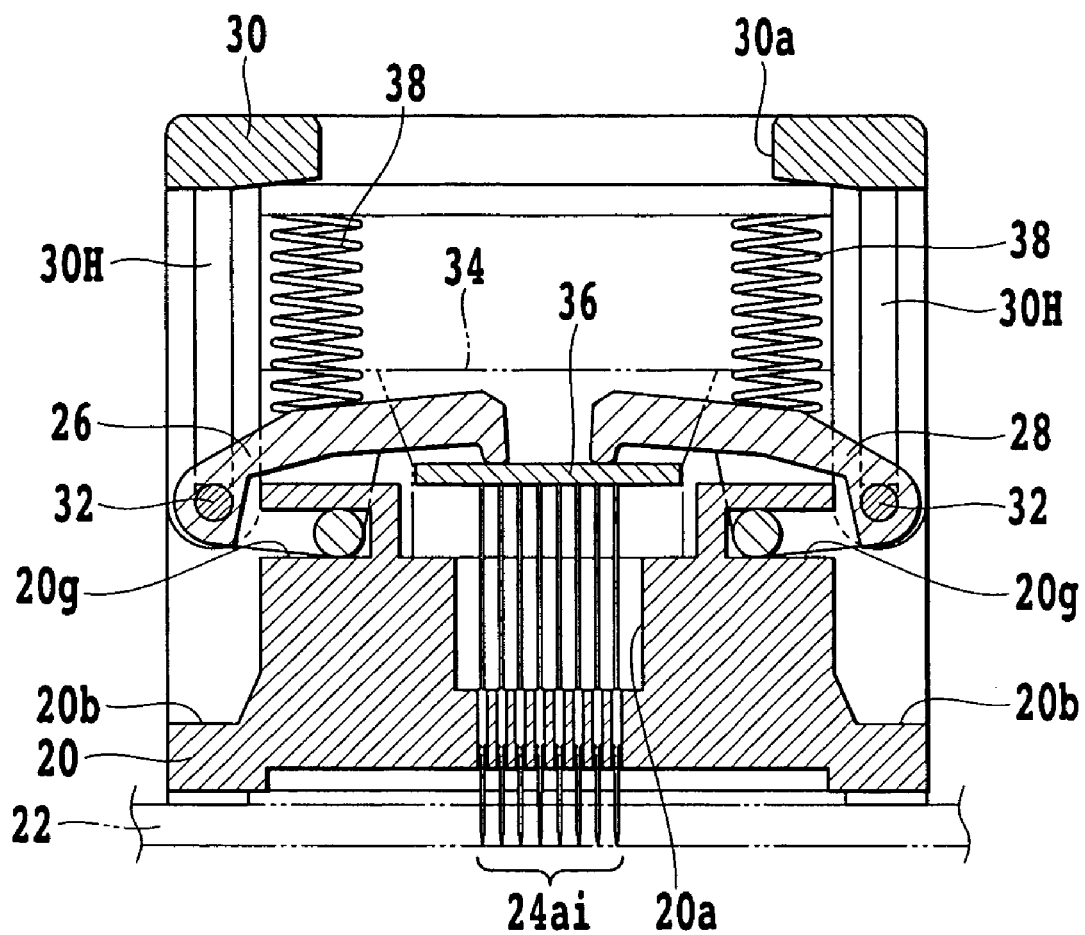
FIG. 2 is a sectional view of the embodiment shown in FIG. 1, in which a cover member is located at the uppermost position and a semiconductor device is mounted thereto.

FIGS. 1 and 2 schematically illustrate a whole structure of a first embodiment of the socket for a semiconductor device in accordance with the present invention.

A plurality of sockets for a semiconductor device shown in FIG. 2 are arranged at positions in a printed wiring board 22 in correspondence to conductive layers thereof. In FIGS. 1 and 2, only one socket for a semiconductor device is shown as a representative example.

The semiconductor socket is mainly comprised of a socket body 20 fixed to the printed wiring board 22, a plurality of contact terminals $24ai$ (i=1 to n; n is a positive integer) disposed in a contact accommodating section 20a located in an central area of the socket body 20, for electrically connecting a semiconductor device described later with the printed wiring board 22, a cover member 30 supported by the socket body 20 to be movable upward/downward, for transmitting an operative force to a latch mechanism described later, a positioning member 34 supported by the socket body 20 in a detachable manner, for accommodating therein a semiconductor device 36 to be tested and locating the latter to the contact terminals $24ai$ in electrode sections of the semiconductor device 36, and a latch mechanism including pressing members 26 and 28 for holding the respective electrode sections of the semiconductor device 36 accommodated in the positioning member 34 while pressing the respective electrode sections of the semiconductor device 36 toward the plurality of contact terminals $24ai$.

The semiconductor device 36 made available for such a semiconductor device socket is a generally square-shaped semiconductor element, for example, of a BGA type or a LGA type having an electrode surface on which a plurality of electrode sections are formed in the vertical and horizontal directions.

The socket body 20 has a recess 20b at each of opposite ends thereof, for allowing a lower end of an arm section and a proximal end of the pressing member 26 or 28 to enter therein when the cover member 30 described later is made to descend. The recess 20b opens outwardly. A recess 20a is formed at a center of the interior of the socket body 20, in which the contact terminals $24ai$ are arranged in correspondence to the electrode sections of the semiconductor device 36. The contact terminal $24ai$ extends generally in the vertical direction relative to a surface of the printed wiring board 22. A fixation surface is formed around the recess 20a, on which the positioning member 34 is placed and fixed in a detachable manner. In this regard, a positioning member 40 described later is also placed in a detachable manner.

An inner groove 20g is formed in a portion on the opposite side of each recess 20b on the fixation surface around the recess 20a, respectively, for guiding in a movable manner a guide pin of the pressing member 26 or 28 engaged therewith. The inner groove 20g opens at one end thereof toward the recess 20b and is formed generally parallel to the fixation surface.

The contact terminal $24ai$ is constructed by two thin terminals, respectively, supported by opposite ends of a thin cylindrical tube in a movable manner and a coil spring disposed between the two terminals within the tube for biasing the two terminals, respectively, outward. In this regard, the contact terminal $24ai$ is not limited to such a construction, but may be made, for example, of an elastic thin metallic sheet to have a curved section coupling the two terminals with each other.

The positioning member 34 has an accommodating section 34a therein for accommodating the semiconductor device 36 and positioning the electrode sections of the semiconductor device 36 to the terminals of the contact terminal 24ai. The terminal of the contact terminal 24ai is projected into the interior of the accommodating section 34a. Opposite walls defining the accommodating section 34a have openings for allowing the pressing members 26 and 28 to pass through them, respectively.

The cover member 30 has an opening 30a in a central area thereof for allowing the semiconductor device 36 to pass through the same during the attachment/detachment of the semiconductor device 36. The cover member 30 is supported to be movable upward/downward while guided along each grooves formed in the outer periphery of the socket body 20 to be engageable with a plurality of legs thereof. Between the inner surface of the cover member 30 opposite to the positioning member 34 and the socket body 20, a plurality of coil springs 38 for biasing the cover member 30 upward; i.e., for biasing the cover member 30 away from the positioning member 34; are provided. At that time, a nib provided at a tip end of the leg of the cover member 30 is engaged with the end of the groove to hold the cover member 30 at the uppermost position as shown in FIG. 2.

Figure 3:
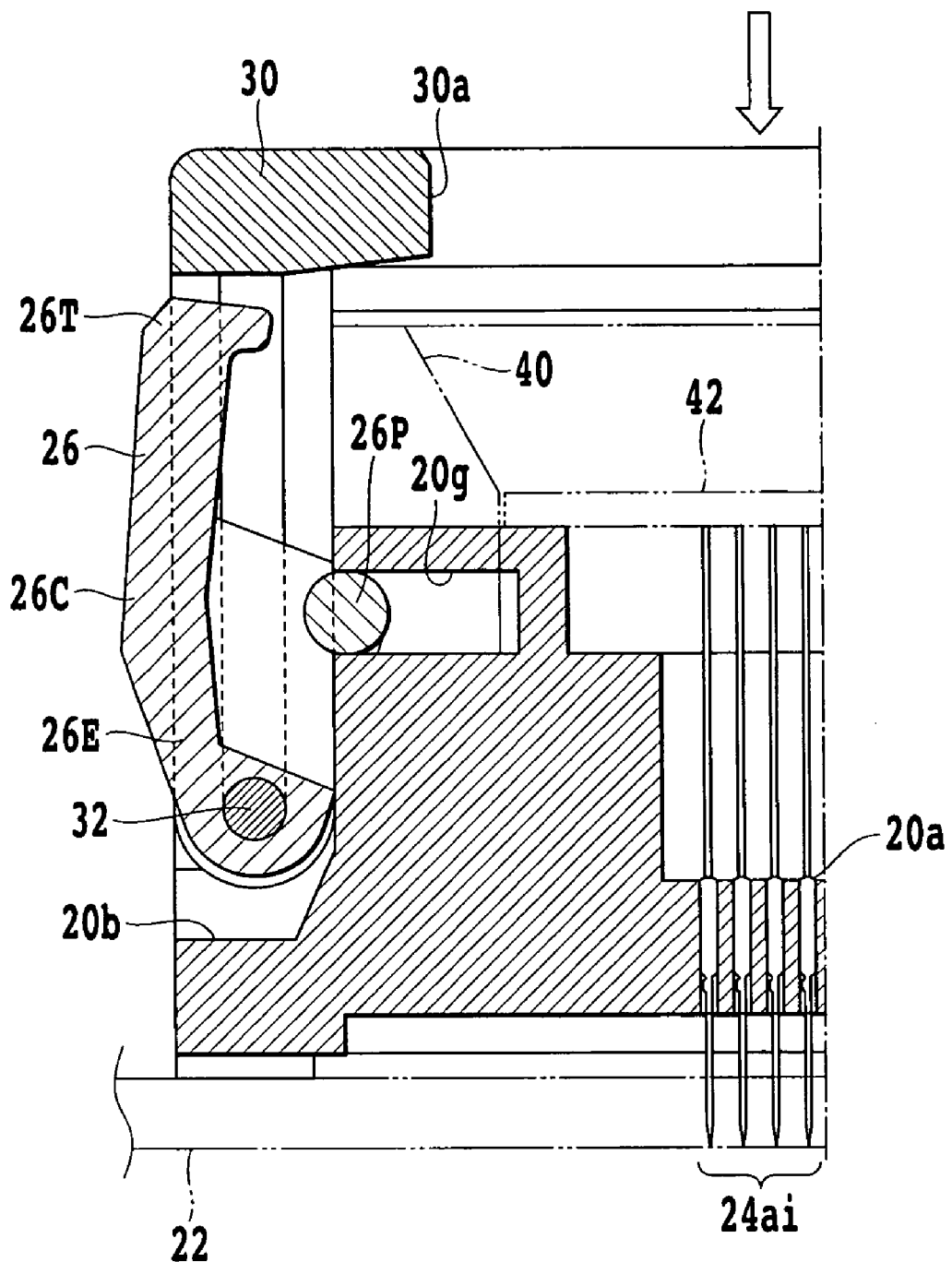
FIG. 3 is an enlarged sectional view showing part of the structure shown in FIG. 1.

The cover member 30 has arm sections 30H to be coupled to the proximal ends of the pressing members 26 and 28 described later via connecting pins, while being opposed to the recess 20b. A pair of arm sections 30H are disposed at a predetermined mutual distance as seen in the vertical direction to a paper plane. An upper end of the arm section 30H is formed in the inner circumference of the cover member 30 to be integral therewith, while a lower end of the arm section 30H is projected toward the recess 20b and has a hole to be engageable with a connecting pin 32. The arm section 30H has a predetermined length as shown in FIG. 2. That is, this length is set to be slightly longer than a whole length of the pressing member 26 or 28, whereby, when the cover member 30 is at the uppermost position, the pressing members 26, 28 coupled thereto are held under pressure, and when the cover member 30 is at the lowermost position, the pressing members 26 and 28 coupled thereto are at the position in readiness as shown in FIGS. 1 and 3 and the lower end of the arm section 30H is not in contact with the bottom surface defining the recess 20b.

Since the pressing members 26 and 28 provided between the arm sections 30H opposite to each other in correspondence to the recess 20b have the identical structure each other, the explanation will be made solely on the pressing member 26 and the explanation of the pressing member 28 will be eliminated.

The pressing member 26 includes a proximal end section 26E having a hole to receive connecting pin 32, a touch portion 26T to selectively contact the outer peripheral region of the semiconductor device 36, and a coupling section 26C for coupling the proximal end section 26E to the touch portion 26T.

Figure 4:
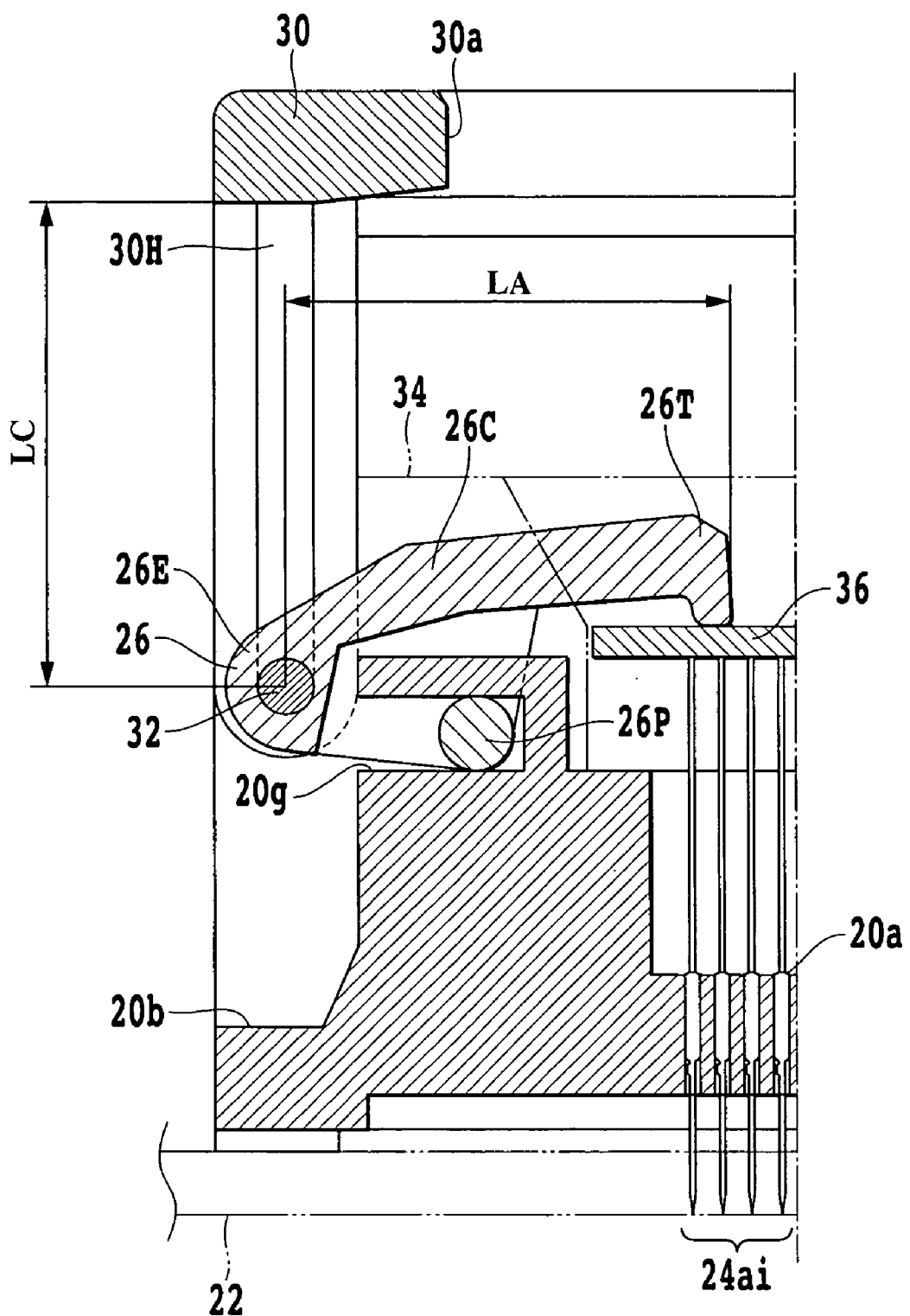
FIG. 4 is an enlarged sectional view of part of the structure shown in FIG. 2.

The proximal end section 26E is supported moveably rotationally at the lower end of the arm section 30H via the connecting pin 32. A guide pin 26P slidably engaged with the inner groove 20g is provided in the connecting section 26C. As shown in FIG. 4, the guide pin 26P occupies a position in the vicinity of the closed end of the inner groove 20g when the pressing member 26 is in a pressed state, while as shown in FIG. 3, occupies a position in the vicinity of the open end of the inner groove 20g as the pressing member 26 is at the position in readiness. At that time, the connecting section 26C and the touch portion 26T are projected outwardly via the recess 20b.

A distance LA shown in FIG. 4 from a center of the proximal end section 26E to an end of the touch portion 26T is set so that the end reaches a predetermined position in the outer peripheral region of the semiconductor device 36 or a semiconductor device 42 described later and the distance LA is shorter than a distance LC from the center of the hole at the proximal end section 26E to the proximal end of the arm section 30H of the cover member 30.

Thereby, the latch mechanism is formed as a pressing member driving mechanism by the pressing members 26 and 28, the cover member 30 and the inner groove 20g.

Figure 5:
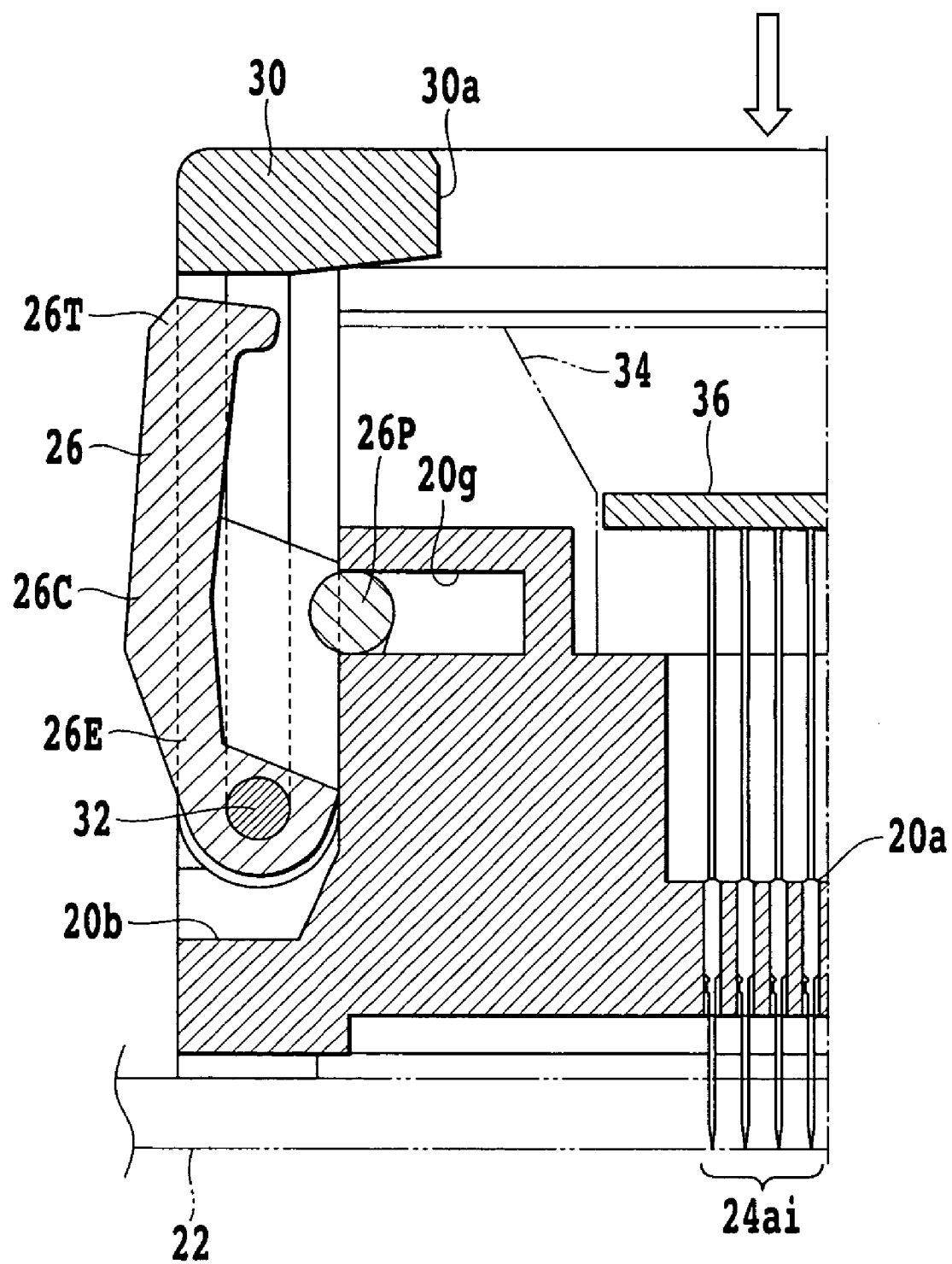
FIG. 5 is a schematic illustration for explaining the operation of the embodiment shown in FIG. 1.

Accordingly, when the cover member 30 is applied with an operative force in the direction shown in FIG. 5 by an arrow from a position shown in FIG. 4 to a position shown in FIG. 5, the pressing member 26 is made to move rotationally about the connecting pin 32 to occupy a reversely standing-up position between the arm portion 30H directly beneath a frame portion of the cover member 30. As a result, as shown in FIG. 5, part of the touch portion 26T, 28T and part of the connecting section 26C, 28C of the pressing member 26, 28 are bulged outwardly from the end of the bottom of the socket body 20 and the end of the cover member 30.

On the other hand, since the operative force lowers to the predetermined value or less and the cover member 30 is released from the state shown in FIG. 3, the cover member 30 returns to the state shown in FIGS. 2 and 4 by biasing force of coil springs 38.

Figure 6:
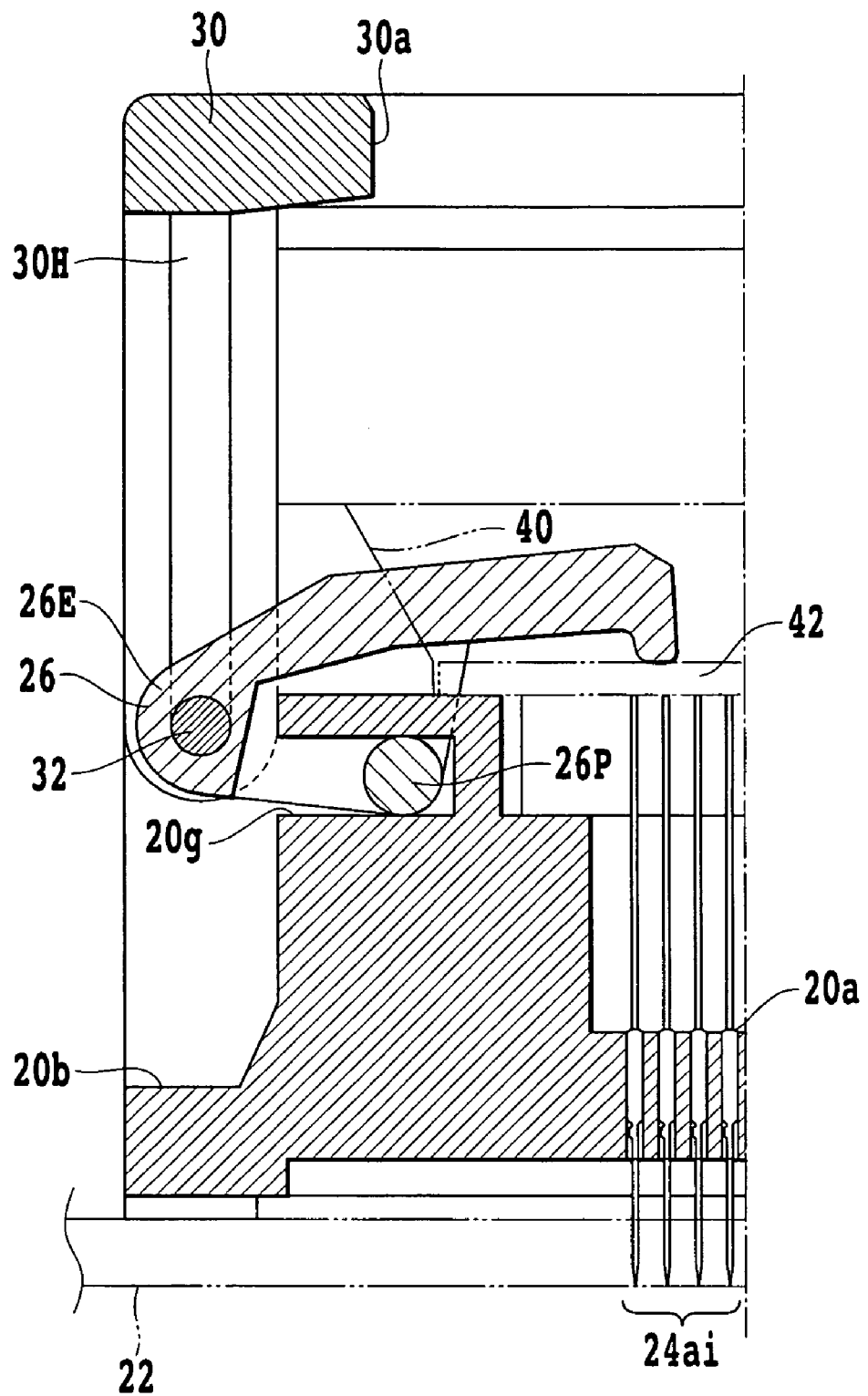
FIG. 6 is a schematic illustration made available for explaining the operation of the embodiment shown in FIG. 1.

In the first embodiment of the semiconductor device socket in accordance with the present invention, if a semiconductor device 42 having the contour dimension larger than that of the semiconductor device 36 and the thickness and shape equal to those of the semiconductor device 36 is mounted to the socket body 20, as shown in FIGS. 3 and 6, a positioning member 40 for accommodating the semiconductor device 42 is fixed to the fixation surface of the socket body 20 in place of the positioning member 34.

The positioning member 40 has an accommodating section 40a in the interior thereof, for accommodating the semiconductor device 42 and locating the electrode sections of the semiconductor device 42 to the terminals of the contact terminal 24ai. The terminals of the contact terminals 24ai are projected into the accommodating section 40a. In the opposite walls forming the accommodating section 40a, openings are provided, respectively, for allowing the pressing members 26 and 28 to pass through the same.

Also in such a structure, when the operative force is applied to the cover member 30 to move the latter from the position shown in FIG. 6 in the direction shown by an arrow in FIG. 3, the pressing members 26, 28 are made to move rotationally about the connecting pins 32 to be away from each other while occupying the reversely standing-up position directly beneath a frame portion of the cover member 30 between the arm sections 30H. As a result, as shown in FIG. 3, part of the touch portions 26T and 28T and part of the connecting sections 26C and 28C of the pressing members 26 and 28 are bulged outwardly from the end of the bottom of the socket body 20 and the end of the cover member 30.

On the other hand, since the operative force becomes lower than the predetermined value, the cover member 30 is released from the state shown in FIG. 3 and returns to the state shown in FIG. 6 due to the biasing force of the coil springs 38.

Accordingly, in the first embodiment of the semiconductor device socket in accordance with the present invention, it is possible to mount the semiconductor device 36 or 42, each having the contour dimension different from the other to the socket body 20 while selectively fixing the positioning member 36 or 42 to the socket body 20. Thereby, a predetermined test can be carried out while using the common semiconductor device socket sharing of the same constituent parts other than the positioning member 34 or 40. Also, since the pressing member 26 or 28 is bulged outwardly from the socket body 20 and not restricted by the inner circumferential dimension of the socket body 20, it is possible to enhance the rigidity of the pressing member 26 or 28.

In this regard, in the above-mentioned embodiment and those described later, while a pair of pressing members 26 and 28 are provided, the number thereof not limited thereto but may be, for example, four in correspondence to the respective sides of the semiconductor device 36 or 42.

When the test of the semiconductor element 36 or 42 is carried out in such a structure, as shown in FIG. 5, a tip end of an arm of a work robot not shown touches to the upper surface of the cover member 30 and presses it downward against the biasing force of the coil springs 38. Thus, the pressing members 26 and 28 are away from each other to be in an open state. Also, the semiconductor element 36 to be tested is conveyed to a position directly above the opening 30a of the cover member 30 and the positioning member 34 while being held by suction by a conveyor arm of a conveyor robot not shown, for example.

Then, the semiconductor element 36 held by the conveyor robot by suction is made to descend through the opening 30a of the cover member 30 and positioned and mounted to the accommodating section 34a. Subsequently, the cover member 30 rises from the opening position to the uppermost position due to the biasing force of the coil springs 38 when the tip end of the robot rises while touching to the upper surface of the cover member 30.

At that time, the touch portion 26T of the pressing member 26 and the touch portion 28T of the pressing member 28 are made to move rotatationally generally at the same timing to press the semiconductor element 36 toward the contact terminals 24ai.

When a test signal is fed to the input/output section of the printed wiring board 22 while the cover member 30 is maintained at the uppermost position, the test signal is transmitted via the contact terminals 24ai to the semiconductor element 36. If the abnormality is detected in the circuit, an abnormality-detecting signal is generated from the semiconductor element 36 and transmitted via the input/output section to an external diagnostic system.

When the test of the semiconductor element 36 has been completed, the tip end of the work robot touches to the upper surface of the cover member 30 and presses the same downward against the biasing force of the coil springs 38 so that this semiconductor element 36 is removed and a fresh semiconductor element is mounted in the same manner as described before. The tested semiconductor device 36 is removed by the conveyor arm and the fresh semiconductor element 36 to be tested is mounted in the same manner as described before.

Figure 7:
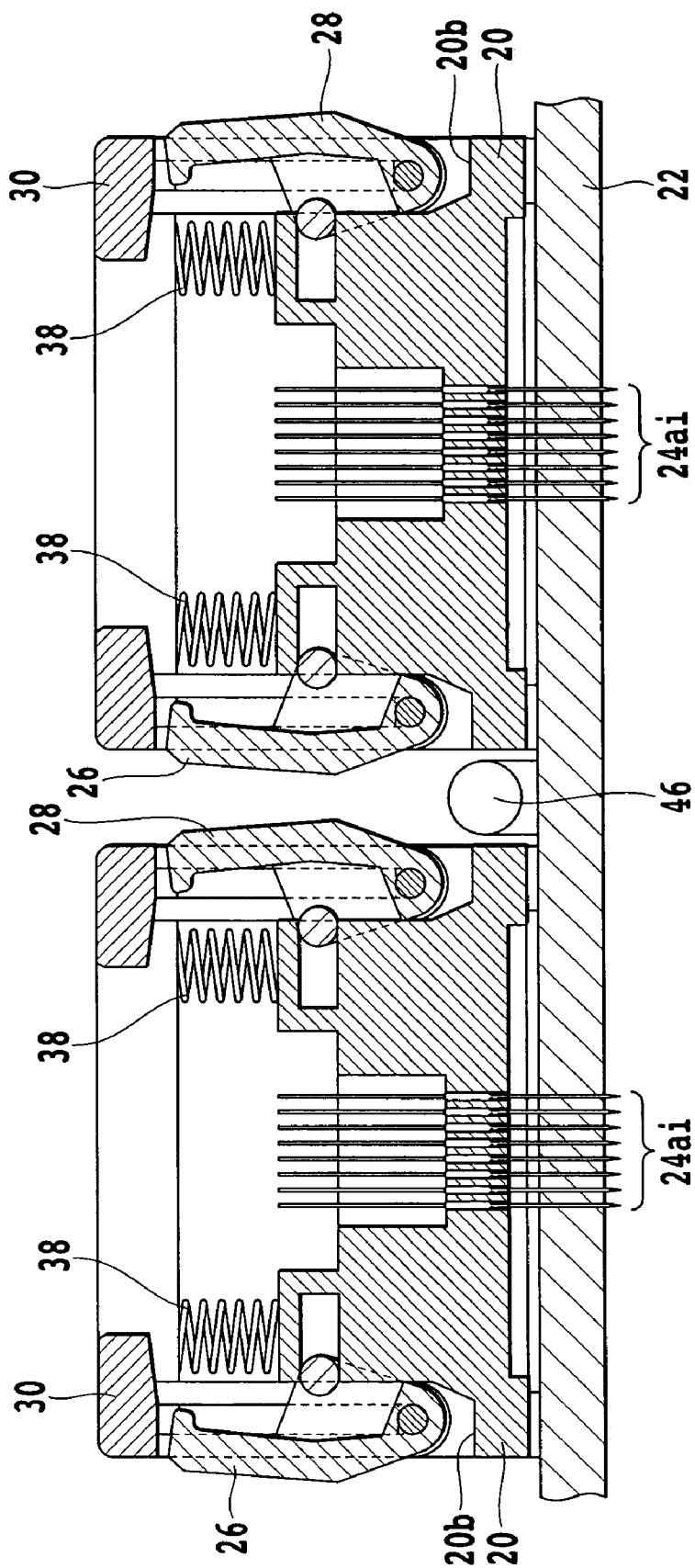
FIG. 7 is a sectional view of a plurality of sockets for a semiconductor device shown in FIG. 1 arranged parallel to each other.
Figure 9:
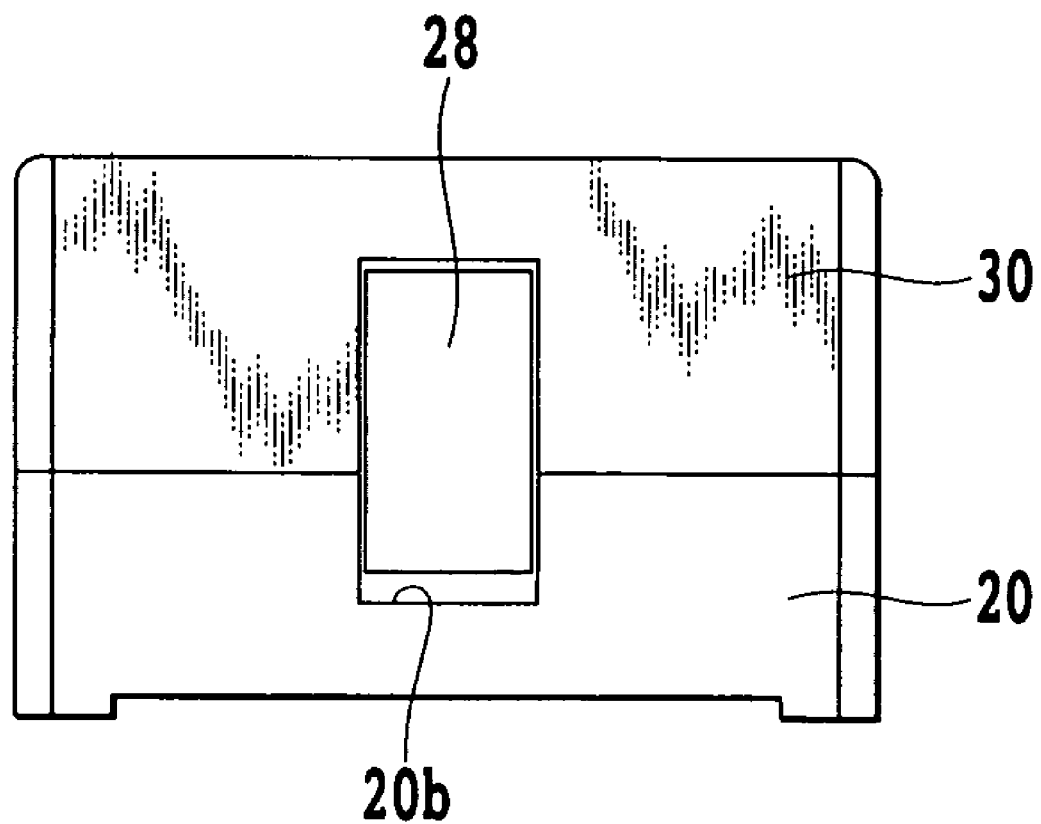
FIG. 9 is a side view of FIG. 8.

FIG. 7 illustrates a state in which a plurality of semiconductor device sockets of the first embodiment described above are arranged on the printed wiring board 22. In this regard, in embodiments shown in FIG. 7 and described later, the same reference numerals are used for denoting the same constituent elements as in FIG. 1, and the explanation thereof will be eliminated. FIGS. 7 and 9 illustrate a state in which the cover member 30 is at the lowermost position.

Figure 8:
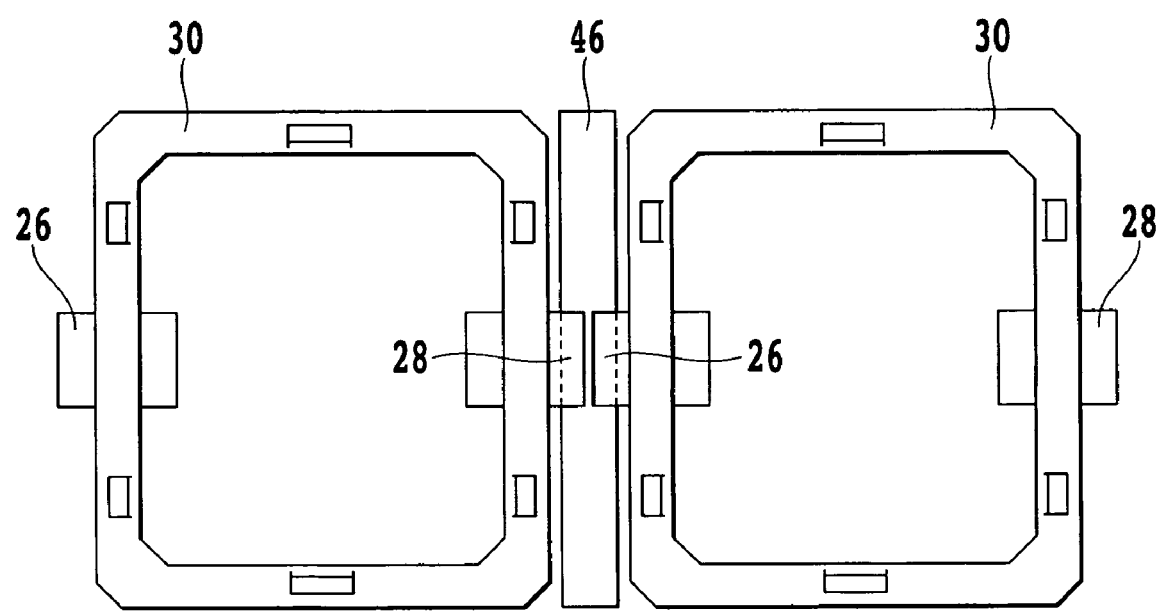
FIG. 8 is a plan view of an embodiment shown in FIG. 7.

As shown in FIG. 8, the semiconductor device sockets adjacent to each other are arranged at a predetermined gap in a row so that the pressing members 28 and 26 are opposed to each other. At that time, in the gap between the adjacent semiconductor device sockets, an electric part 46 such as a capacitor is arranged on the printed wiring board 22. Accordingly, it is possible to effectively use a dead space on the printed wiring board 22.

In this regard, in the embodiments shown in FIGS. 7, 8, and 9, the semiconductor device sockets adjacent to each other are arranged in a row so that the pressing members 28 and 26 are opposed to each other. However, the arrangement should not be limited thereto but may be in a staggered manner so that the pressing members 28 and 26 are obliquely opposed to each other as shown in FIGS. 10 and 11, for example.

Figure 10:
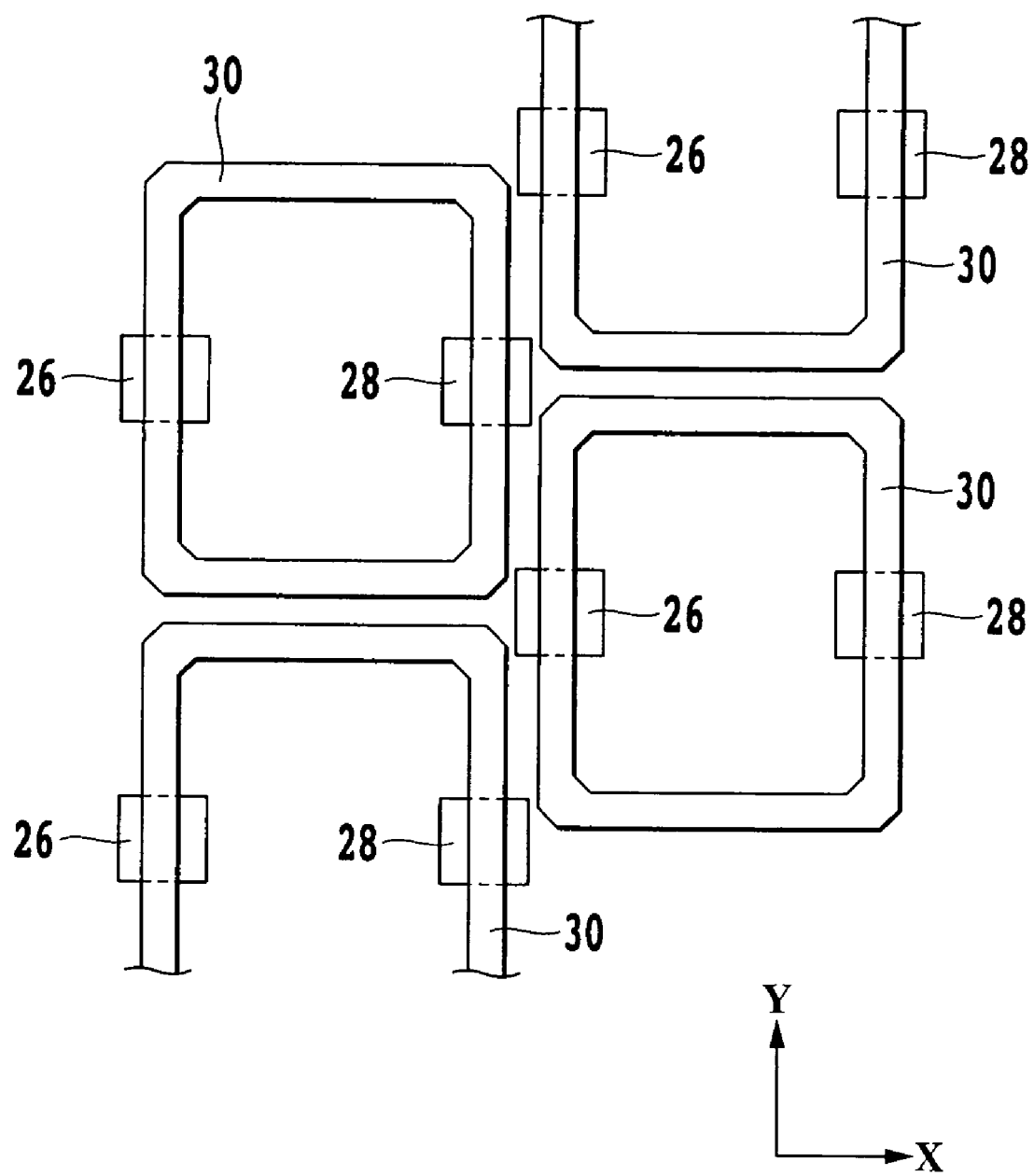
FIG. 10 is a plan view of a plurality of sockets for a semiconductor device shown in FIG. 1 arranged in a staggered manner.
Figure 11:
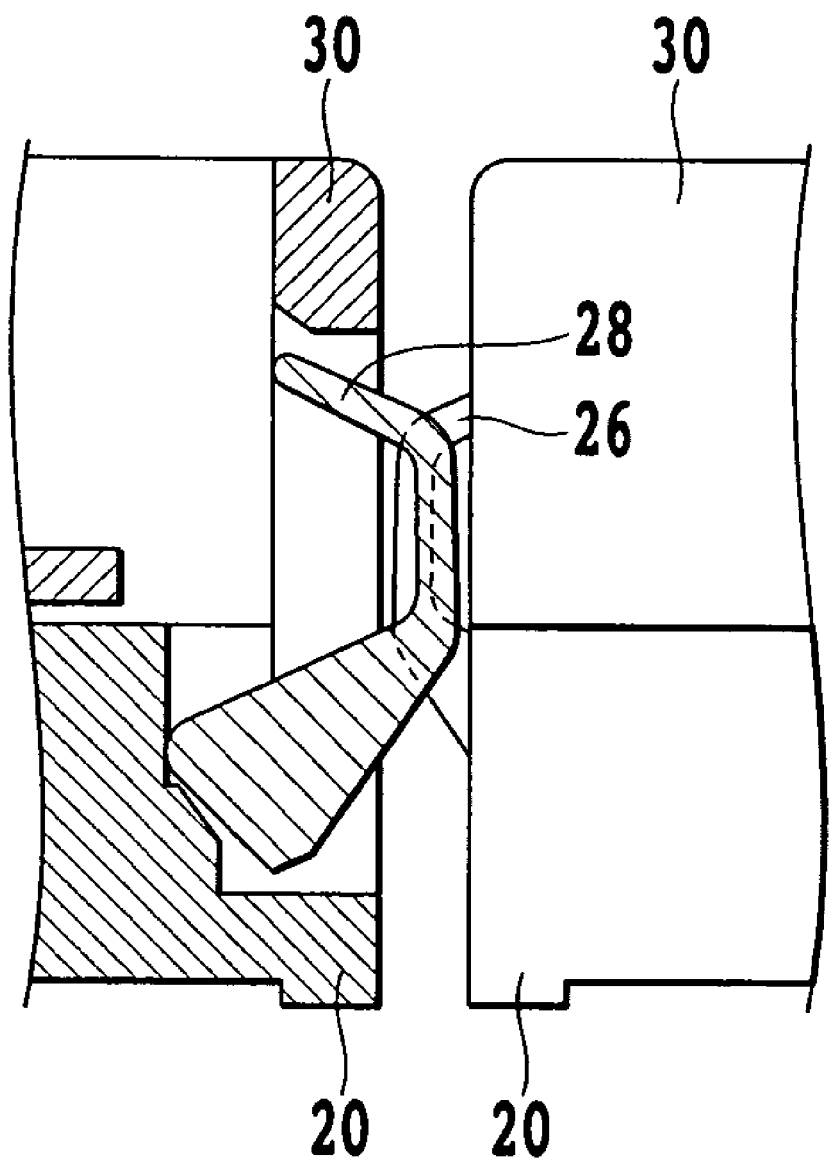
FIG. 11 is an illustration made available for explaining the mutual relationship between the adjacent sockets for a semiconductor device in the arrangement shown in FIG. 10.

Accordingly, the pressing member 26 in one row of the semiconductor device sockets extending in the Y-coordinate direction shown in FIG. 10 is disposed between the adjacent two pressing members 28 in another row extending adjacent in the X-coordinate direction vertical to the Y-coordinate direction. As a result, since the mutual distance between one row and the other row adjacent to each other becomes shorter, the dead space is minimized to realize the high-density mounting of the semiconductor device socket.

Figure 12:
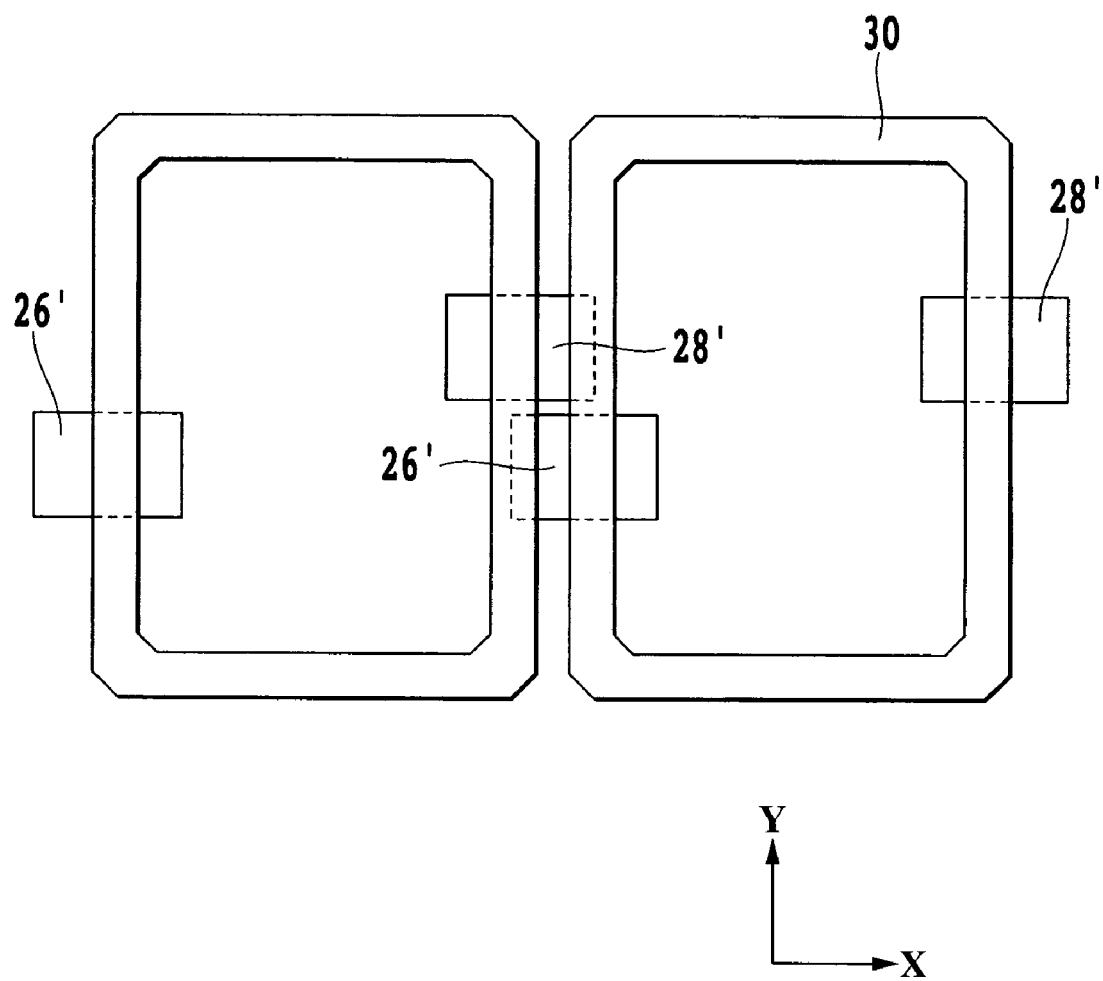
FIG. 12 is a plan view illustrating an example of another arrangement of a pressing member used in the first embodiment of the socket for a semiconductor device in accordance with the present invention.
Figure 13:
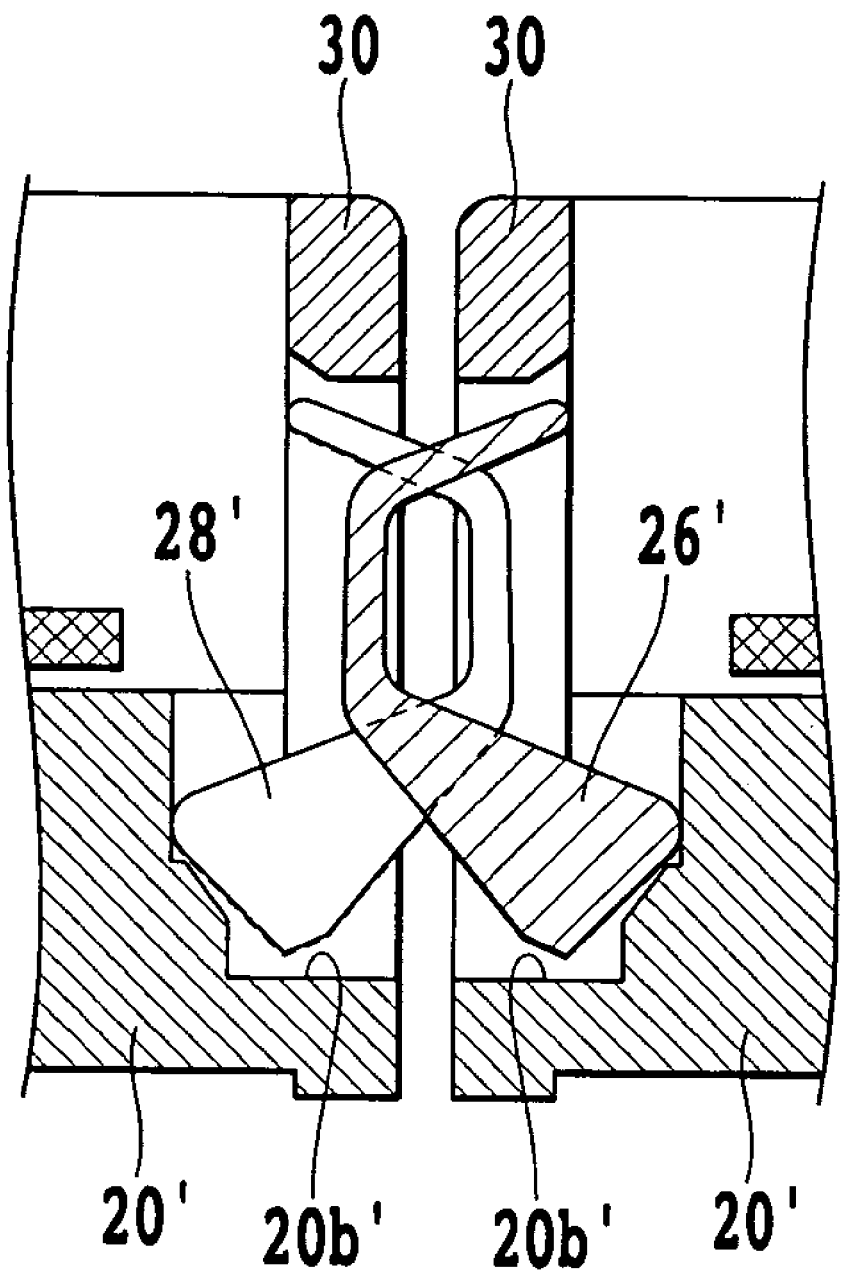
FIG. 13 is an illustration made available for explaining the mutual relationship between the adjacent sockets for a semiconductor device in the arrangement shown in FIG. 12.

Further, while the pressing members 26 and 28 are arranged in the socket body 20 to be just opposite to each other in the embodiment shown in FIG. 1, it is not indispensable but may be such that the pressing members 26' and 28' are provided in the socket body 20' obliquely opposite to each other, as shown in FIGS. 12 and 13, in view of the high-density mounting of the semiconductor device sockets. In this connection, FIG. 13 illustrates a state in which the cover member 30 is at the lowermost position.

In this case, when the cover member 30 is at the lowermost position, a size of the respective recess 20'b provided in the socket body 20' is selected such that both of the pressing members 26' and 28' in the adjacent socket bodies 20' are accommodated therein while being partially overlapped with each other.

Thus, in such a case, since it is possible to further shorten the mutual distance between the adjacent semiconductor device sockets in comparison with the above-mentioned embodiment, the density of the semiconductor device sockets arranged in the X-coordinate direction can be increased in FIG. 12 without arranging the sockets in a so-called staggered manner in the Y-coordinate direction.

Figure 14:
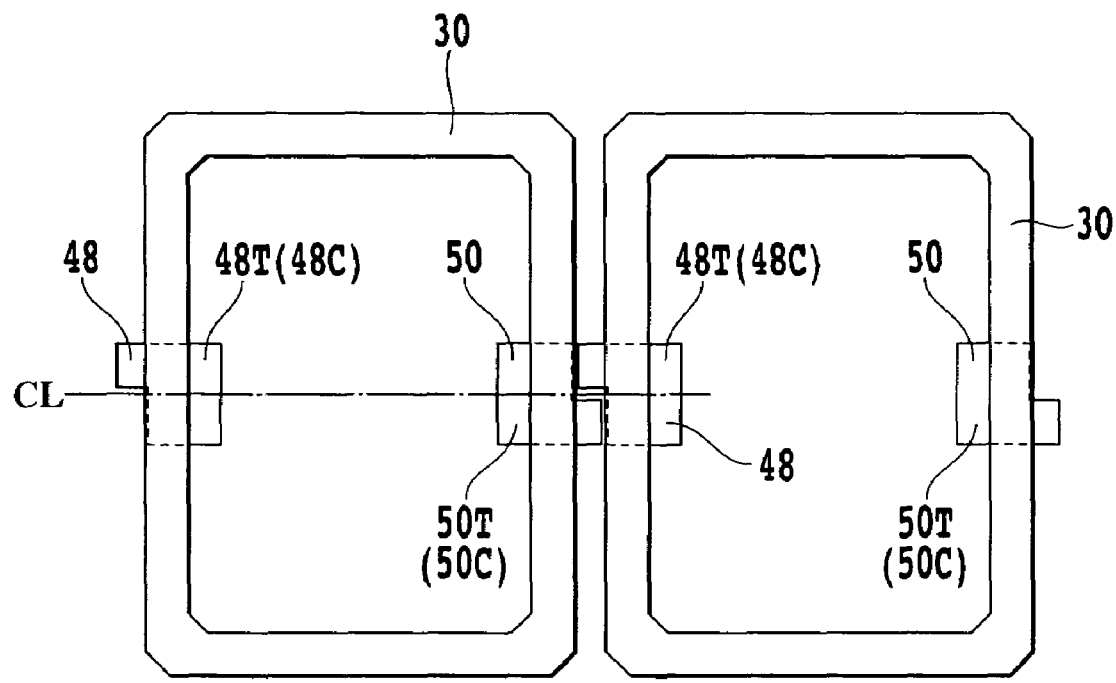
FIG. 14 is a plan view of a first modification of the pressing member used in the first embodiment of the socket for a semiconductor device in accordance with the present invention.
Figure 15:
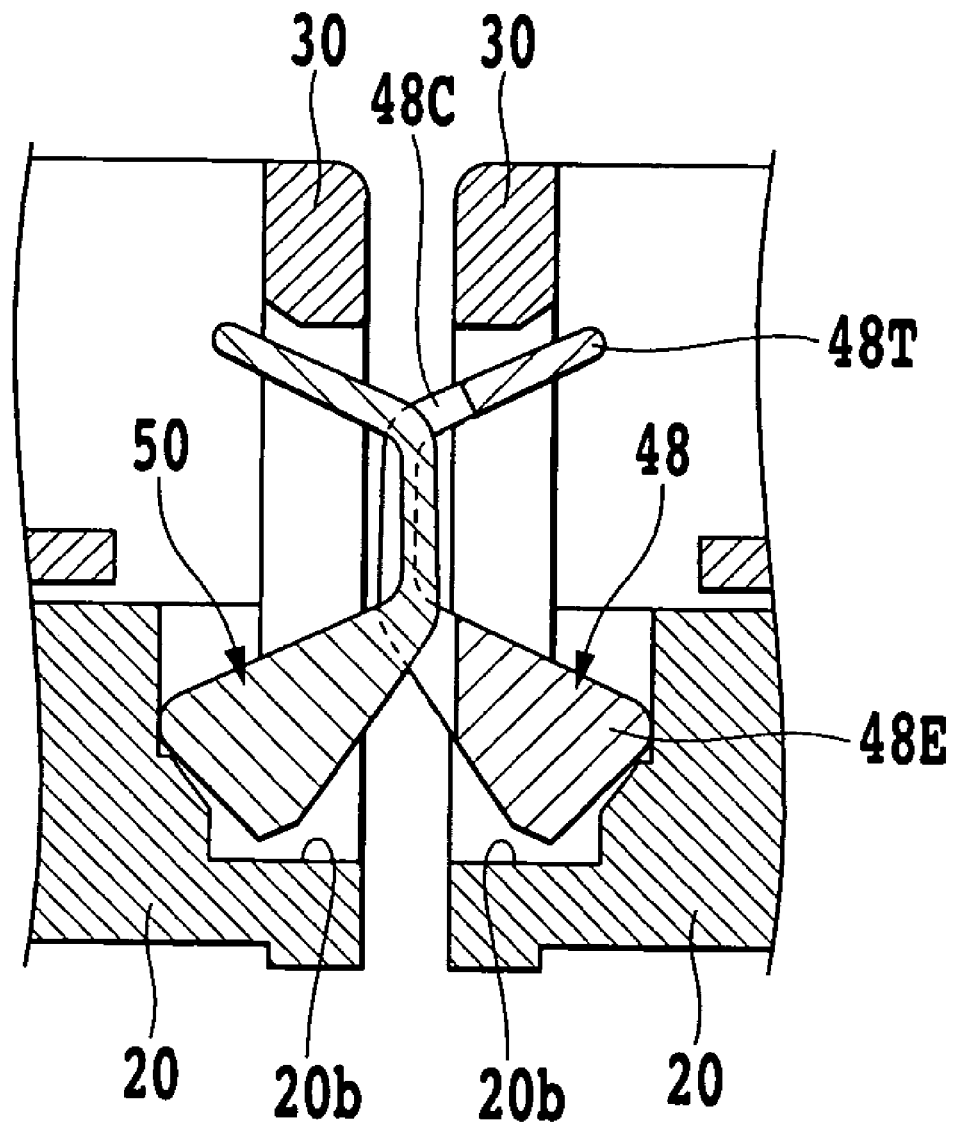
FIG. 15 is an illustration made available for explaining the structure of the pressing members adjacent to each other in the sockets for a semiconductor device shown in FIG. 14.

FIGS. 14 and 15 schematically illustrate the appearance of a first modification of the pressing member used in the above-mentioned first embodiment. In this regard, in FIGS. 14 and 15, the same reference numerals will be used for denoting the same constituent elements and the explanation thereof will be eliminated.

In FIGS. 14 and 15, the pressing members 48 and 50 are disposed opposite each other in the recesses 20b, respectively, of the socket bodies 20. The pressing member 48 includes a proximal end section 48E having a hole for receiving connecting pin 32 described above therein, a touch portion 48T selectively in contact with the outer peripheral region of the semiconductor device 36 or 42, and a connecting section 48C for coupling the proximal end section 48E with the touch portion 48T.

The proximal end section 48E is held moveably rotationally at a lower end of an arm section 30H via a connecting pin 32. In the connecting section 48C, a guide pin engageable in a slidable manner with an inner groove 20g is provided. This guide pin is the same as that shown in FIG. 4. The connecting section 48C and touch portion 48T are formed to be deflected from a widthwise center line CL of the proximal end section 48E to one side.

In a waiting state in which the pressing member 48 reversely stands up, the guide pin occupies a position in the vicinity of an open end of the inner groove 20g. At that time, the connecting section 48C and the touch portion 48T are bulged outwardly through the recess 20b.

A distance from a center of the hole in the proximal end section 48E to the end of the touch portion 48T is selected so that the touch portion 48T reaches a predetermined position in the outer peripheral region of the semiconductor device 36 or 42 and the distance is shorter than a distance from the center of the hole of the proximal end section 48E to the proximal end of the arm section 30H of the cover member 30.

On the other hand, the pressing member 50 includes a proximal end section 50E having a hole for being inserted with the above-mentioned connecting pin 32, an touch portion 50T selectively being in contact with the outer peripheral region of the semiconductor device 36 or 42, and a connecting section 50C for coupling the proximal end section of the 50E with the touch portion 50T.

The proximal end section 50E is held moveably rotationally at the lower end of the section 30H via the connecting pin 32. In the connecting section 50C, a guide pin engageable with the inner groove 20g in a slidable manner is provided. This guide pin is the same as that shown in FIG. 4. The connecting section 50C and the touch portion 50T are formed to be deflected from a widthwise center line CL of the proximal end section 48E to the other side, so that they are symmetrical with the connecting section 48C and the touch portion 48T of the pressing member 48.

When the pressing member 50 is at the position in readiness in which it reversely stands up, the guide pin is located in the vicinity of the open end of the inner groove 20g. At that time, the connecting section 50C and the touch portion 50T are bulged outwardly through the recess 20b.

A distance from a center of the hole of the proximal end section 50E to the end of touch portion 50T is selected in the same manner as the pressing member 48.

Accordingly, as shown in FIG. 14, when the semiconductor device sockets are arranged so that the connecting section 48C and the touch portion 48T of the pressing member 48 and the connecting section 50C and the touch portion 50T of the pressing member 50 are overlapped with each other at a predetermined gap between the both as shown in FIG. 15, the mutual distance between the adjacent semiconductor device sockets becomes furthermore smaller to facilitate the high-density arrangement of the semiconductor device sockets.

Figure 16:
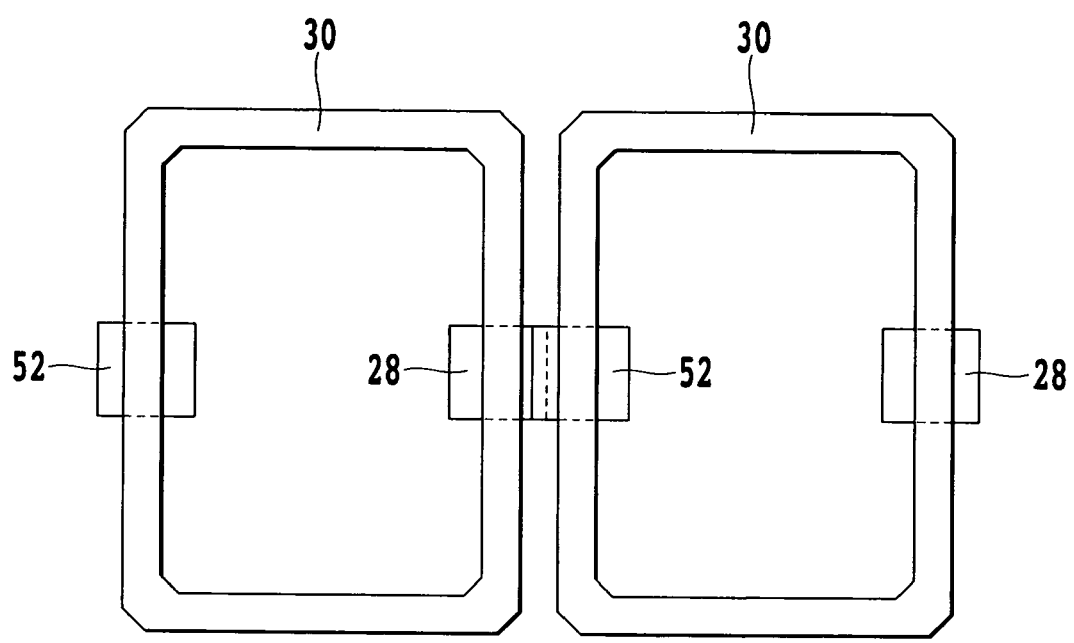
FIG. 16 is a plan view of a second modification of the pressing member used in the first embodiment of the socket for a semiconductor device in accordance with the present invention.
Figure 17:
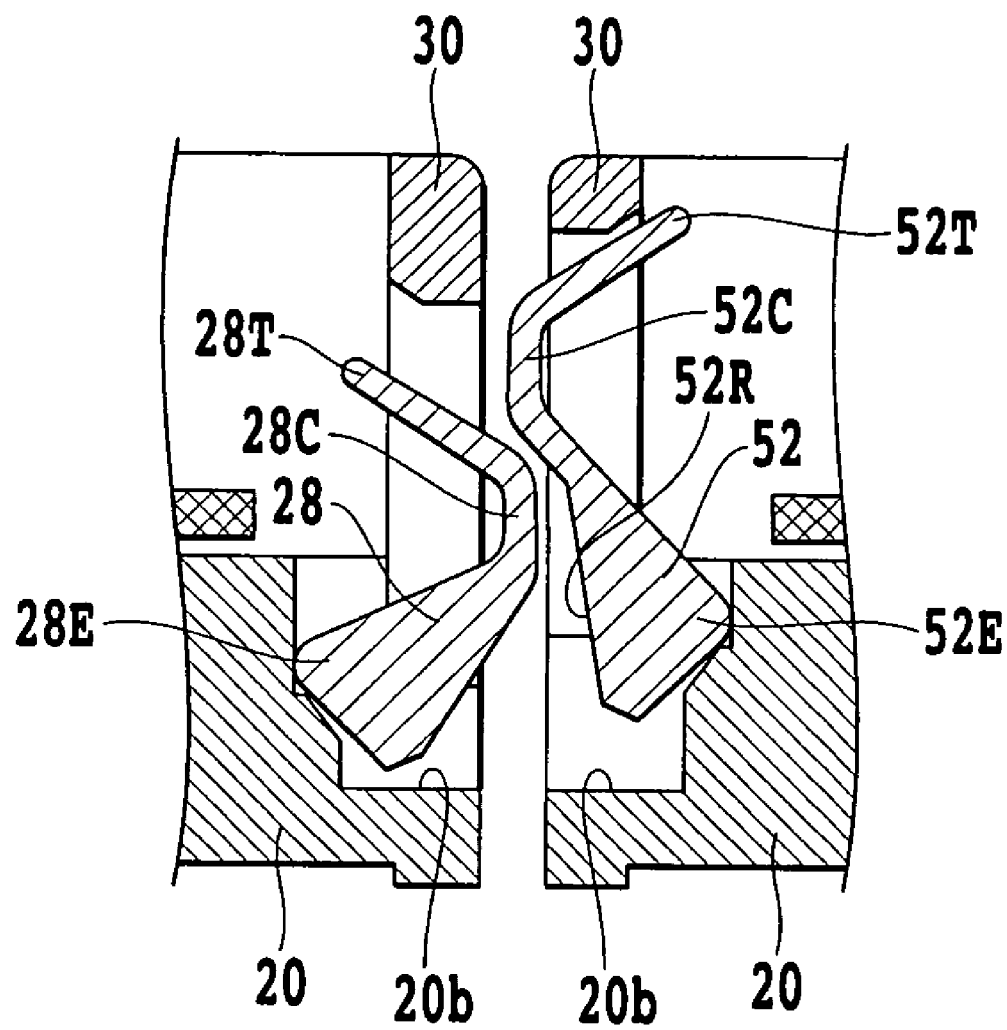
FIG. 17 is an illustration made available for explaining the structure of the pressing members adjacent to each other in the sockets for a semiconductor device shown in FIG. 16.

FIGS. 16 and 17 schematically illustrate the appearance of a second modification of the pressing members used in the above-mentioned first embodiment. In this regard, in FIGS. 16 and 17, the same reference numerals as those used in FIGS. 1 and 2 are used for denoting the same constituent elements, and the explanation thereof will be eliminated.

In FIGS. 16 and 17, a pressing member 52 is located in the recess 20b of the socket body 20. The pressing member 52 includes a proximal end section 52E having a hole to be inserted with the above-mentioned pin 32, an touch portion 52T selectively in contact with the outer peripheral region of the semiconductor device 36 or 42, and a connecting section 52C for coupling the proximal end section 52E with the touch portion 52T.

In a boundary between the proximal end section 52E and the connecting section 52C, a recess 52R is formed. The proximal end section 52E is held moveably rotationally at the lower end of the section 30H via the connecting pin 32. There is a guide pin engaged with the inner groove 20g in a slidable manner at the connecting section 52C. The guide pin is the same as that shown in FIG. 4.

In a waiting state in which the pressing member 28 reversely stands up, the guide pin is located in the vicinity of the open end of the inner groove. At that time, the connecting section 52C and the touch portion 52T are bulged outwardly through the recess 20b.

A distance from a center of the hole in the proximal end section 52E to the end of the touch portion 52T is selected so that the touch portion reaches a predetermined position in the outer peripheral region of the semiconductor device 36 or 42 and the distance is shorter than a distance from the center of the hole in the proximal end section 52E to a proximal end of the arm section 30H of the cover member 30.

Accordingly, as shown in FIG. 17, when two semiconductor device sockets are disposed adjacent to each other at a predetermined gap between them, so that the connecting section 28C of the pressing member 28 in one semiconductor device socket enters a recess 52R of the pressing member 52 in the other semiconductor device socket, the mutual distance between both the semiconductor device sockets becomes furthermore smaller, whereby the semiconductor devices can be mounted at a higher density.

FIGS. 18A, 18B, 19A and 19B schematically illustrate a main part of a second embodiment of the inventive semiconductor device socket.

Figures 18A, 18B:
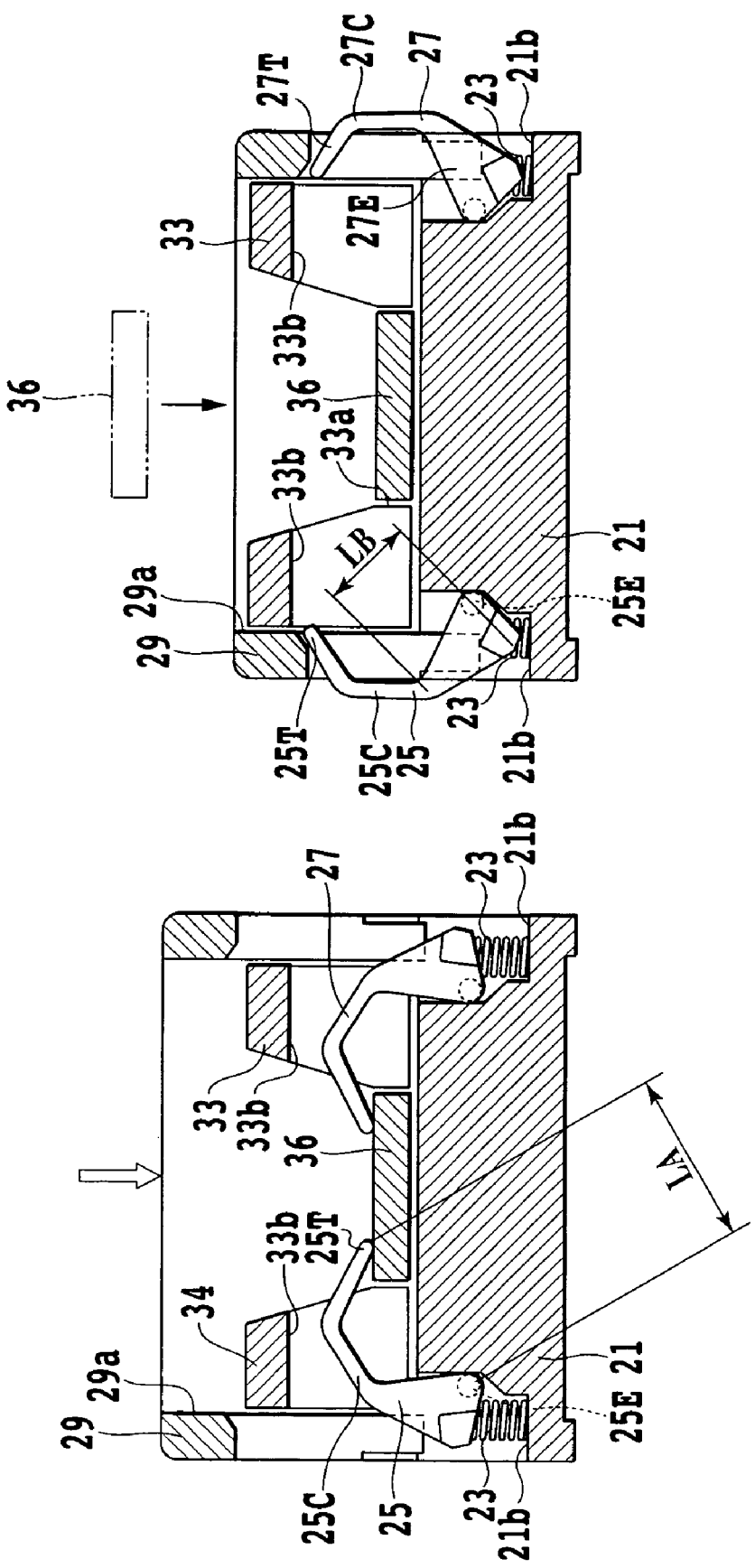
FIGS. 18A and 18B are sectional views, respectively, of a second embodiment of the socket for a semiconductor device in accordance with the present invention, schematically illustrating a whole structure thereof.

In FIG. 18A, the semiconductor device socket mainly includes a socket body 21 similar to that used in the above-mentioned embodiment, to be mounted onto a printed circuit board (not shown), a plurality of contact terminals (not shown) disposed in a contact accommodating section provided in a central portion of the socket body 21, for electrically connecting the semiconductor device with the printed circuit board, a cover member 29 held by the socket body 21 to be movable upward/downward, for transmitting an operative force to a latch mechanism described later, a positioning member 33 supported by the socket body 21 in a detachable manner, for accommodating the semiconductor device 36 to be tested and positioning the electrode sections of the semiconductor device 36 to the contact terminals (not shown), and a latch mechanism including pressing members 25 and 27 for holding and pressing the electrode sections of the semiconductor device 36 accommodated in the positioning member 33 to the plurality of contact terminals. In this regard, a plurality of semiconductor device sockets shown in FIGS. 18A and 18B are arranged at positions corresponding to the respective electro-conductive layers in the printed circuit board. In FIGS. 18A and 18B, only one semiconductor device socket is shown as a representative.

The plurality of contact terminals (not shown) arranged in the contact accommodating section have the same structure as those shown in FIG. 1.

The socket body 21 has a recess 21b at each of opposite ends, for allowing the lower end of the arm section of the cover member 29 to enter and disposing the proximal end of the rotating pressing member 25 or 27 therein. The respective recess 21b is opened to outside. A coil spring 23 is disposed between the proximal end of the pressing member 25 or 27 and the bottom defining part of the respective recess 21b, for rotating a tip end of the pressing member 25 or 27 toward the contact accommodating section so that they are closer to each other. Further, there are a plurality of coil springs not shown between the cover member 29 and the socket body 21 for biasing the cover member 20 upward.

In the periphery of the contact accommodating section, a fixation surface is formed for placing and fixing the positioning member 33. A positioning member 39 described later is also placed on the fixation surface.

The positioning member 33 has an accommodating section 33a therein for accommodating the semiconductor device 36 and positioning the electrode sections of the semiconductor device 36 to contact elements of the above-mentioned contact terminals. The contact elements of the contact terminals are projected in the accommodating section 33a. In opposite walls forming the accommodating section 33a, openings 33b are formed for allowing the pressing members 25 and 27 to pass through the same.

The cover member 29 has an opening 29a at a center thereof for allowing the semiconductor device 36 to pass through the same when the semiconductor device 36 is mounted or removed. The cover member 29 is held to be movable upward and downward while a plurality of legs of the cover member are guided along grooves formed in the periphery of the socket body 21. At this time, a lower end of the arm section of the descending cover member 29 is disposed such that the proximal ends of the pressing members 25 and 27 are opposite to each other. Accordingly, the lower end of the arm section of the descending cover member 29 engages with the proximal end of the pressing member 25 or 27 against the bias of the coil spring 23 to press the same, whereby as shown in FIG. 18B, the proximal ends of the pressing members 25 and 27 are made to rotate to separate the tip ends thereof away from each other.

Since the pressing members 25 and 27 is of the same structure, the explanation will be made solely on the pressing member 25 and the explanation of the pressing member 27 will be eliminated.

The pressing member 25 includes a proximal end section 25E supported for rotation at the periphery of the recess 21b, an touch portion 25T selectively in contact with the outer peripheral region of the semiconductor device 36, and a connecting section 25C coupling the proximal end section 25E with the touch portion 25T.

The positioning member 33 has an accommodating section 33a therein for accommodating the semiconductor device 36 and locating the electrode sections of the semiconductor device 36 to the contact elements of the above-mentioned contact terminals. In the accommodating section, the contact elements of the contact terminals are projected. In the opposite walls defining the accommodating section 33a, there are openings, respectively, for allowing the pressing members 25 and 27 to pass through them.

The cover member 29 has an opening 33b at a center thereof, for allowing the semiconductor device 36 to pass through it when the semiconductor device 36 is mounted and removed. The cover member 29 is held to be movable upward and downward by the engagement of a plurality of legs thereof with the respective grooves formed on the outer circumference of the socket body 21. At this time, a lower end of the arm section of the descending cover member 29 is opposed to the proximal end of the pressing member 25 or 27. Accordingly, the lower end of the arm section of the descending cover member 29 engages with the proximal end of the pressing member 25 or 27 and pushes the same against the bias of the coil spring 23, whereby as shown FIG. 18B, the proximal end of the pressing member 25 or 27 is made to rotate so that the tip end of the pressing member 25 or 27 is away from the other.

Since the pressing members 25 and 27 has the same structure, the explanation will be made solely on the pressing member 25 and eliminated on the pressing member 27.

The pressing member 25 includes a proximal end section 25E supported for rotation at opposite ends thereof by the periphery of the recess 21b, an touch portion 25T selectively in contact with the outer peripheral region of the semiconductor device 36, and a connecting section 25C for coupling the proximal end section 25E with the touch portion 25T.

The proximal end section 25E has an arm-receiving section for selectively being in contact with the lower end of the arm section of the cover member 29 at a position away by a predetermined distance from the rotary center of the arm section. A distance LB from the rotary center of the proximal end section 25E to a point at which one end of the connecting section 25C is coupled is larger than a distance from the rotary center of the proximal section 25E to an end of the opening of the recess 21b in the socket body 21 as shown in FIG. 18B. A distance LA from the rotary center of the proximal end section 25E to the tip end of the touch portion 25T is such that the tip end of the touch portion 25T reaches the upper surface of the semiconductor device 36 or 42 when the touch portion 25T is pressed as shown in FIGS. 18A and 19A, and in the position in readiness, the touch portion 25T is within the opening of the cover member 29 as shown in FIG. 18B. That is, the distance LA is selected so that when the cover member 29 is at the lowermost position, the tip end of the touch portion 25T does not interfere with the periphery of the opening of the cover member 29. Thereby, when the cover member 29 is at the lowermost position, the connecting section 25C and the touch portion 25T bulge out through the recess 21b and the opening of the cover member 29.

Accordingly, the latch mechanism is formed of the pressing members 25 and 27, the cover member 29 and the coil spring 23 and operates as a pressing member drive mechanism.

If the operative force is applied to the cover member 29 from the position shown in FIG. 18A to the position shown in FIG. 18B in the direction shown by an arrow, the pressing member 25 is made to rotate about the rotary center thereof, and occupies a reversely standing-up position within the opening and the recess 21b directly beneath the frame portion of the cover member 29. As a result, as shown in FIG. 18B, part of the touch portions 25T and 27T and part of the connecting sections 25C and 27T are bulged out from an end of the bottom of the socket body 21 and an end of the cover member 29.

On the other hand, the cover member 29 returns from a state shown in FIG. 18B to a state shown in FIG. 18A due to the bias of the coil spring 23 when the operative force becomes smaller than the predetermined value.

In the second embodiment of the inventive semiconductor device socket, when a semiconductor device 42 having a contour dimension larger than that of the semiconductor device 36 and a thickness and a shape equal to those of the semiconductor device 36 is mounted to the socket body 21, instead of the positioning member 34, a positioning member 39 for accommodating the semiconductor device 42 is fixed onto the fixation surface of the socket body 21 as shown in FIGS. 19A and 19B.

The positioning member 39 has an accommodating section 39a therein for accommodating the semiconductor device 42 and positioning the electrode sections of the semiconductor device 42 to the contact elements of the contact terminals. In the accommodating section 39a, the contact elements of the contact terminals are projected. In the opposite walls defining the accommodating section 39a, openings for allowing the pressing members 25 and 27 to pass through them, respectively, are formed.

Also in this structure, when the operative force is applied to the cover member 29 in the direction shown by an arrow in FIG. 19A to move the cover member 29 as shown in FIG. 19B, the pressing members 25 and 27 are made to rotate about centers thereof so that the both are away from each other. Thereby, the pressing members 25 and 27 are in a reversely standing-up state in the opening and the recess 21b at a position directly beneath the frame portion of the cover member 29. As a result, as shown in FIG. 19B, part of the touch portions 25T and 27T and part of the connecting sections 25C and 27C of the pressing members 25 and 27 are bulged outward from an end of the bottom of the socket body 21 and an end of the cover member 29.

On the other hand, if the operative force becomes smaller than the predetermined value and the cover member 29 is released from the state shown in FIG. 19B, the cover member 29 returns to the state shown in FIG. 19A due to the bias of the coil spring.

Accordingly, also in the second embodiment of the invective semiconductor device socket, it is possible to mount the semiconductor devices 36 and 42 having the contour dimension different from each other on the socket body 21 and carry out various tests by selectively fix the positioning members 36 and 42, respectively, to the socket body 21 in accordance with the semiconductor devices 36 and 42. Further, it is possible to commonly use constituent elements of the socket body other than the positioning members 33 and 39. Also, since the pressing members 25 and 27 are bulged outward from the socket body 21, they are not restricted by the dimension of the interior of the socket body 21 to facilitate the rigidity of the pressing members 25 and 27.

In addition, in the second embodiment of the inventive semiconductor device socket, modifications shown in FIGS. 7, 10, 12, 14 and 16, respectively, may, of course, be applied.

FIGS. 20A and 20B schematically illustrate a main part of a third embodiment of the inventive semiconductor device socket.

The semiconductor device sockets shown in FIGS. 20A and 20B are arranged at positions on the printed wiring board 22 corresponding to the respective electro-conductive layers. In FIGS. 20A and 20B, only one semiconductor device socket is shown as a representative In this regard, in FIGS. 20A and 20B, the same reference numerals are used for denoting the same elements in FIGS. 19A and 19B and the description thereof will be eliminated. Even in the embodiment shown in FIGS. 20A and 20B, in the same manner as in the above-mentioned embodiment, semiconductor device 36 or 42 can be mounted onto the socket body 80 by using positioning member 33 or 39.

Figure 22:
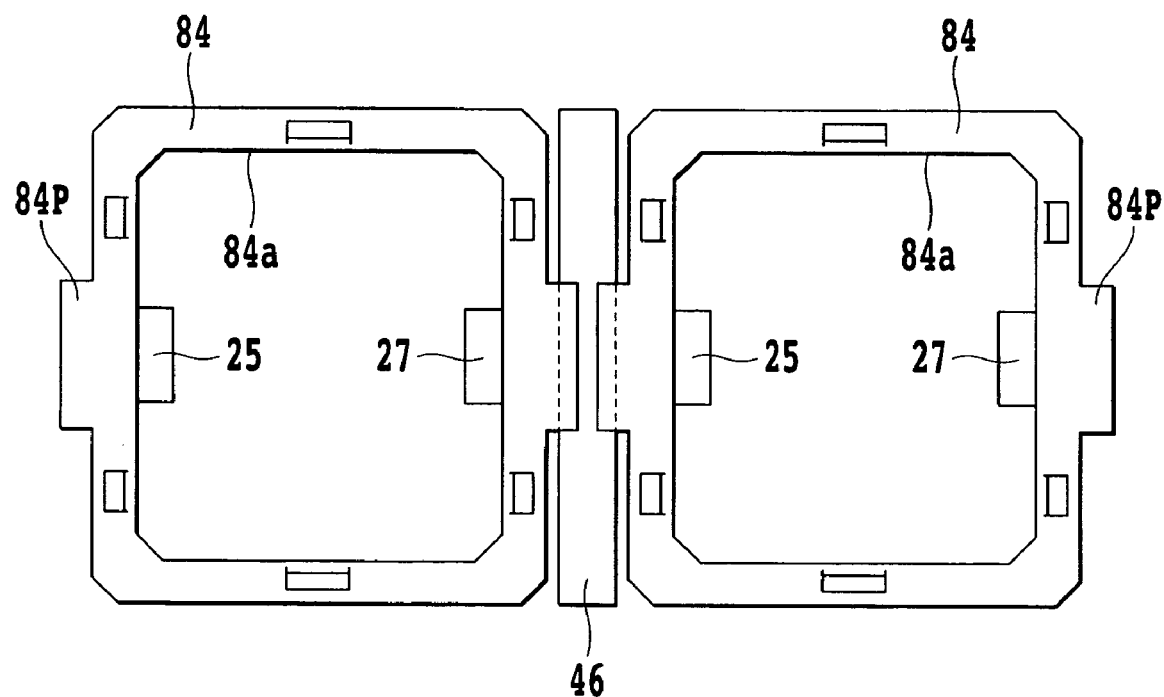
FIG. 22 is a plan view of FIG. 21.

In the embodiment shown in FIGS. 19A and 19B, while part of the pressing members 25 and 27 are directly bulged outward from the socket body 21 and the end of the cover member 29 when the cover member 29 is at the lowermost position, in the embodiment shown in FIGS. 20A and 20B, a convex section 84P encircling end surfaces of the pressing members 25 and 27 in the thickness direction is provided on the opposite sides in the frame portion of the cover member 84 in correspondence to the pressing members 25 and 27 so that part of the pressing members 25 and 27 are not directly bulged from the ends of the socket body 80 and the cover member 84, as shown in FIG. 22.

Figure 23:
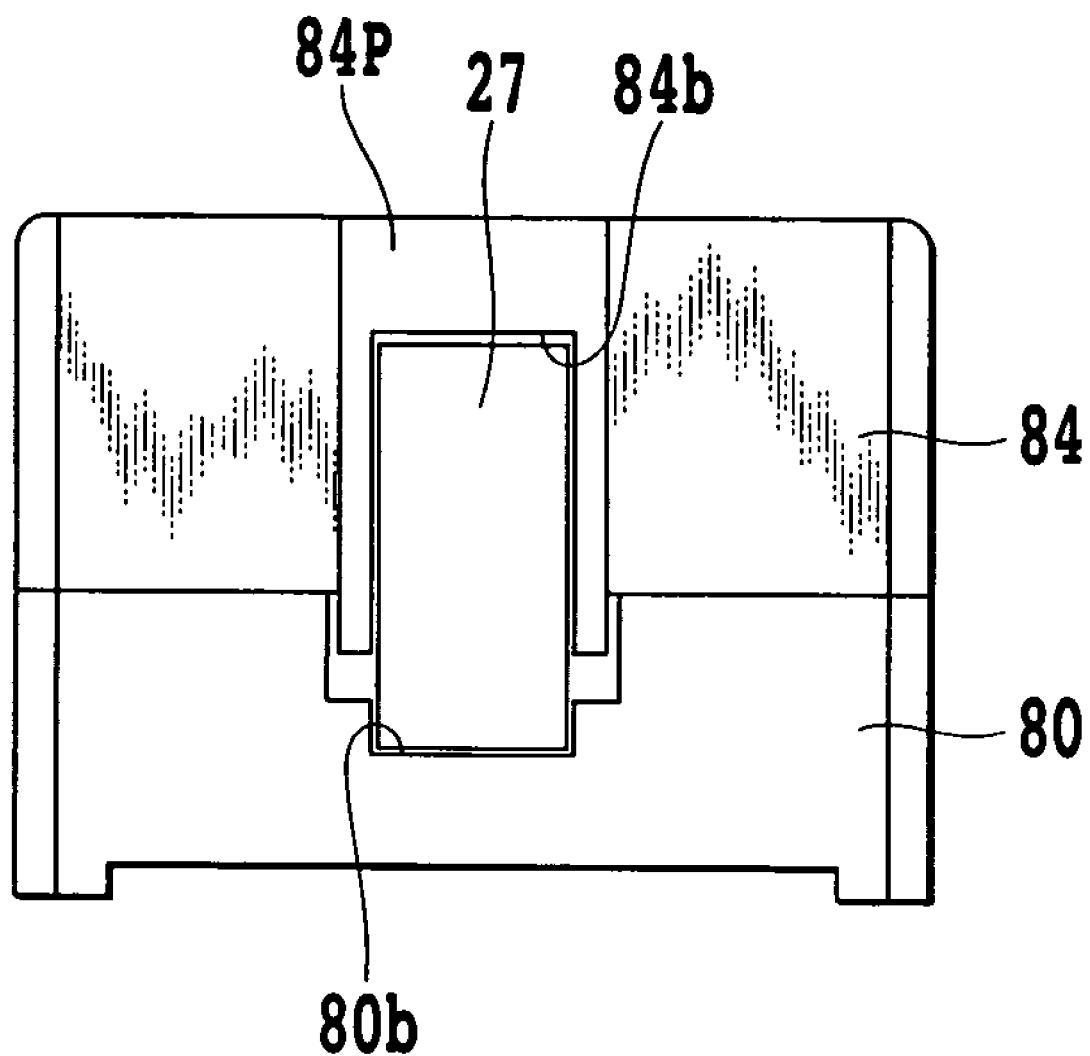
FIG. 23 is a side view of FIG. 22.

As shown in FIG. 23, the socket body 80 has a recess 80b, into which enter a lower end of an arm section, the convex section 4P and the proximal ends of the pressing members 25 and 27 when the cover member 84 described later is lowered. The recess 80b opens to outside. At a center of the interior of the socket body 80, a recess in which contact terminals not shown are disposed in correspondence to the electrode sections of the semiconductor device 36 is formed. The contact terminals extend in the direction generally vertical to the printed wiring board 22. Around the recess, a fixation surface on which the positioning member 33 is placed and fixed is formed. In this regard, on the fixation surface, a positioning member 39 described later is also placed in a detachable manner.

The cover member 84 has an opening 84a in a central portion thereof for allowing the semiconductor device 36 to pass through the same during the attachment/detachment thereof. The cover member 84 is supported to be movable upward and downward by a plurality of legs thereof guided through grooves formed on the outer circumference of the socket body 80. Between the proximal ends of the pressing members 25 and 27 and a bottom forming part of the recess 80b of the socket body 80, there are plurality of coil springs not shown for biasing the pressing members 25 and 27 to be close to each other.

The cover member 84 has an arm section (not shown) engaged with and pushing arm receiving sections provided at proximal ends of the pressing members 25 and 27, which arm section is formed at a lower end of the convex portion 84P while being opposed to the recess 80b. A lower end of the section is projected toward the arm receiving section and the recess 80b.

The convex portion 84P has an opening 84b for allowing the pressing members 25 and 27 to pass through the same. The opening 84b communicates the interior of the cover member 84 to the exterior thereof.

As shown in FIG. 23, a length of the opening 84b is definite in the upward/downward direction. That is, the length is such that, when the cover member 84 is at the uppermost position, the coupled pressing members 25 and 27 are in a pressed and held state, while when the cover member 84 is at the lowermost position, the pressing members 25 and 27 are at the position in readiness, in which the lower end of the arm section is engaged with the arm receiving section and the touch portions of the pressing members 25 and 27 are not in contact with the periphery of the opening 84b as shown in 20B.

Accordingly, also in this embodiment, it is possible to selectively mount each of the semiconductor devices 36 and 42 having contour dimensions different from each other on the socket body by fixing a proper positioning members onto the socket body 80 in accordance with the semiconductor devices 36 and 42 and carry out the predetermined tests. In this case, since other constituent elements in the semiconductor device socket other than the positioning members are commonly usable and there is no limitation in the inner peripheral dimension of the socket body 80, it is possible to facilitate the rigidity of the pressing members 25 and 27.

Figure 21:
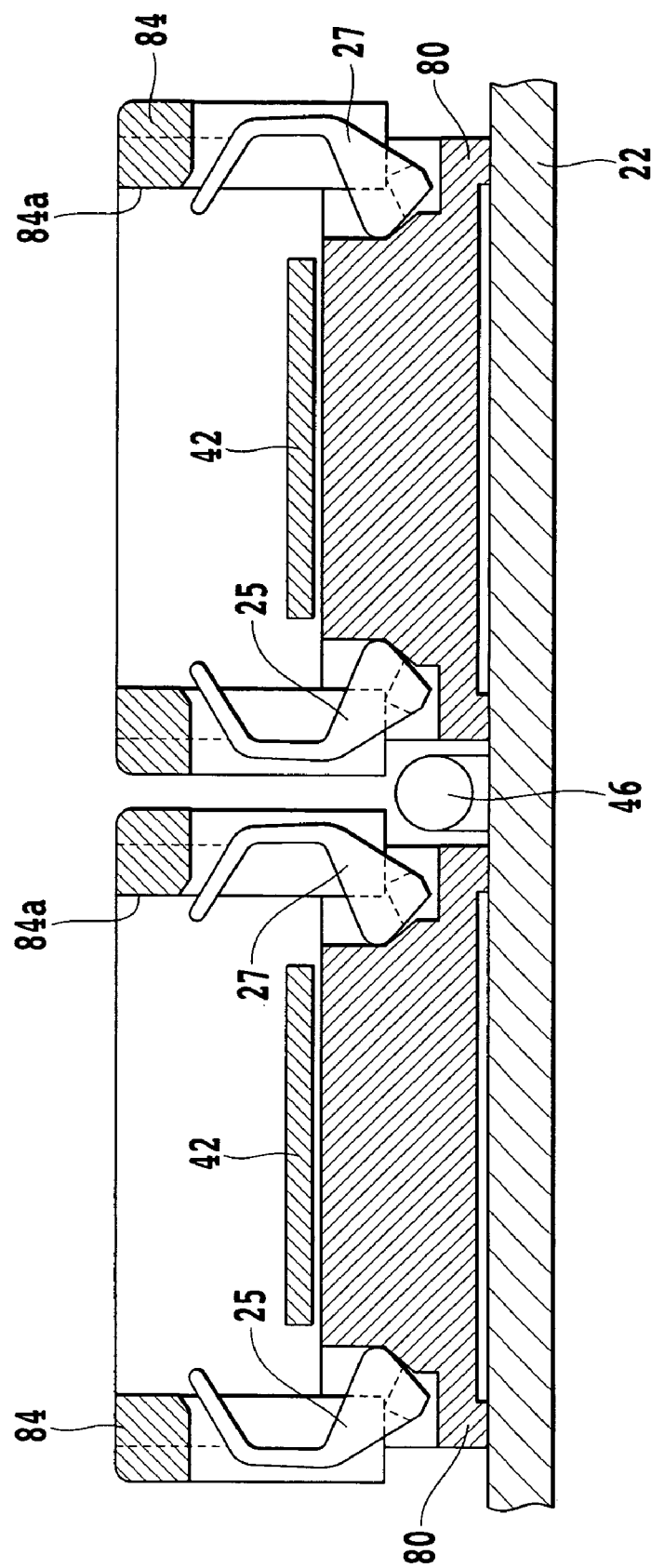
FIG. 21 is a sectional view of a plurality of sockets for a semiconductor device shown in FIGS. 20A and 20B arranged parallel to each other.

FIGS. 21 and 22 illustrate a state in which a plurality of semiconductor device sockets in the above-mentioned third embodiment are disposed on the printed wiring board 22. In this regard, in FIGS. 21 and 22, the same reference numerals are used for denoting the same elements in FIG. 19A and the description thereof will be eliminated. FIG. 21 shows a state in which the cover member 84 is at the lowermost position.

The adjacent semiconductor device sockets are arranged in one row at a pitch so that the pressing members 25 and 27 are opposed to each other as shown in FIG. 22. At this time, an electric part 46 such as a capacitor is disposed on the printed wiring board 22 in a space between the adjacent semiconductor device sockets. Accordingly, a dead space on the printed wiring board 22 is effectively usable.

FIGS. 24A and 24B schematically illustrate a main part of a fourth embodiment of the inventive semiconductor device socket.

In FIGS. 24A and 24B, a plurality of semiconductor device sockets are practically arranged on the printed wiring board 22 at positions in correspondence to the predetermined electro-conductive layers. In FIGS. 24A and 24B, only one semiconductor device socket is shown as a representative. In this regard, in FIGS. 24A and 24B, the same reference numerals are used for denoting the same elements in FIG. 19A and the description thereof will be eliminated. Also in the embodiment shown in FIGS. 24A and 24B, in the same manner as in the above-mentioned second embodiment, the semiconductor device 36 or 42 is mounted on a socket body 90 by a positioning member 33 or 39.

In the third embodiment shown in FIGS. 20A and 20B, the lower end corner of the convex portion 84P of the cover member 84 is projected from the end of the socket body 80. On the contrary, in the embodiment shown in FIGS. 24A and 24B, there is a cut 86S at a lower end corner of a convex portion 86P of a cover member 86 and a chamfered portion 90R at an end of a socket body 90. Thereby, at each end of the socket body 90 in correspondence to the convex portion 86P of the cover member 86, there is a recess at a position inner than a plane common to an end surface of the convex portion 86P of the cover member 86.

Figure 26:
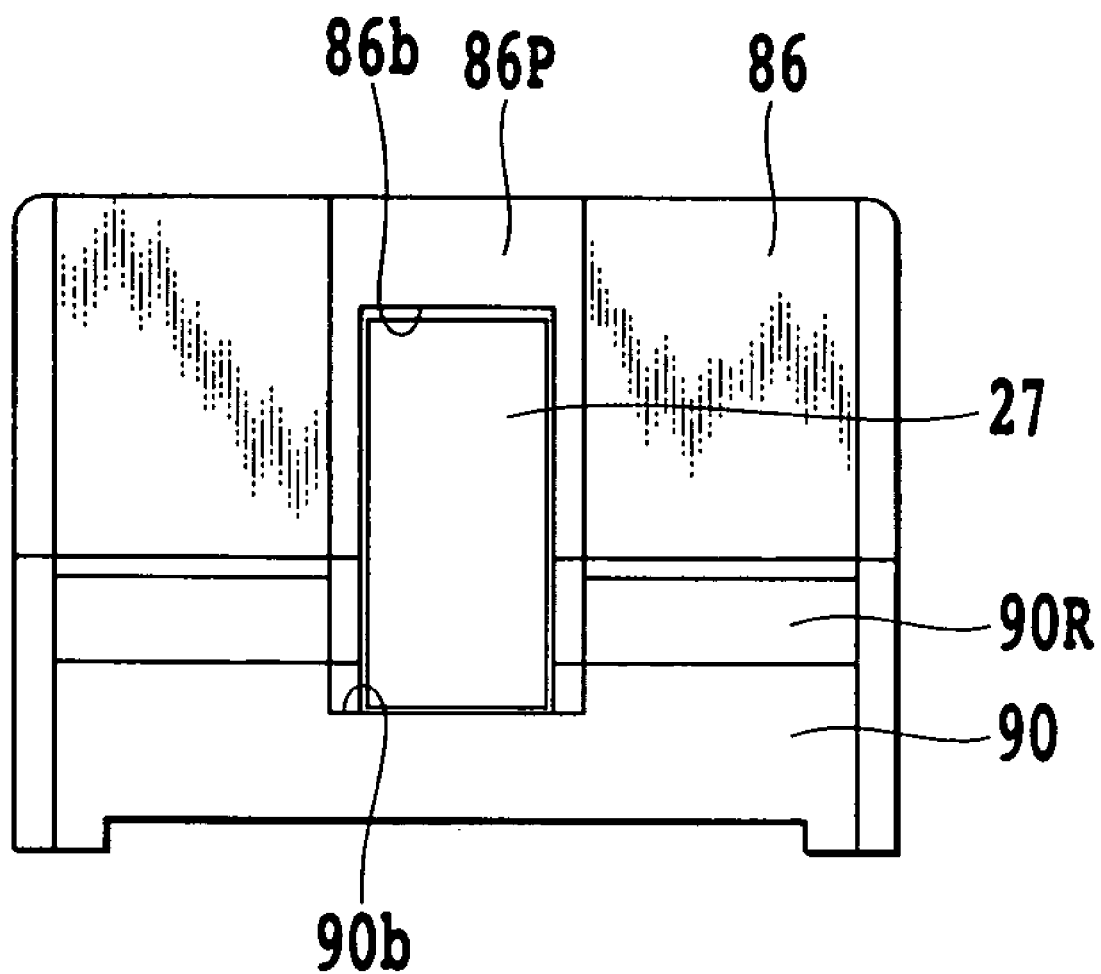
FIG. 26 is a side view of FIG. 25.

The socket body 90 has a recess 90b at each of opposite ends for allowing the lower end of the arm section thereof, the convex portion 86P and the proximal ends of the pressing members 25 and 27 to enter when the cover member 86 described later is lowered as shown in FIGS. 24A and 26. The recess 90b opens to outside.

The cover member 86 has an opening 86a in a central region thereof for allowing the semiconductor device 36 or 42 to pass through the same during the attachment/detachment of the semiconductor device 36 or 42. The cover member 86 is supported to be movable upward and downward by a plurality of legs thereof guided through grooves formed on the outer circumference of the socket body 90. Between the proximal ends of the pressing members 25 and 27 and a bottom forming part of the recess 90b of the socket body 90, there are plurality of coil springs for biasing the pressing members 25 and 27 to be close to each other.

The cover member 86 has an arm section (not shown) engaged with the proximal ends of the pressing members 26 and 28 while being opposed to the recess 90b. A lower end of the section is projected toward the recess 90b.

The convex portion 86P has an opening 86b for allowing the pressing members 25 and 27 to pass through the same. The opening 86b communicates the interior of the cover member 86 to the exterior thereof.

As shown in FIG. 26, a length of the opening 86b is definite in the upward/downward direction. That is, the length is such that, when the cover member 86 is at the uppermost position, the pressing members 25 and 27 are in a pressed and held state, while when the cover member 86 is at the lowermost position, the pressing members 25 and 27 are at the position in readiness, in which the lower end of the arm section is engaged with the proximal ends of the pressing members 25 and the pressing members 25 and 27 are not in contact with the periphery of the opening 86b as shown in 24B.

Accordingly, also in this embodiment, it is possible to obtain the same effect and operation as in the above-mentioned embodiment.

Figure 25:
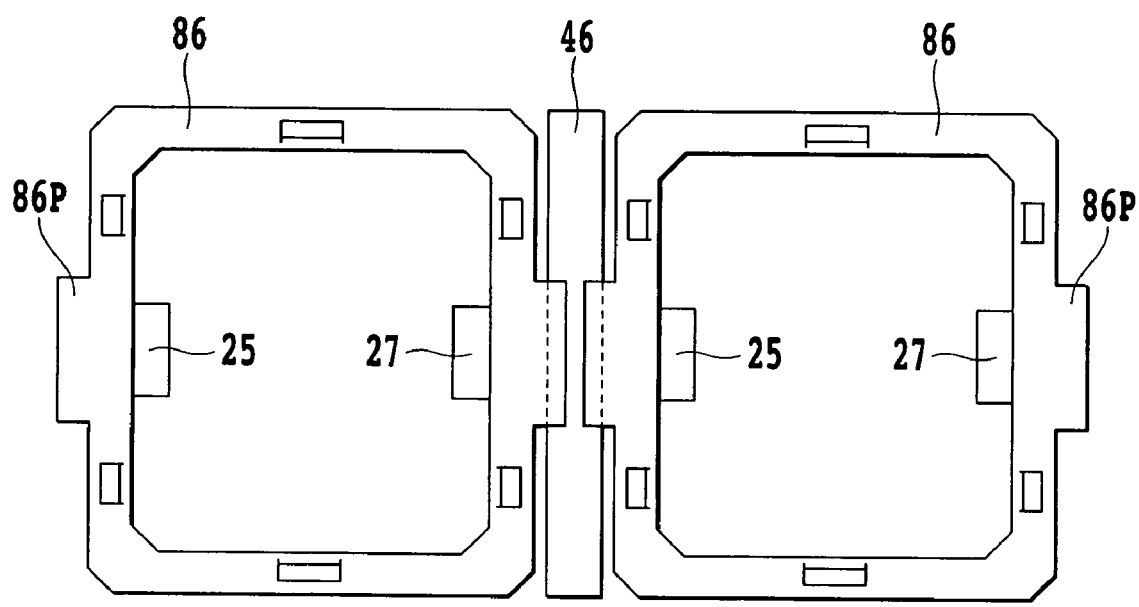
FIG. 25 is a sectional view of a plurality of sockets for a semiconductor device shown in FIGS. 24A and 24B arranged parallel to each other.
Figure 27:
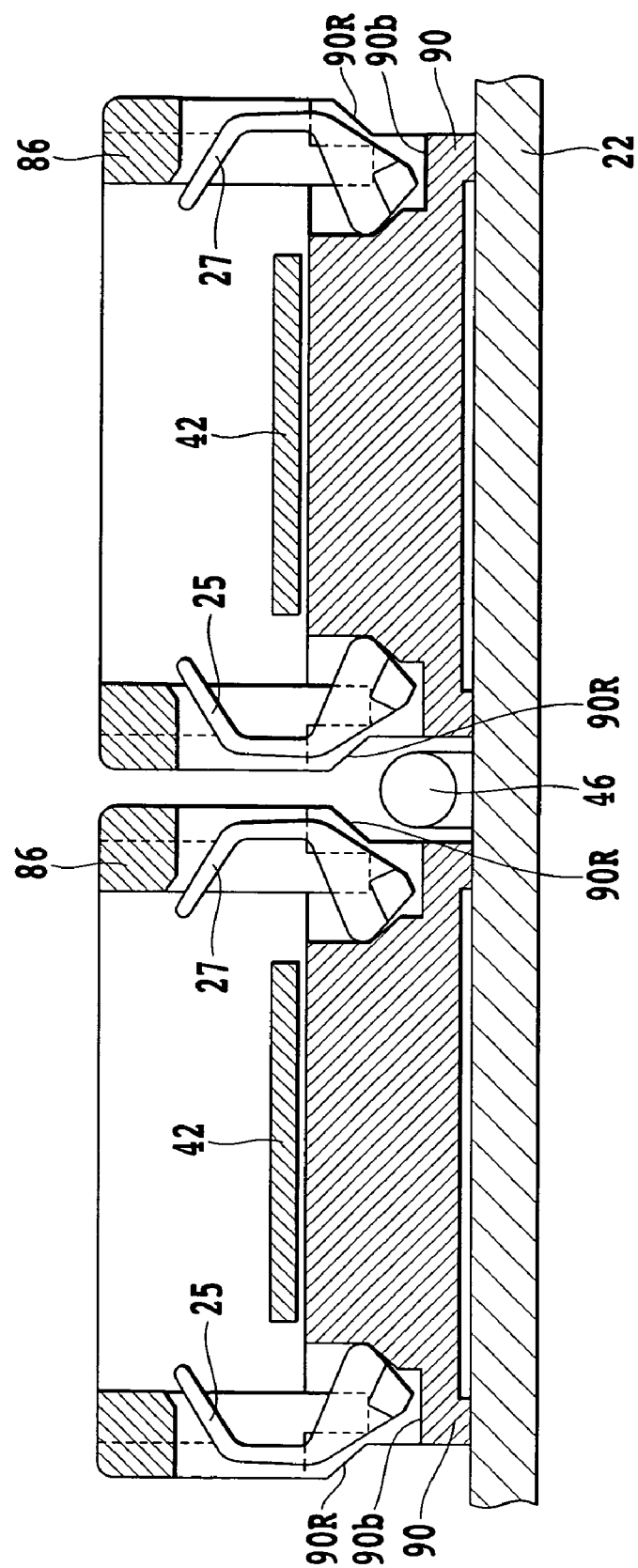
FIG. 27 is a sectional view of a plurality of sockets for a semiconductor device shown in FIG. 25 arranged parallel to each other.

FIGS. 25 and 27 illustrate a state in which a plurality of the above-mentioned inventive semiconductor device sockets according to the fourth embodiment are arranged on the printed wiring board 22. FIG. 27 shows that the cover member 86 is at the lowermost position.

The adjacent semiconductor device sockets are arranged in one row at a predetermined gap between the both so that the pressing members 25 and 27 are opposite to each other, as shown in FIG. 25. At this time, an electric part 46 such as a capacitor is disposed on the printed wiring board 22 in a space between the adjacent semiconductor device sockets. Accordingly, a dead space on the printed wiring board 22 is effectively usable.

Figure 28:
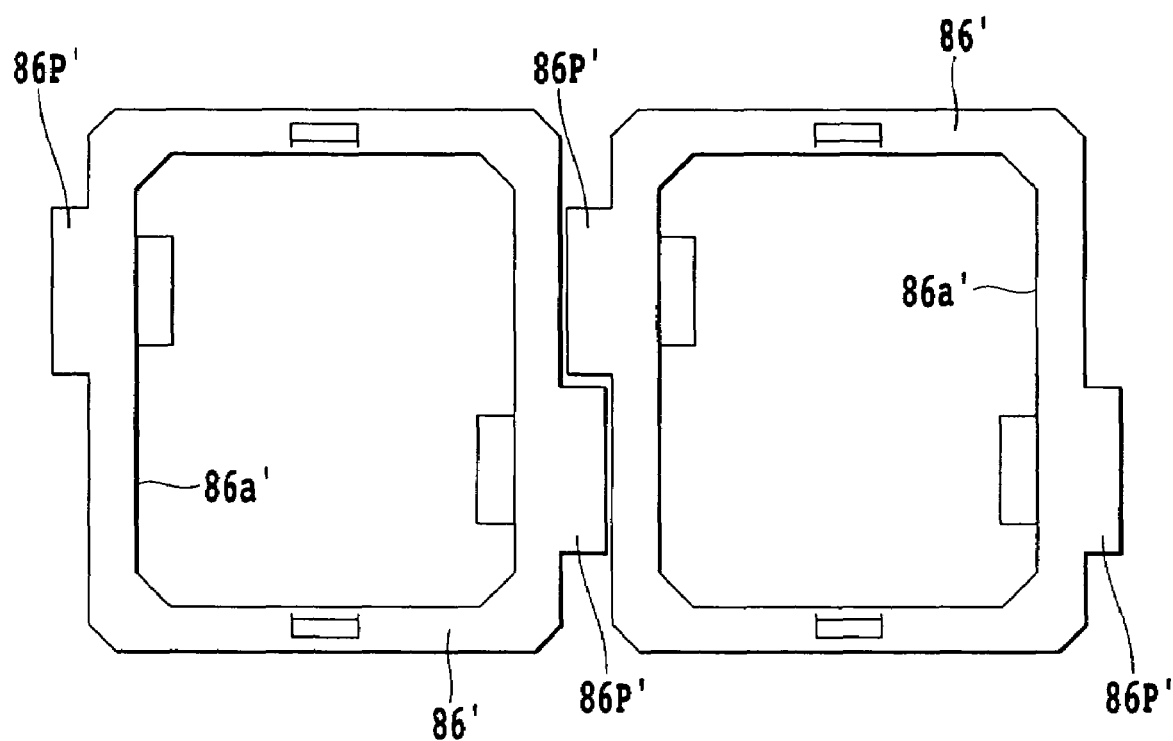
FIG. 28 is a plan view illustrating the arrangement of the adjacent sockets for a semiconductor device in a modification of the fourth embodiment of the socket for a semiconductor device in accordance with the present invention.
Figure 29:
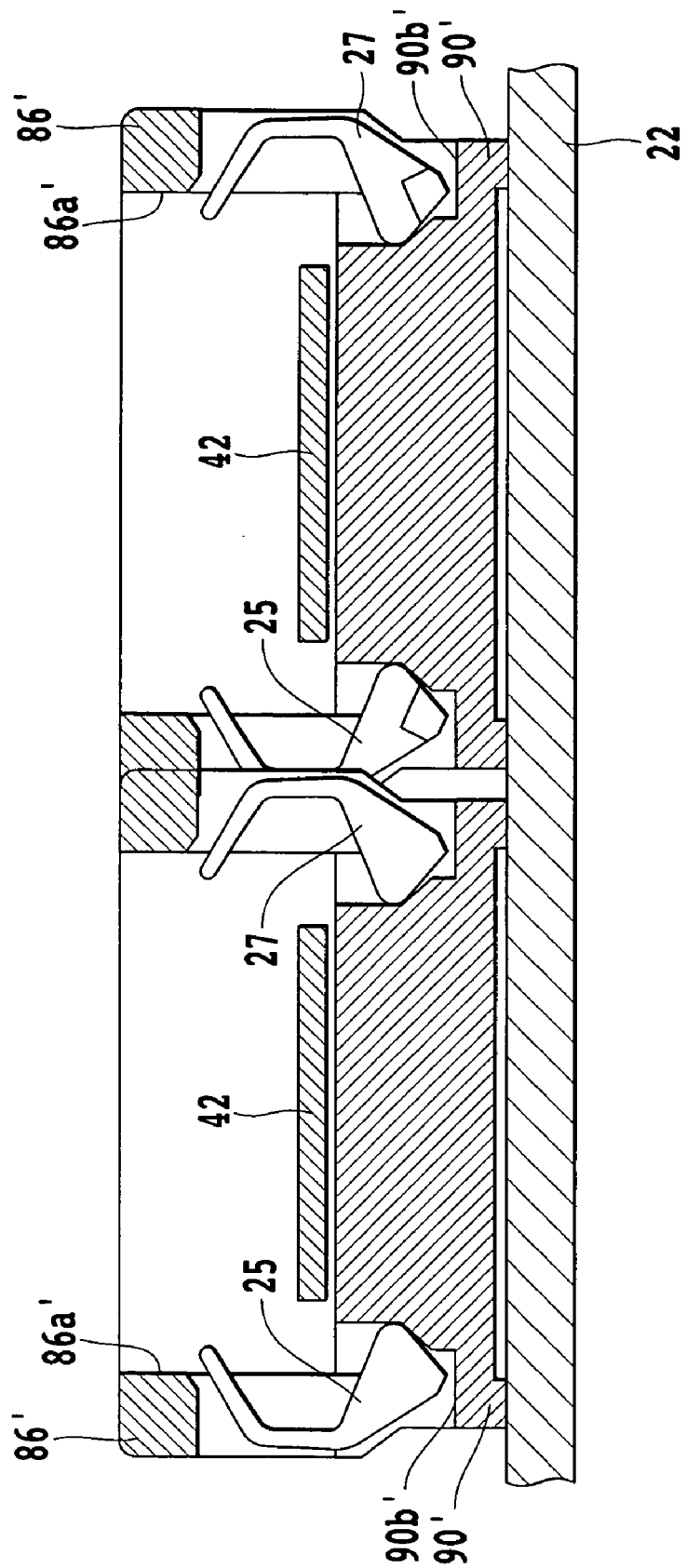
FIG. 29 is a sectional view of FIG. 28 as seen from the front side thereof.

FIGS. 28 and 29 illustrate a modification of the fourth embodiment of the inventive semiconductor device socket.

While the convex portion 86P of the cover member 86P and the recess 90b of the socket body 90 are arranged so that they are directly opposed to each other in the embodiment shown in FIG. 25, a convex portion 86'P of a cover member 86' and a recess 90'b of a socket body 90' are arranged so that they are obliquely opposed to each other for minimizing the mutual distance between the adjacent semiconductor device sockets for realizing the high-density mounting.

Figure 30:
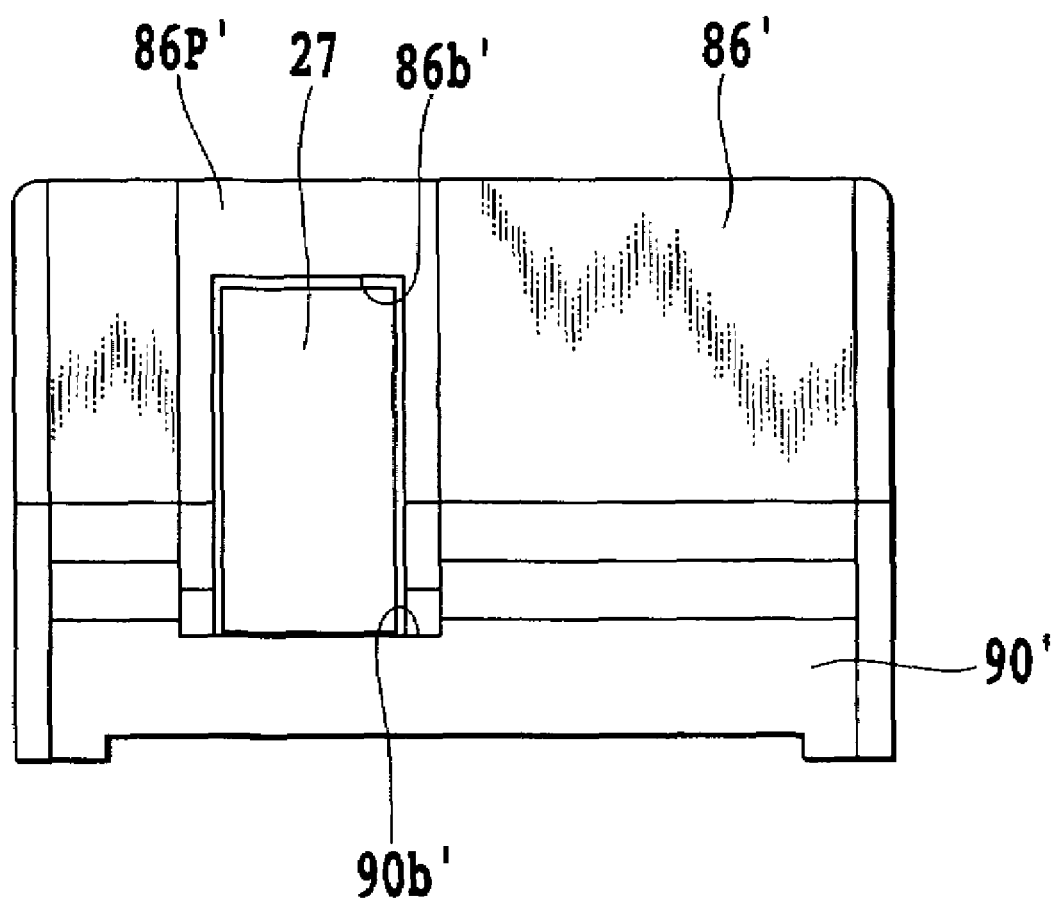
FIG. 30 is a side view of FIG. 28.

The socket body 90' has a recess 90'b at each of opposite ends for allowing the lower end of the arm section thereof, the convex portion 86'P and the proximal ends of the pressing members 26 and 28 to enter when the cover member 86' is lowered as shown in FIG. 29. On the other hand, one recess 90'b is deviated leftward relative to a center line in FIG. 30 and opens to outside. Also, the other recess 90'b is deviated rightward relative to the center line as seen in the same direction.

The cover member 86' has an opening 86'a in a central region for allowing the semiconductor device 36 or 42 to pass through the same during the attachment/detachment thereof.

The cover member 86' has arm sections (not shown) at a lower end of the convex portion 86'b, engageable with the pressing members 25 and 27, respectively. A lower end of the arm section is projected toward the recess 90'b.

The convex portion 86'P has an opening 86'b for allowing the pressing members 25 and 27 to pass through the same. The opening 86'b communicates the interior of the cover member 86' to the exterior thereof.

Accordingly, by arranging the convex portions 86'P of the adjacent semiconductor device sockets to overlap with each other as shown in FIGS. 28 and 29, it is possible to realize the high-density mounting of the semiconductor device sockets on the printed wiring board 22.

Figure 31:
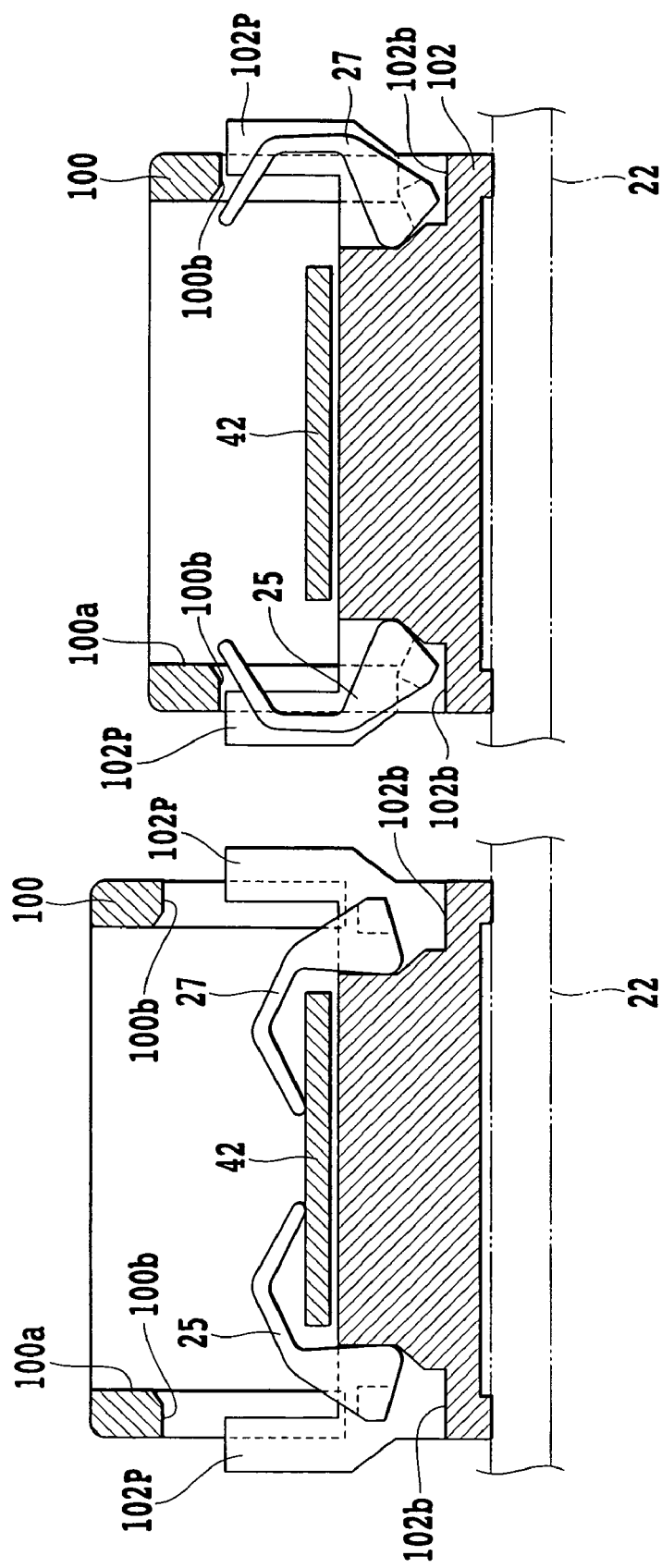
FIGS. 31A and 31B are sectional views, respectively, schematically illustrating a important part of a fifth embodiment of the socket for a semiconductor device in accordance with the present invention.

FIGS. 31A and 31B show a fifth embodiment of the inventive semiconductor device socket.

A plurality of semiconductor device sockets shown in FIGS. 31A and 31B are practically arranged on the printed wiring board 22 at positions in correspondence to the predetermined electro-conductive layers. In FIGS. 31A and 31B, only one semiconductor device socket is shown as a representative. Although not illustrated, in the same manner as in the above-described first embodiment, the semiconductor device 36 or 42 is mounted on a socket body 80 by a positioning member 34 or 40.

Figure 32:
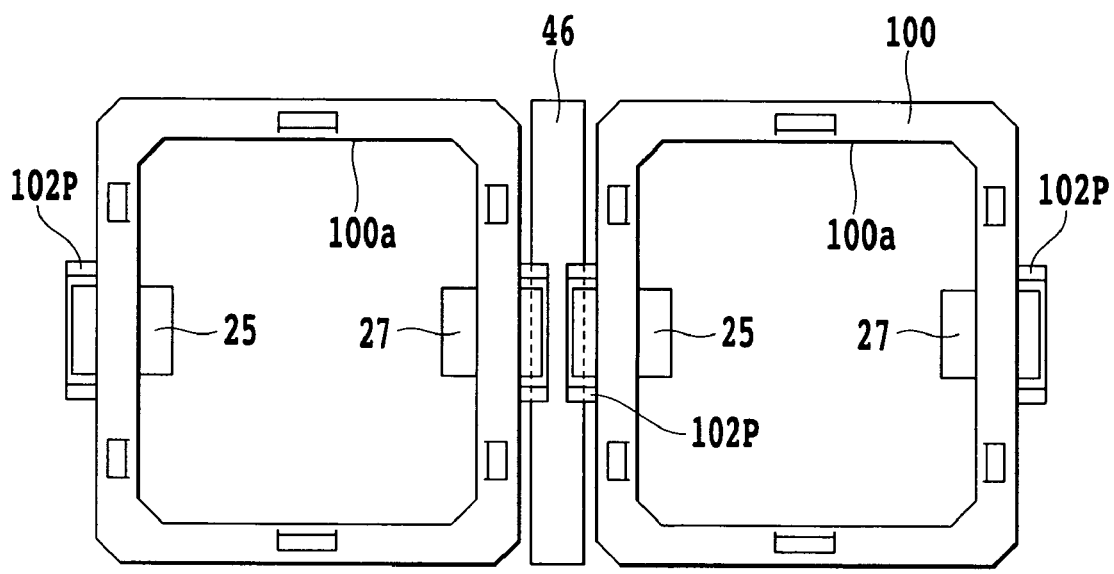
FIG. 32 is a plan view of a plurality of sockets for a semiconductor device shown in FIGS. 31A and 31B arranged parallel to each other.

While the part of the pressing members 25 and 27 are directly projected outside from the socket body 21 and the cover member 29 when the cover member 29 is at the lowermost position in the embodiment shown in FIGS. 19A and 19B, a convex portion 102P encircling each of the thickness-directional end surfaces of the pressing members 25 and 27 is provided at opposite ends of the socket body 102 in correspondence to the pressing members 25 and 27 as shown in FIG. 32 so that part of the pressing members 25 and 27 is not directly projected outside from the socket body 102 and the end of the cover member 100.

Figure 33:
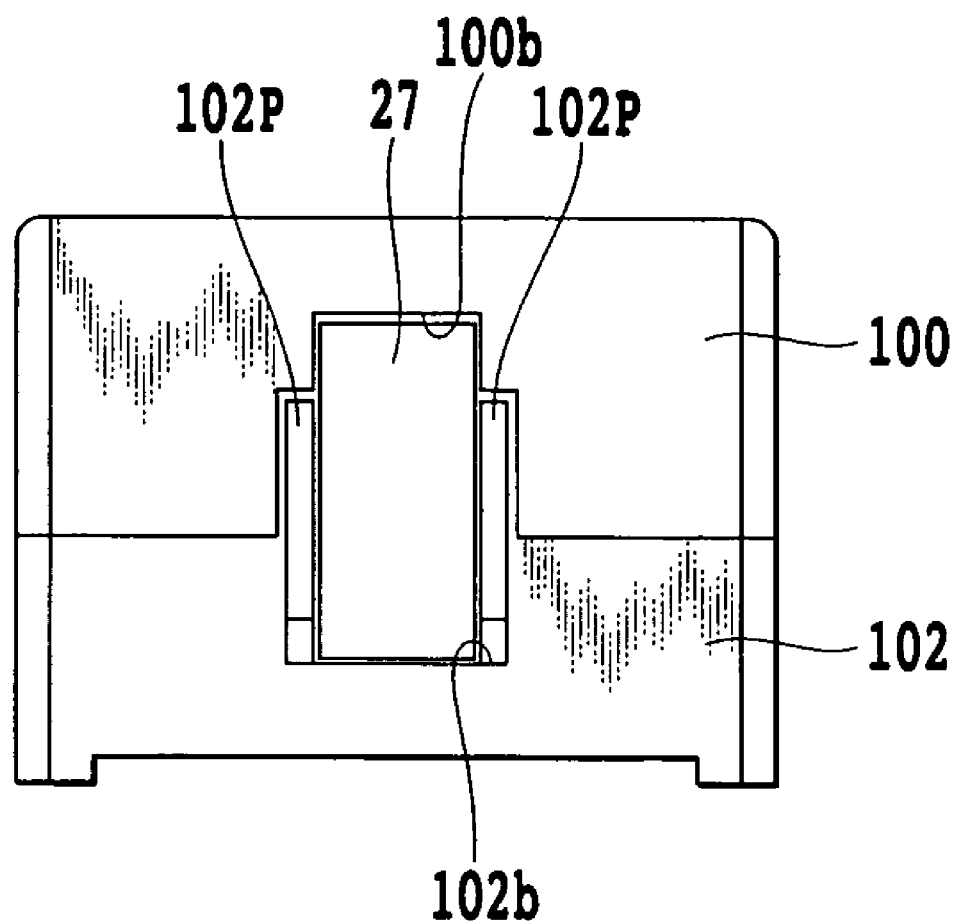
FIG. 33 is a side view of FIG. 32.

The socket body 102 has a recess 102b at each of opposite ends thereof for allowing a lower end of an arm section of the cover member 100 and a proximal end of the pressing members 25 and 27 to enter when the cover member 100 is lowered as shown in FIGS. 31B and 33. The recess 102b is opened to outside. In the recess 102b, the convex portion 102P is formed integral with the socket body 102 opposite thereto while interposing the pressing members 25 and 27. An opening between the convex portions 102P communicates the interior of the socket body 102 to the exterior thereof.

In a central region of the interior of the socket body 102, a recess (not shown) is formed, in which arranged contact terminals are not shown in correspondence to electrode sections of the semiconductor devices 36 and 42. The contact terminal extends in the direction generally vertical to the printed wiring board 22. Around the recess, a fixation surface is formed on which a positioning member 33 not shown is placed and fixed. In this regard, on the fixation surface, a positioning member 39 is also placed in a detachable manner.

The cover member 100 has an opening 100a in a central region for allowing the semiconductor device 36 or 42 to pass through the same during the attachment/detachment thereof. The cover member 100 is supported to be movable upward and downward by a plurality of legs thereof guided through grooves formed on the outer circumference of the socket body 102. Between the proximal ends of the pressing members 25 and 27 and a bottom forming part of the recess 102b of the socket body 102, there are plurality of coil springs not shown for biasing the pressing members 25 and 27 to be close to each other.

A lower end of an arm section of the cover member 100 is projected toward the recess 102b.

An opening 100b is formed in a portion of the cover member 100 corresponding to the pressing members 25 and 27 and the convex portion 102P of the socket body 102 as shown in FIG. 33.

Accordingly, also in this embodiment, it is possible to selectively mount each of the semiconductor devices 36 and 42 having contour dimensions different from each other on the socket body 102 by fixing a proper positioning members onto the socket body 102 in accordance with the semiconductor devices 36 and 42 and carry out the predetermined tests. In this case, since other constituent elements in the semiconductor device socket other than the positioning members are commonly usable and there is no limitation in the inner peripheral dimension of the socket body 102, it is possible to facilitate the rigidity of the pressing members 25 and 27.

Figure 34:
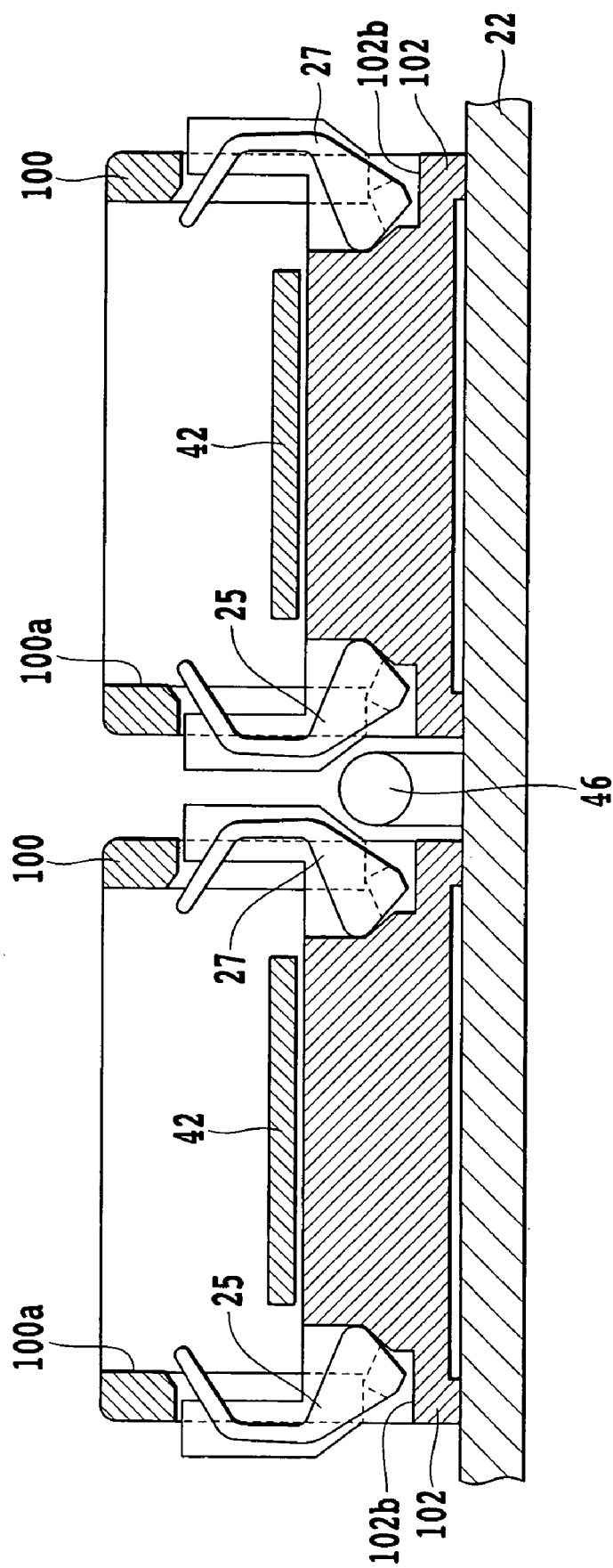
FIG. 34 is a sectional view of FIG. 32 as seen from the front side thereof.

FIGS. 32 and 34 illustrate a state in which a plurality of semiconductor device sockets in the above-mentioned fifth embodiment are disposed on the printed wiring board 22. In this regard, in FIGS. 32 and 34, the same reference numerals are used for denoting the same elements in FIGS. 19A and 19B and the description thereof will be eliminated. FIG. 34 shows a state in which the cover member 100 is at the lowermost position.

The adjacent semiconductor device sockets are arranged in one row at a pitch so that the pressing members 25 and 27 are opposed to each other as shown in FIG. 32. At this time, an electric part 46 such as a capacitor is disposed on the printed wiring board 22 in a space between the adjacent semiconductor device sockets. Accordingly, a dead space on the printed wiring board 22 is effectively usable.

In this regard, while the cover member 30 and the pressing members 26 and 28 of the latch mechanism are associated with each other and the contact terminal is a so-called "POGOPIN" (registered trade mark) in the respective embodiments of the inventive semiconductor device socket described hereinabove, such a structure is not indispensable. As disclosed, for example, in Japanese Patent No. 3257994 and Japanese Patent Application Laying-open No. 10-302925 (1998), the terminal of the semiconductor may be nipped by a pair of contact terminals having a movable contact openable in one direction or both directions.

Also, as shown in Japanese Patent No. 3257994, the respective embodiments of the inventive semiconductor device socket may be, of course, applicable to a structure in which the pressing member in the latch mechanism is not coupled to the cover member but a pair of movable contacts of the contact terminal and the pressing member of the latch mechanism are operated via the slider associated with the cover member or the cover member itself.

Figure 35:
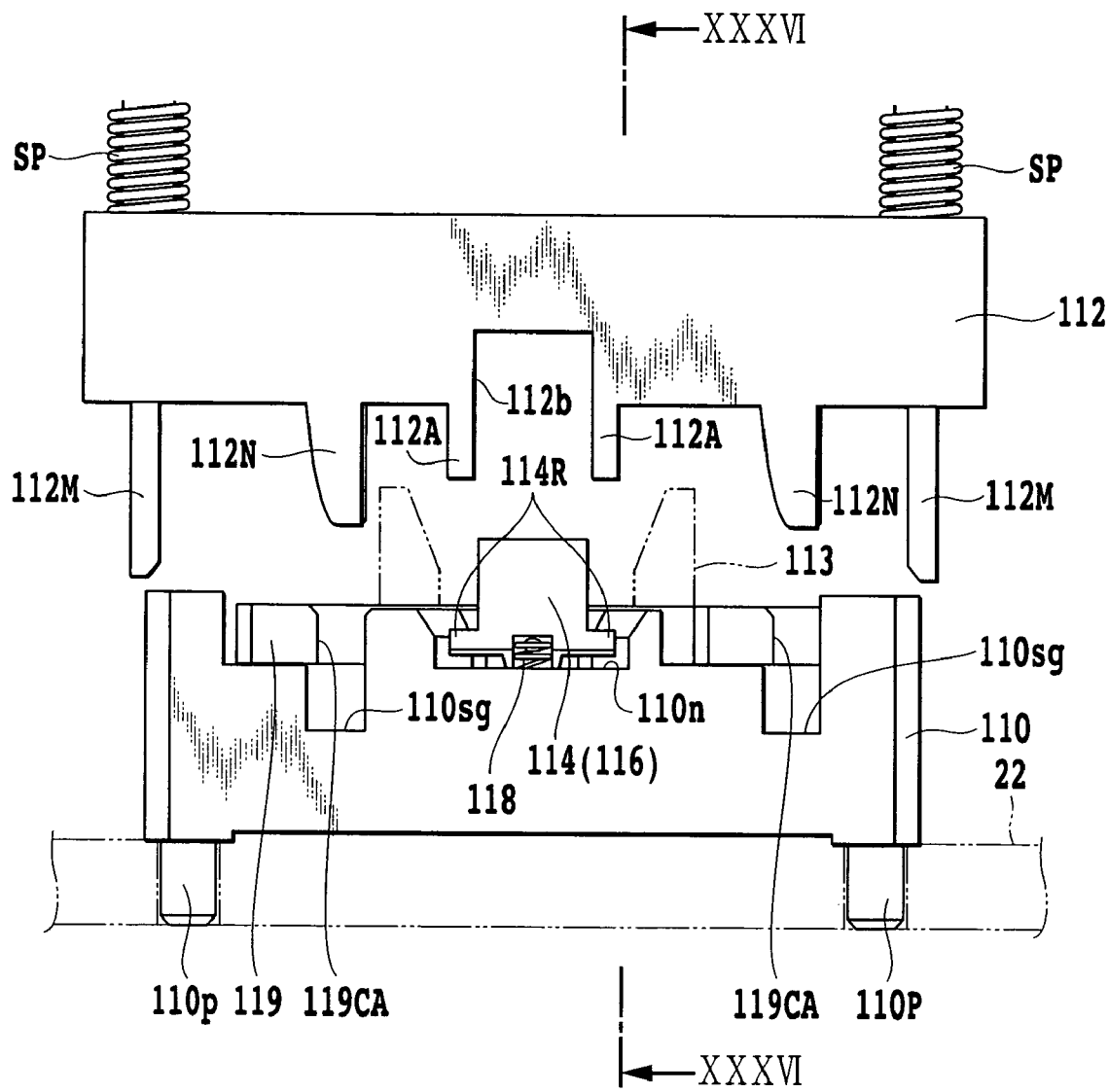
FIG. 35 is a front view of a sixth embodiment of the socket for a semiconductor device in accordance with the present invention schematically illustrating the appearance thereof.
Figure 36:
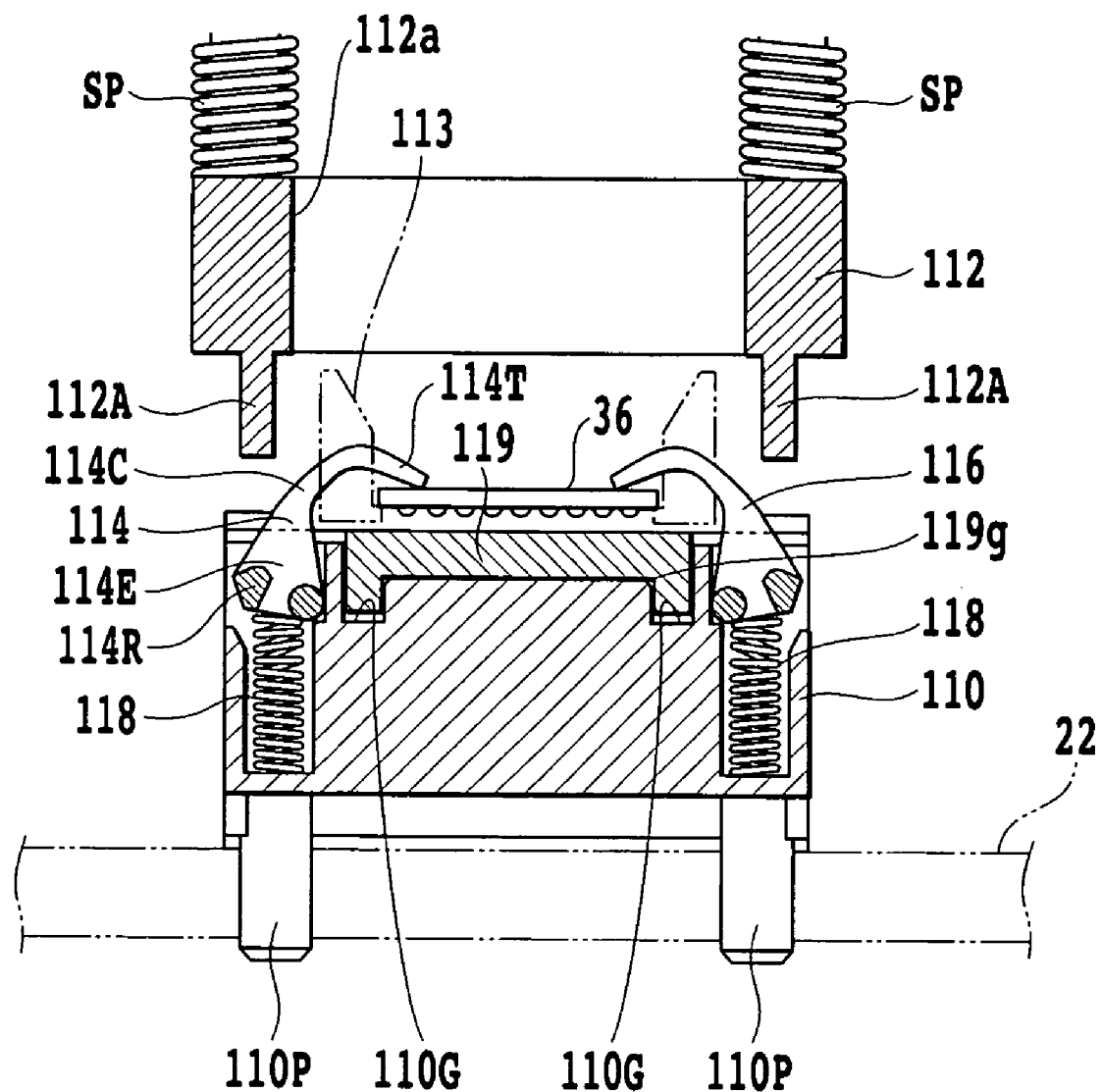
FIG. 36 is a sectional view taken along a section line XXXVI—XXXVI in FIG. 35.

FIGS. 35 and 36 show a sixth embodiment of the inventive semiconductor device socket.

In the respective embodiments described above, the cover member is supported by the outer circumference of the socket body to be movable upward and downward. On the other hand, in the embodiment shown in FIGS. 35 and 36, a cover member 112 is separated from a socket body 110 and supported by a hand of a conveyor robot not shown. In this regard, the conveyor robot not shown is disposed directly above a socket body 110 and controlled to move upward and downward so that the cover member 112 is closer to or away from the socket body 110 based in a command in accordance with a predetermined program. FIGS. 35 and 36 illustrate a state in which the cover member 112 is completely apart from the socket body 110.

The cover member 112 is supported by a hand of the conveyor robot via coil springs SP. The coil spring SP biases the cover member 112 to be away from the hand of the conveyor robot.

Figure 37:
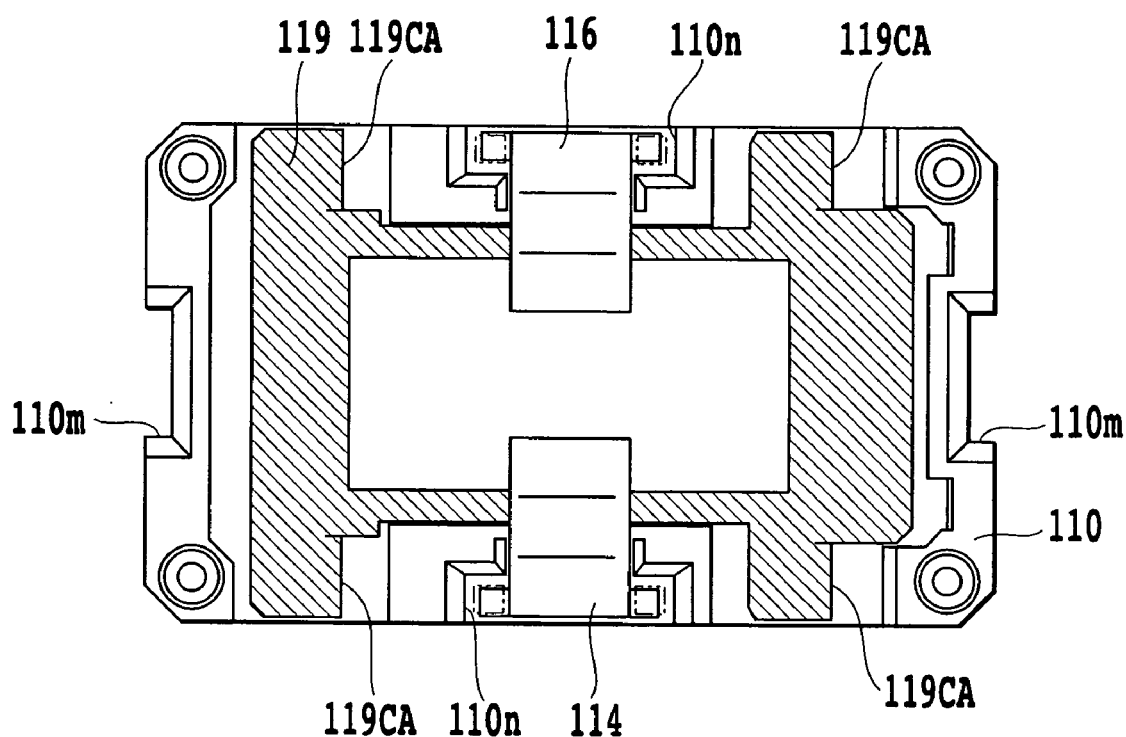
FIG. 37 is a sectional view in a state shown in FIG. 35.

The cover member 112 has an opening 112a in a central region for allowing a semiconductor device 36 or 42 to pass through the same during the attachment/detachment thereof. On longer sides of a frame portion of the cover member 112, cam sections 112N to be engaged with a slide member 119 of the socket body 110 described later are provided at a predetermined gap on the lower end surface thereof. Between the cam sections 112N on the respective sides, a pair of arm sections 112A to be engaged with pressing members 114 and 116 of the socket body 110 described later are formed integral with the cover member 112 at a predetermined gap between the both. A cut 112b is formed between the arm sections 112A. On shorter sides of the frame portion of the cover member 112, there are claws 110m to be engaged with cuts 110m of the socket body 110 shown in FIG. 37. The cam sections 112N, the arm sections 112A and claws 110m are projected toward the socket body 110.

The socket body 110 is fixed to a printed wiring board 22. The socket body 110 is located relative to an electroconductive section of the printed wiring board 22 by positioning pins 110P provided on the bottom of the socket body 110.

The socket body 110 includes a slider member 119 for electrically connecting contact sections of a contact terminal group not shown to electrode sections of a selectively mounted semiconductor device 36 or 42, positioning members 113 detachably mounted to the slider member 119 for locating the contact sections of the contact terminal group relative to the electrode sections of the above-mentioned semiconductor device 36, or positioning members detachably mounted to the slider member 119 for locating the contact sections of the contact terminal group relative to the electrode sections of the above-mentioned semiconductor device 42, pressing members 114 and 116 for holding the mounted semiconductor device 36 or 42, and coil springs 118 for biasing tip ends of the pressing members 114 and 116 in the mutually approaching direction.

Terminals constituting the contact terminal group not shown are arranged in a recess formed in a central region of the socket body 110. The respective contact terminal has a pair of movable contacts at one end thereof for selectively nipping the electrode section of the semiconductor device 36 or 42 for the electric connection. The other end of the contact terminal is electrically connected to the electro-conductive section of the printed wiring board 22.

Figure 38:
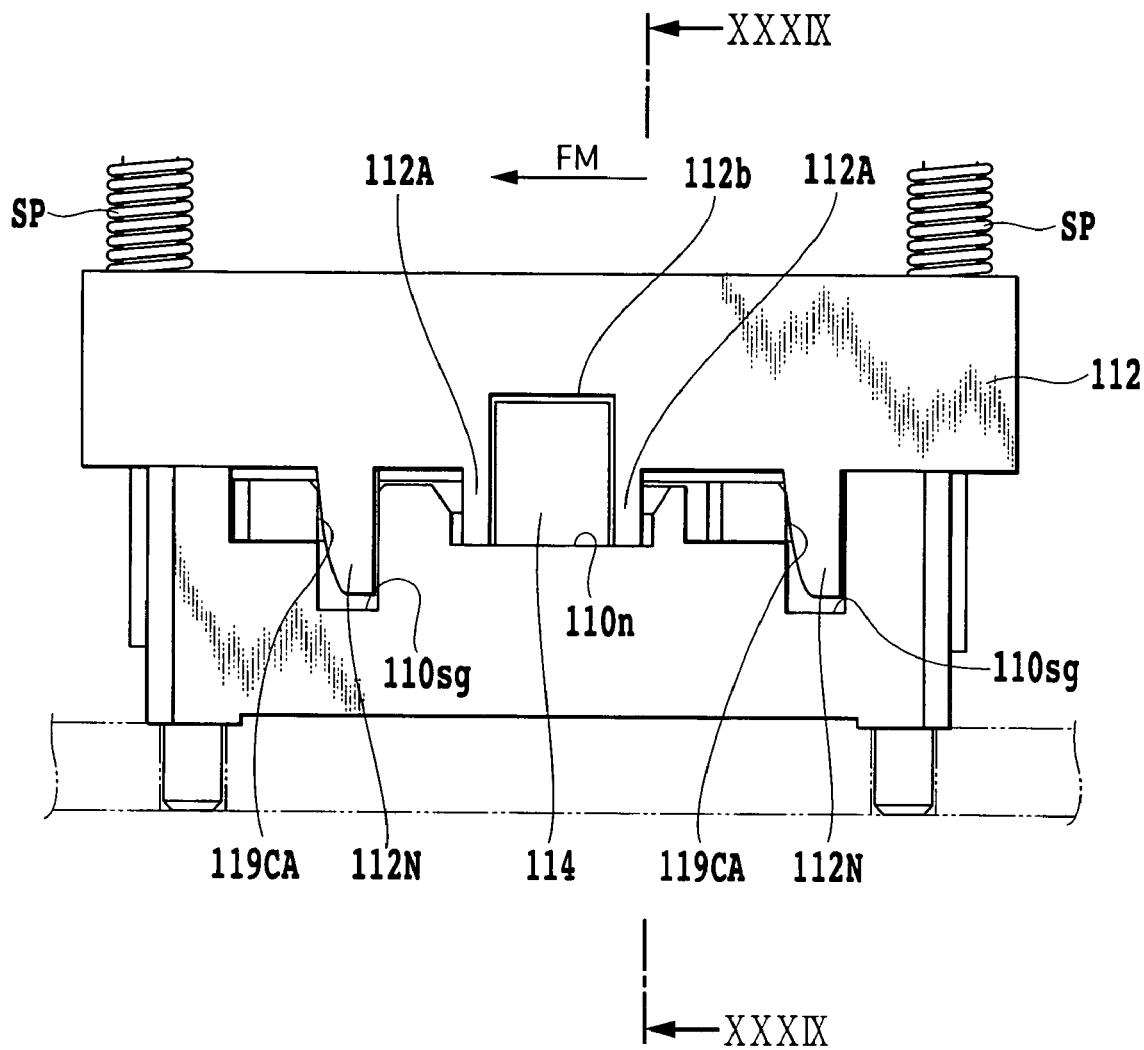
FIG. 38 is a front view made available for explaining the operation of the embodiment shown in FIG. 35.

The slider member 119 of a flat plate shape has a guide sections 119g engageable with grooves 110G formed in the socket body 110 generally parallel to each other to be slidable in the direction generally vertical to a paper surface in FIG. 36. The slider member 119 has in a central region a lattice-shaped pressing section disposed between the movable contacts of the respective contact terminal described above so that one movable contact is close to or away from the other. On each of both sides of the slider member 119, a cam follower surface 119CA engageable with the above-mentioned cam section 112N is formed. The cam follower surface 119CA is formed to intersect a surface of the cover member 112 opposed to the slider member 119. A portion in which the cam follower surface 119CA is formed is supported in a slidable manner on a shoulder formed on an upper end surface of each the opposite side walls of the socket body 110. In the vicinity of each the shoulder, a groove 110sg is formed, into which the cam section 112N is inserted as shown in FIG. 38. Between the grooves 110sg, there is a cut 110n for allowing the pressing members 114 and 116 to pass through the same and for receiving the arm sections 112A of the cover member 112.

Thus, as shown in FIG. 38, when the cam section 112N of the cover member 112 is engaged with the cam follower surface 119CA, the slider member 119 is moved in the direction shown by an arrow FM in FIG. 38 at a predetermined distance, whereby the movable contacts of the respective contact terminal are away from each other. Accordingly, the electrode section of the semiconductor device 36 or 42 is capable of being disposed between the movable contacts of the respective contact terminal. On the other hand, as shown in FIG. 35, when the cam section 112N of the cover member 112 is away from the cam follower surface 110CA, the slider member 119 is biased by a biasing member not shown in the direction opposite to that shown by the arrow FM in FIG. 38.

Since the positioning member 113 and that for the semiconductor device 42 are similar to each other, the explanation will be done solely on the positioning member 113 and eliminated on the other positioning member.

The positioning member 113 has a plurality of holes engageable with a plurality of pins, respectively, provided on the mounting surface of the slider member 119. By the engagement of the holes with the pins, the positioning member 113 is supported on the mounting surface of the slider member 119. In this regard, the plurality of pins are used commonly to the positioning member for the semiconductor device 42.

The positioning member 113 has four positioning corners to be engaged with the respective corners of the semiconductor device 36. A cut is formed between the corners.

Since the pressing members 114 and 116 has the same structure, the explanation will be done on the pressing member 114 and eliminated on the pressing member 116.

The pressing member 114 includes a proximal end section 114E held for rotation by the socket body 110, an touch portion 114T in contact with and pressed onto the upper surface of the semiconductor device 36 or 42, and a connecting section 114C for connecting the proximal end section 114E with the touch portion 114T.

The proximal end section 114E is held for rotation at a center thereof by the socket body 110. The above-mentioned coil spring 118 is arranged beneath the proximal end section 114E.

Figure 39:
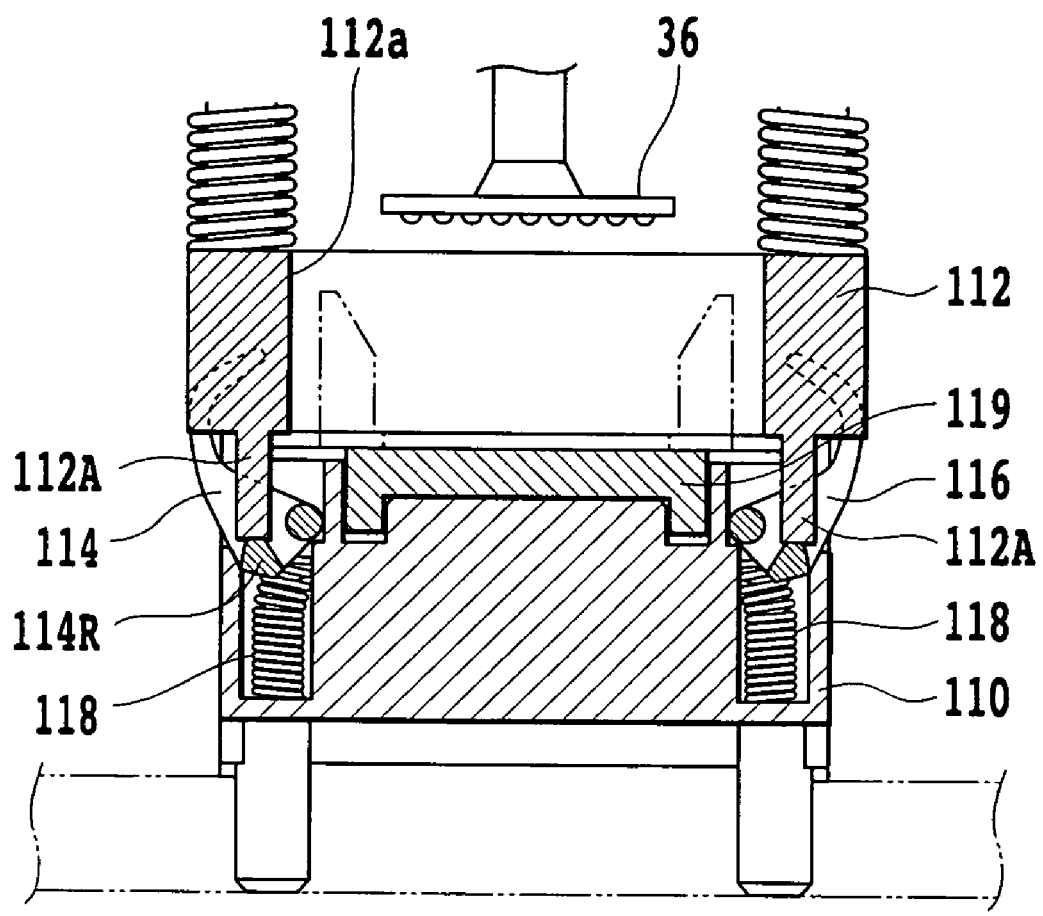
FIG. 39 is a sectional view taken along a section line XXXIX—XXXIX in FIG. 38.

There are arm receiving sections 114R pushed by the arm section 112A at opposite ends of the proximal end section 114E. The arm receiving section 114R is deviated from a rotary center of the proximal end section 114E toward the outside of the socket body 110. Accordingly, as shown in FIG. 39, when the arm receiving section 114R is pushed by the arm section 112A, the pressing member 114 is made to rotate to be away from the pressing member 116.

A length between the rotary center of the proximal end section 114E and a curved tip end of the touch portion 114T is selected so that the tip end of the touch portion 114T reaches a predetermined position on the upper surface of the mounted semiconductor device 36 or 42. Also, a length from the rotary center of the proximal end section 114E to one end of the connecting section 114C is selected, as shown in FIG. 39, to be projected outward when pushed by the arm section 112A of the cover member 112.

Figure 40:
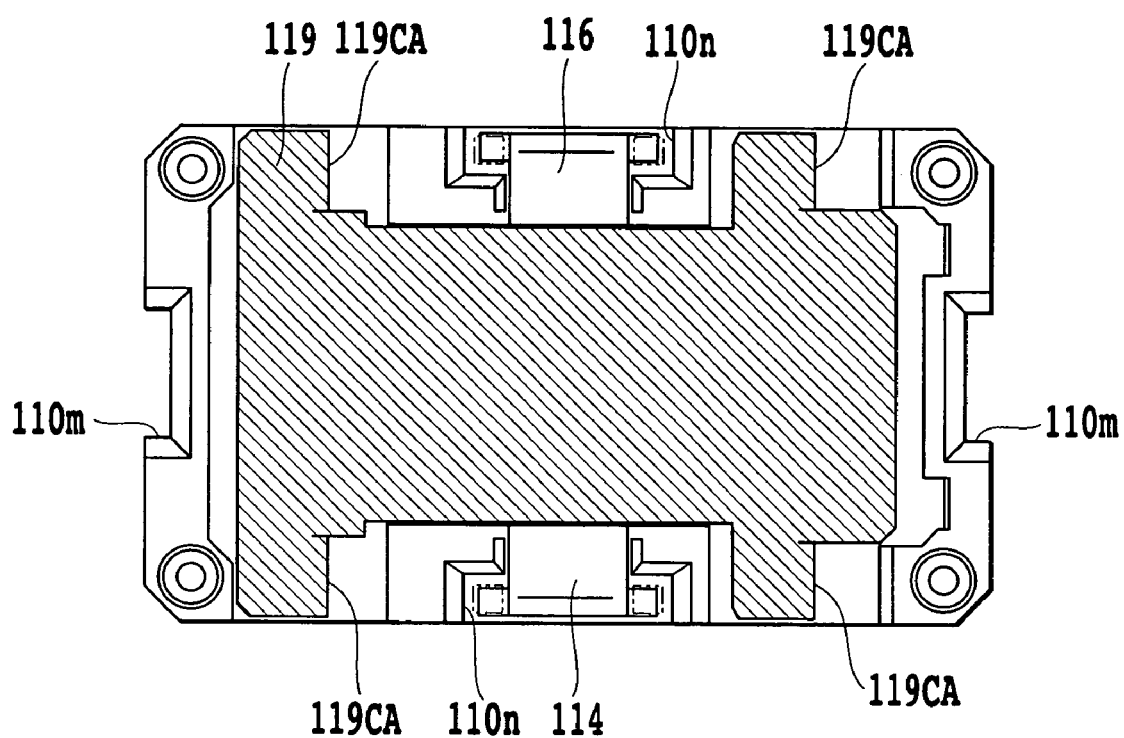
FIG. 40 is a sectional view in a state shown in FIG. 38.

Also in this structure, as shown in FIG. 38, when the are section 112A of the cover member 112 is lowered from a position shown in FIG. 35, the pressing members 114 and 116 are made to rotate away from each other about the rotary centers thereof so that each is reversely stood up in the opening 112b at a position directly beneath the frame portion of the cover member 112. As a result, as shown in FIG. 39, part of the proximal end section and the connecting section of the pressing member 114, 116 is bulged outward from the respective side wall of the socket body 110. At this time, the slider member 119 is moved as shown in FIG. 40, and after the semiconductor device 36, for example, is located directly above the positioning member 113 as shown in FIG. 39, is mounted to the positioning member 113 through the opening 112a.

Then, when the cover member 112 is elevated, the pressing members 114 and 116 return to a state shown in FIG. 36 due to the bias of the coil springs 118 to hold the semiconductor device 36 or 42.

Accordingly, also in this embodiment, it is possible to carry out various tests by selectively fix the positioning member to the slider member 119 in accordance with the semiconductor devices 36 and 42 having the contour dimension different from each other. Further, it is possible to commonly use constituent elements of the socket body other than the positioning members. Also, since the pressing members are bulged outward from the socket body 110, they are not restricted by the dimension of the interior of the socket body 110 to facilitate the rigidity of the pressing members 114 and 116.

Figure 41:
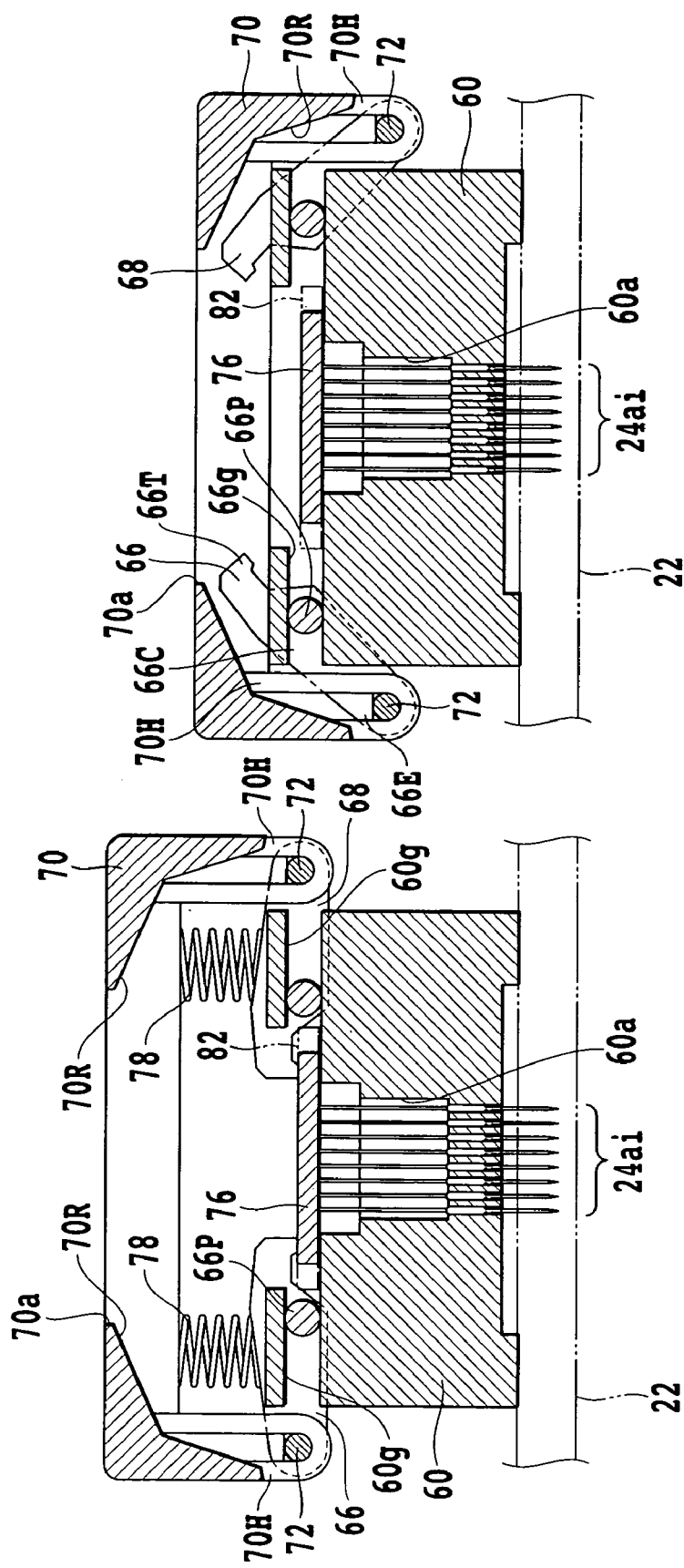
FIGS. 41A and 41B are sectional views, respectively, of a seventh embodiment of the socket for a semiconductor device in accordance with the present invention.

FIGS. 41A and 41B schematically illustrate a whole structure of a seventh embodiment of the inventive semiconductor device socket.

A plurality of semiconductor device sockets shown in FIGS. 41A and 41B are arranged on the printed wiring board 22 at positions in correspondence to the respective electroconductive layers. In FIGS. 41A and 41B, only one semiconductor device socket is shown as a representative.

The semiconductor device socket includes a socket body 60 fixed onto the printed circuit body 22, a plurality of contact terminals 24*ai* (i=1 to n, n is a positive integer) arranged in a contact accommodating section 60*a* in a central region of the socket body 60, for electrically connecting a semiconductor device 76 described later to the printed wiring board 22, a cover member 70 supported by the socket body 60 to be movable upward and downward for transmitting the operative force to a latch mechanism, a positioning member (not shown) held by the socket body 60 in a detachable manner, for accommodating the semiconductor device 76 to be tested and for locating electrode sections of the semiconductor device 76 to the contact terminals 24*ai*, and pressing members 66 and 68 for pressing the respective electrode sections of the semiconductor device 76 accommodated in the positioning member toward the plurality of contact terminals 24*ai*.

In this regard, also in this semiconductor device socket, in place of the semiconductor device 76, another semiconductor device 82 having the same shape and thickness as those of the semiconductor device 76 but different in contour dimension may be mounted to the socket body 60 by using a predetermined positioning member (not shown) for the semiconductor device 82, in the same manner as in the above-mentioned first embodiment. The semiconductor device 76 or 82 may be, for example, of a generally square shape such as BGA type or LGA type, having an electrode surface on which a plurality of electrode sections are arranged in the vertical and horizontal directions. A contour dimension of the semiconductor device 82 is larger than that of the semiconductor device 76.

A recess 60*a* is formed at a center of the interior of the socket body 60, in which the contact terminals 24*ai* are arranged in correspondence to the electrode sections of the semiconductor device 76. Around the recess 60*a*, there is a fixation surface on which the positioning member not shown is disposed and fixed. In this regard, the positioning member (not shown) for the semiconductor device 82 is also placed on the fixation surface in a detachable manner.

On the fixation surface, inner grooves 60*g* for guiding guide pins of the engaged pressing members 66 and 68 in a movable manner are formed around the recess 60*a*. The inner groove 60*g* opens at opposite ends thereof and extends generally parallel to the fixation surface.

In the vicinity of the respective inner groove 60*g* in the socket body 60, a cut (not shown) is formed for allowing part of the pressing members 66 and 68.

The above-mentioned positioning member has the same structure as those 34 and 40 in the first embodiment.

The cover member 70 has an opening in a central region thereof for allowing the semiconductor device 76 or 82 to pass through the same during the attachment/detachment thereof. The cover member 70 is held to be movable upward and downward by the engagement of a plurality of legs thereof with the respective grooves formed on the outer circumference of the socket body 60. There are a plurality of coil springs 78 between the inner surface of the cover member 70 opposed to the positioning member and the socket body 60, for biasing the cover member 70 upward, i.e., in the direction for separating the cover member 70 from the positioning member. At this time, the cover member 70 is held at the uppermost position shown in FIG. 18A by the engagement of claws provided at tip ends of the legs of the cover member 70 with ends of the grooves.

At pair of opposite sides, the cover member 70 has arm sections 70H coupled to the proximal end sections of the pressing members 66 and 68 described later via connecting pins 72. The arm section 70H has a cut for receiving the proximal end sections of the pressing members 66 and 68. There is a relief 70R in the inner circumference of the cover member 70 connected to the upper end of the arm section 70H. On the other hand, the lower end of the arm section 70H is projected to the periphery of the outer surface of the socket body 60 and has a hole engaged with the connecting pin 72. The arm section 70H has a predetermined length as shown in FIGS. 18A and 18B. That is, the length is such that when the cover member 70 is at the uppermost position, the pressing members 66 and 68 connected thereto are in a holding state, and when the cover member 70 is at the lowermost position, the pressing members 66 and 68 connected thereto are away from the accommodating section for the semiconductor device to occupy the position in readiness as well as the pressing members 66 and 68 are retreated as a whole into the relief 70R.

Since the pressing members 66 and 68 have the same structure, the explanation will be made solely on the pressing member 66 and eliminated on the pressing member 68.

The pressing member 66 includes a proximal end section 66E having a hole into which the connecting pin is inserted, an touch portion 66T selectively in contact with the peripheral region of the semiconductor device 76 or 82, and a connecting section 66C for connecting the proximal end section 66E with the touch portion 66T.

The proximal end section 66E is supported for rotation at the lower end of the arm section 70H via the connecting pin 72. A guide pin 66P engaged with the inner groove 60*g* in a slidable manner is provided in the connecting section 66C. The guide pin 66P is at a position in the vicinity of an open end of the inner groove 60*g* as shown in FIG. 41A when the pressing member 66 is in a pressed state, and is at an intermediate position of the inner groove 60*g* as shown in FIG. 41B when the pressing member 66 is reversely stood at a position in readiness. At this time, the connecting section 66C and the touch portion 66T are waiting in the relief 70R.

Accordingly, when the operative force for pressing the cover member 70 downward from a position shown in FIG. 41A to a position shown in FIG. 41B is applied, the pressing member 66 rotates about the connecting pin 72 and inclines at a predetermined angle in the relief 70R directly beneath the frame portion of the cover member 70.

On the other hand, when the operative force becomes smaller than the predetermined value and the cover member 70 is released from the state shown in FIG. 41B, the cover member 70 returns to the original state due to the bias of the coil spring 78.

Thus, also in the seventh embodiment of the inventive semiconductor device socket, it is possible to selectively mount each of the semiconductor devices 76 and 82 having contour dimensions different from each other on the socket body 60 by fixing a proper positioning members onto the socket body 60 in accordance with the semiconductor devices 76 and 82 and carry out the predetermined tests. In this case, since constituent elements in the semiconductor device socket other than the positioning members are commonly usable and part of the pressing members 66 and 68 is bulged outward without being limited by the inner peripheral dimension of the socket body 70, it is possible to facilitate the rigidity of the pressing members 66 and 68. Also, since a distance between centers of the connecting pin 60g and the guide pin 66P is longer than that shown in FIG. 2, it is possible to further reduce the operative force for the cover member 70.

Figure 42:
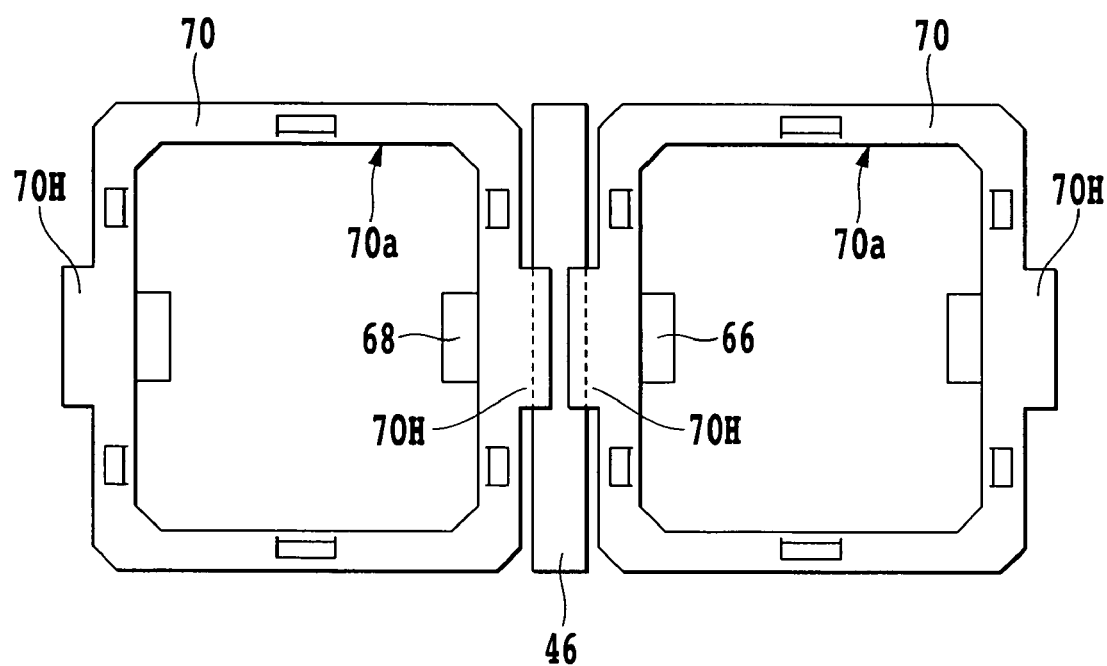
FIG. 42 is a plan view of a plurality of sockets for a semiconductor device shown in FIGS. 41A and 41B arranged parallel to each other.
Figure 43:
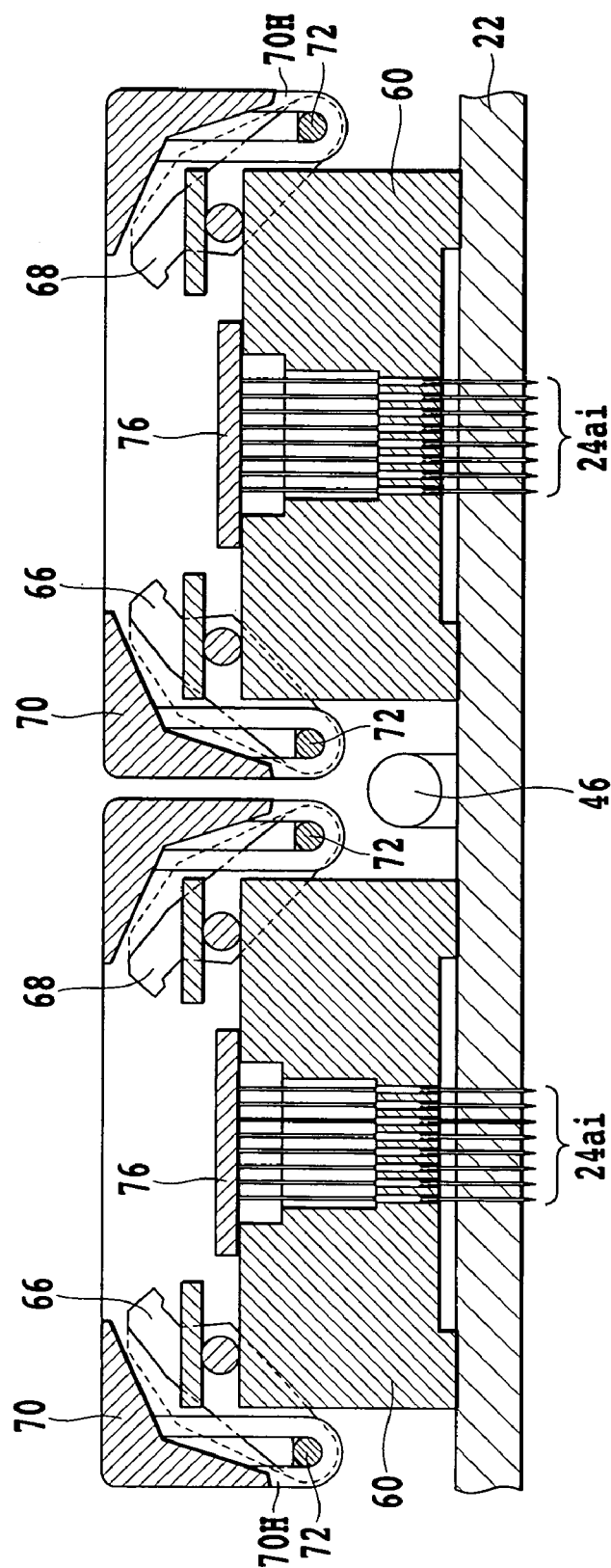
FIG. 43 is a sectional view of FIG. 42.

FIGS. 42 and 43 illustrate a state in which a plurality of the inventive semiconductor device sockets in the seventh embodiment described above are arranged on the printed wiring board 22. In this regard, in FIGS. 42 and 43, the same reference numerals are used for denoting the same constituent elements as in the embodiment shown in FIG. 1 and the explanation thereof will be eliminated. FIG. 43 shows a state in which the cover member is at the lowermost position.

As shown in FIG. 42, the adjacent semiconductor device sockets are arranged in one row at a predetermined pitch so that the pressing members 68 and 66 are opposite to each other. At this time, an electric part 46 such as a capacitor is disposed on the printed wiring board 22 in a space between the adjacent semiconductor device sockets. Accordingly, a dead space on the printed wiring board 22 is effectively usable.

Figures 44A, 44B:
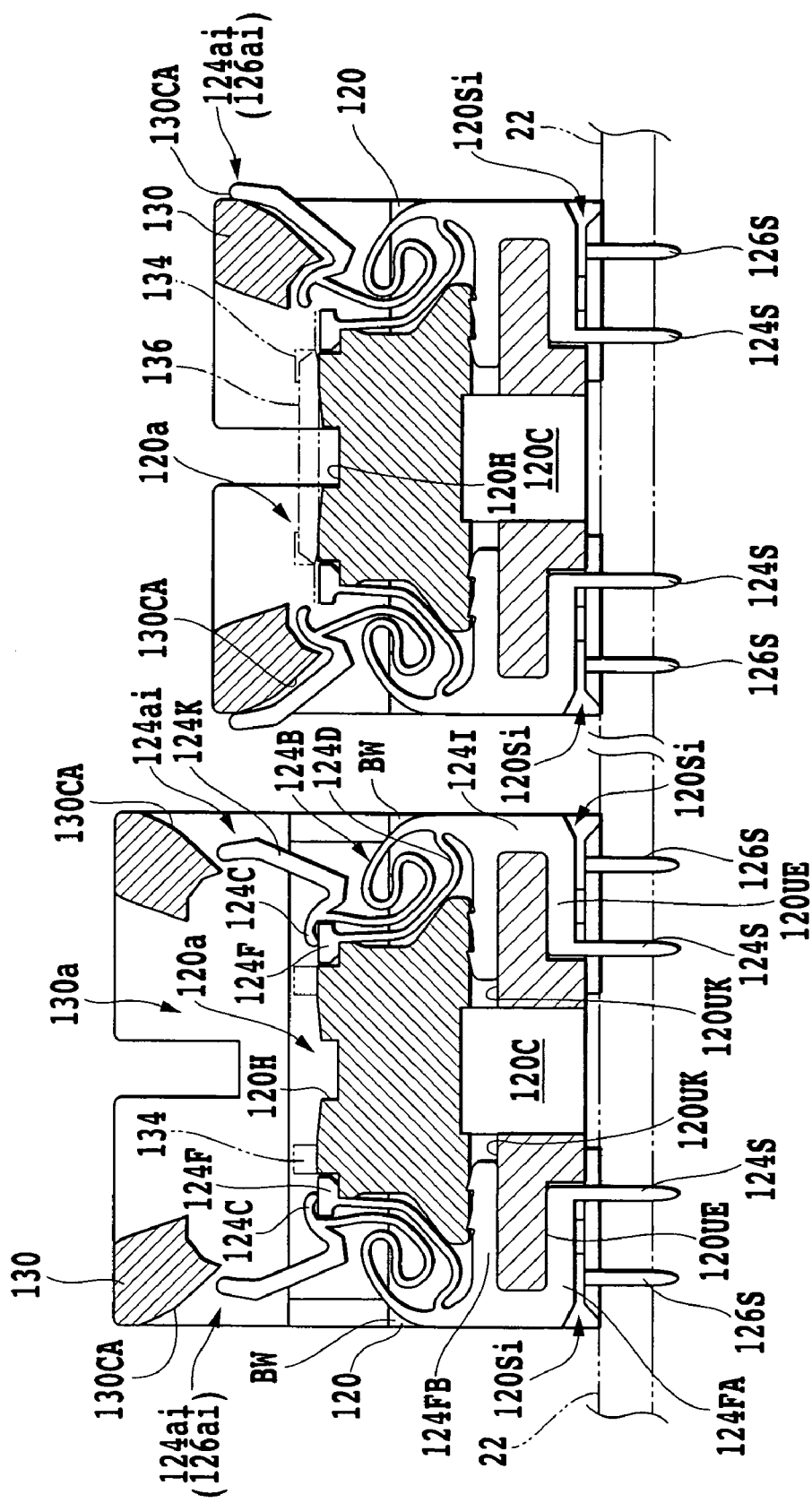
FIGS. 44A and 44B are sectional views, respectively, illustrating an eighth embodiment of the socket for a semiconductor device in accordance with the present invention.

FIGS. 44A and 44B illustrate an eighth embodiment of the inventive semiconductor device socket.

A plurality of semiconductor device sockets shown in FIGS. 44A and 44B are arranged at positions on the printed wiring board 22 in correspondence to the respective electroconductive layers. In FIGS. 44A and 44B, only one semiconductor device socket is shown as a representative.

The semiconductor device socket includes a socket body 120 fixed onto the printed wiring board 22, a plurality of contact terminals 124$ai$ (i=1 to n, n is a positive integer) arranged on opposite sides around a semiconductor device accommodating section 120$a$ in a central region of the socket body 120, for electrically connecting a semiconductor device 136 described later with the printed wiring board 22, a cover member 130 held by the socket body 120 to be movable upward and downward, for transmitting the operative force to an engaged end, positioning sections 134 held by the socket body 120 in a detachable manner, for accommodating the semiconductor element 136 and locating a group of terminals of the semiconductor element 136 to the contact terminals 124$ai$.

The semiconductor device accommodating section 120$a$ in the upper portion of the socket body 120 includes a flat surface on which a package of the semiconductor element 136 is placed, and the positioning sections 134 engageable with four corners of the mounted package of the semiconductor element 136. The flat surface is formed generally parallel to the surface of the printed wiring board 22 at the uppermost end of the socket body 120. The positioning sections 134 are formed at four positions on opposite ends of the flat surface. Thereby, when the package of the semiconductor element 136 is placed on the flat surface, the four corners of the package are engaged with the positioning sections 134 to locate the terminal group of the semiconductor element 136 to the contact terminals 124$ai$. The semiconductor element 136 has, for example, a package of SOP type.

Figure 45:
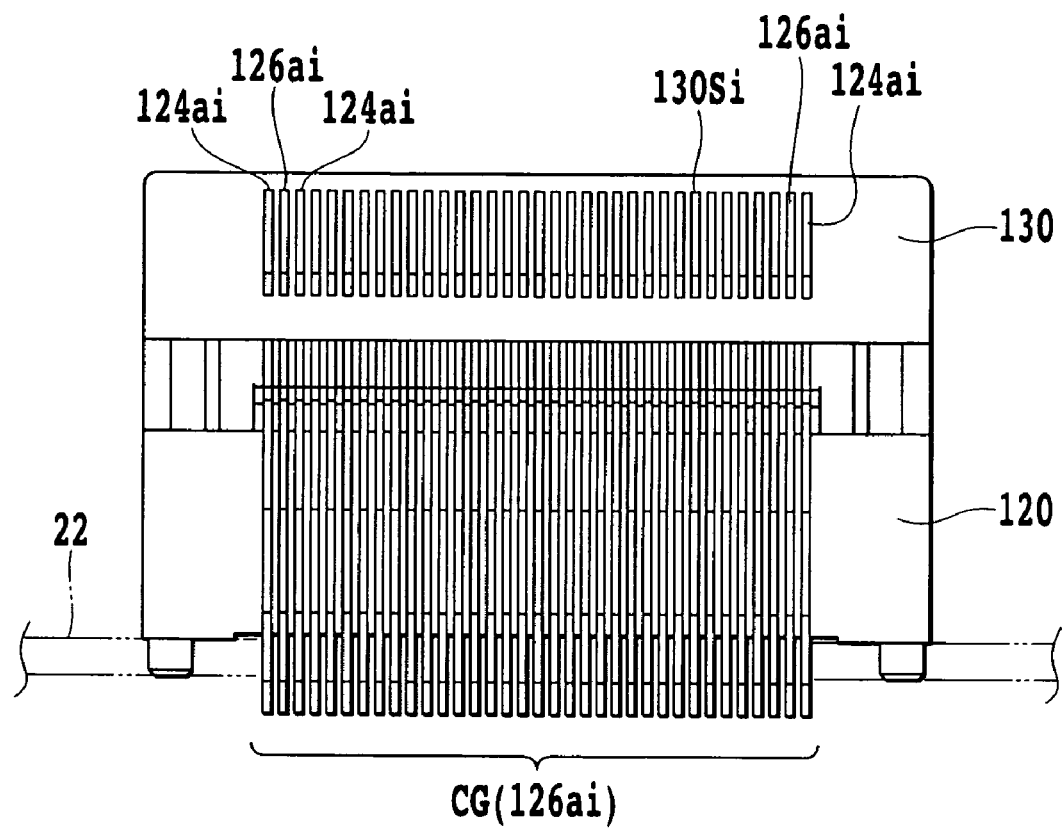
FIG. 45 is a side view of FIGS. 44A and 44B.

There is a vacant space between the positioning sections 134 opposite to each other in the direction generally vertical to the paper surface. As shown in FIGS. 44 and 45, on the respective side of the socket body 120, a plurality of slits 120Si (i=1 to n, n is a positive integer) are formed at a pitch. The respective slits 120Si are separated from each other by a partitioning wall BW. The number and the pitch of the slits 120Si are selected in accordance with those of the terminals of the semiconductor element 136. On the flat surface of the accommodating section 120$a$, one end of a bottomed circular bore 120H opens to outside. Beneath the bottomed bore 120H, a recess 120C is formed.

As shown in FIG. 1, a through-hole 120UK is formed in both walls between the respective slits 120Si and the recess 120C, into which is press-fit one of branches of one contact terminal in two kinds of contact terminals described later. Beneath the through-hole 120UK in the socket body 120, a recess 120UE is formed, into which is press-fit the other branch of the contact terminal.

On the other hand, in both walls between the other slit 120Si adjacent to the one slit 120Si and the recess 120C, a through-hole, in to which is press-fit a stationary piece of the other contact terminal in the two kinds of the respective contact terminal, is formed opposite to the through-hole 120UK. Beneath this through-hole in the socket body 120, a recess 120UE, into which is press-fit the other branch of the contact terminal, is formed opposite to the recess 120UE.

The through-hole 120UK extends generally in the vertical direction relative to a side surface of the socket body 120. A position of the through-hole 120UK relative to the surface of the printed wiring board 22 is the same as the relative position of the adjacent through-hole.

A distance between a surface of the recess 120UE opposite to the surface of the printed wiring board 22 and the surface of the printed wiring board 22 is selected to be equal to the corresponding distance in the above-mentioned adjacent recess 20. A distance from an inner surface of the recess 120UK extending in the direction generally vertical to the surface of the printed wiring board 22 to the outer peripheral surface of the socket body 120 is selected to be larger than the corresponding distance of the adjacent recess described above. Accordingly, the stationary terminal 126S of the contact terminal section 126$ai$ described later is located closer to the outer peripheral surface of the socket body 120 in comparison with the stationary terminal section 124S of the contact terminal 124$ai$, whereby the respective stationary terminal sections are arranged in a staggered manner in the direction vertical to the paper surface.

As shown in FIG. 45, a group CG of the contact terminals is formed by alternately arranging the contact terminal 124$ai$ (i=1 to n, n is a positive integer) with the contact terminal 126$ai$ (i=1 to n, n is a positive integer).

For example, the contact terminal 124$ai$ is made of a thin metallic sheet material, as shown in FIG. 44A, to have a stationary terminal section 124S soldered to the electrode section of the printed wiring board 22, a stationary section coupled to a proximal end of the stationary terminal section 124S, a curved section 124B coupled to a connecting section of the stationary section and having a contact 124C as a movable contact, and a curved section 124D having a stationary contact section 124F nipping the respective terminal of the semiconductor element 136 in association with the contact 124C. In this regard, FIG. 44A shows a state in which the contact 124C is in contact with the stationary contact section 124F. The contact terminals 124$ai$ are arranged in symmetry relative to a center axis of the socket body 120.

A proximal end of the stationary terminal 124S is formed at one end of the one branch 124FA of the stationary section to be integral therewith. The stationary section includes a branch 124FA inserted into a recess 120UE of the socket body 120 together with the stationary terminal section 120, and a connecting section 124I for coupling on end of the branch 124FA with one end of the branch 124FB.

The curved section 124B is of a generally S-shaped configuration as shown in the right contact terminal 124ai in FIG. 44A. One end of the curved section 124B is coupled to the connecting section 124I. At the other end of the curved section 124B, a engagement end section 124K to be selectively engaged with a cam surface 130CA of the cover member described later is formed.

A length of the engagement end section 124K is selected such that when the cam surface 130CA of the cover member 130 is lowered to a predetermined position as shown in FIG. 44B, a tip end thereof is projected from the slit of the cover member 130 described later and reaches the outer edge of the cover member 130 contiguous to the cam surface 130CA. The engagement end section 124K is formed such that when the cover member 130 is at the uppermost position, the extension of a tip end thereof intersects the cam surface CA.

In a portion of the curved section 124B closer to the connecting section 124I than the engagement end section 124K, the contact 124C is formed while being projected to the flat surface of the socket body 120 and the stationary contact section 124F.

One end of the curved section 124D having the stationary contact section 124F is coupled to be adjacent to one end of the curved section 124B in the slit 120Si. The elongate curved section 124D is arranged at a position in the slit 120Si inner than the curved section 124B. A contact surface of the stationary contact section 124F in contact with the contact 124C is located on the side surface of the socket body 120 so that it is generally in the same plane as the flat surface.

Accordingly, as shown in FIG. 44B, when the cam surface 130CA of the cover member 130 described later is lowered, the engagement end section 124K of the curved section 124B is away from the accommodating section 120*a* and the stationary contact section 124F by the cam surface 130CA, and the contact 124C is away from the flat surface of the socket body 120 to a position in readiness. On the other hand, when the cam surface 130CA is elevated, as shown in FIG. 44A, the engagement end section 124K of the curved section 124B approaches the accommodating section 120*a* while sliding on the cam surface 130CA and the contact 124C is closer to the flat surface of the socket body 120 and the stationary contact section 124F.

Accordingly, as shown in FIG. 44A, when the engagement end section 124K of the curved section 124B is disengaged from the cam surface 130CA of the cover member 130, the contact 124C is in contact with the flat surface of the socket body 120 or the terminal of the semiconductor element 136.

On the other hand, the contact terminal 126ai is made, for example, of a thin metallic sheet material to have a stationary terminal section 126S soldered to the electrode section of the printed wiring board 22, a stationary section coupled to a proximal end of the stationary terminal section 126S, and a curved section contiguous to the connecting portion of the stationary section and having a contact section as a movable contact.

Since the contact terminal 126ai has the same structure as that of the above-mentioned contact terminal 124ai except for the stationary terminal section 126S, the explanation of the common elements will be eliminated.

The proximal end of the stationary terminal section 126S is formed at an end of the one branch of the stationary section integral therewith. At this time, an axial length of the stationary terminal section 126S is equal to an axial length of the stationary terminal section 126S of the contact terminal 124ai. In this regard, a position of a proximal end of the stationary terminal section 126S is closer to a side surface of the socket body 120 in comparison with a position of a proximal end of the stationary terminal section 124S of the contact terminal 124ai.

Accordingly, also in the contact terminal 125ai, the same motion as the above-described motion of the contact terminal 124ai is carried out in accordance with the upward/downward motion of the cover member 130.

The frame-like cover member 130 has in a central region thereof an opening 130*a*. The opening 130*a* allows the semiconductor element 136 to pass through the same when the semiconductor element 136 is mounted to or removed from the accommodating section 120*a*. On the respective shorter side of the cover member 130, a pair of claws engageable with a groove (not shown) of the socket body 120 in a movable manner are projected toward the outer circumference of the socket body 120. The cover member 130 is biased in the direction away from the socket body 120 by coil springs provided between the cover member 130 and the socket body 120. In this regard, the cover member 130 is maintained at the uppermost position by the engagement of an end of the claw not shown with an end of the groove.

On the respective side of the cover member 130, a plurality of slits 130Si (i=1 to n, n is a positive integer) are formed at a predetermined pitch in correspondence to the engagement end sections of the curved sections of the contact terminals 124ai and the 126ai as shown in FIG. 45. At a lower end of the frame-like portion of the cover member 130 in which the slits 130Si are formed, a cam surface 130CA is formed along a longer side thereof.

When the semiconductor element 136 is subjected to a test under such a structure, a tip end of an arm of a work robot not shown is first brought into contact with the upper surface of the cover member 130 to push the cover member downward against the elastic force of the coil springs, the curved sections of the contact terminals 124ai and 126ai. Thereby, the contact terminals 124ai and 126ai disposed opposite to each other are away from the other to an open state. Also, the semiconductor element 136 to be tested may be conveyed to a position directly above the opening 130*a* of the cover member 130 while being sucked and held by a conveyor arm of a conveyor robot not shown.

Figure 46:
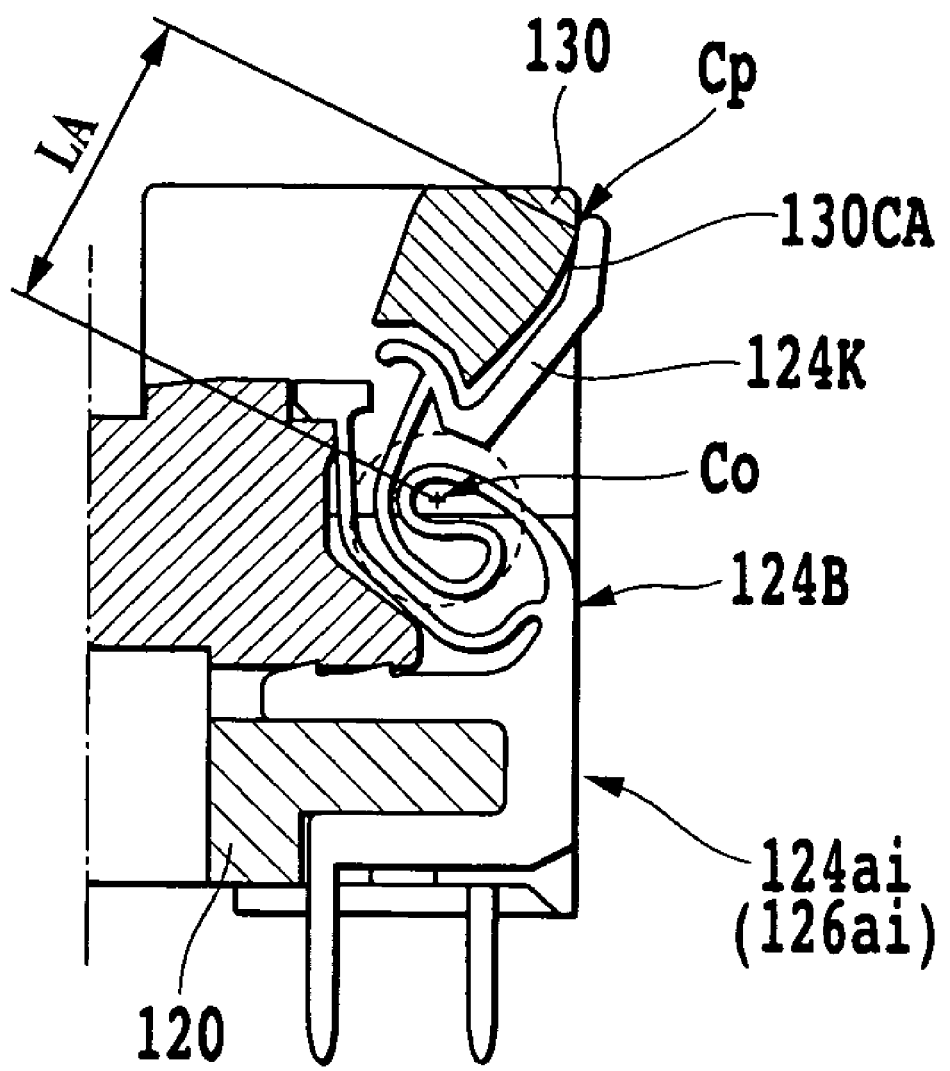
FIG. 46 is a sectional view partially of FIGS. 44A and 44B made available for explaining the operation thereof.

At this time, the operative force for descending the cover member 130 must be larger than a resultant force of individual pressures applied to contact points (points of application) at which tip ends of the engagement end sections are in contact with the cam surface 130CA of the cover member 130 when the tip end of the engagement end section in the contact terminals 124ai and 126ai is made to rotated in the clockwise direction as shown in FIG. 46. Since the pressure applied to the contact point (point of application) is the multiplication of a spring constant of the curved section of the contact terminals 124ai and 126ai with the displacement of the rotary angle, it is inversely proportional to a distance LA from the contact point Cp to the rotary center Co of the engagement end section in the curved section.

Figure 47:
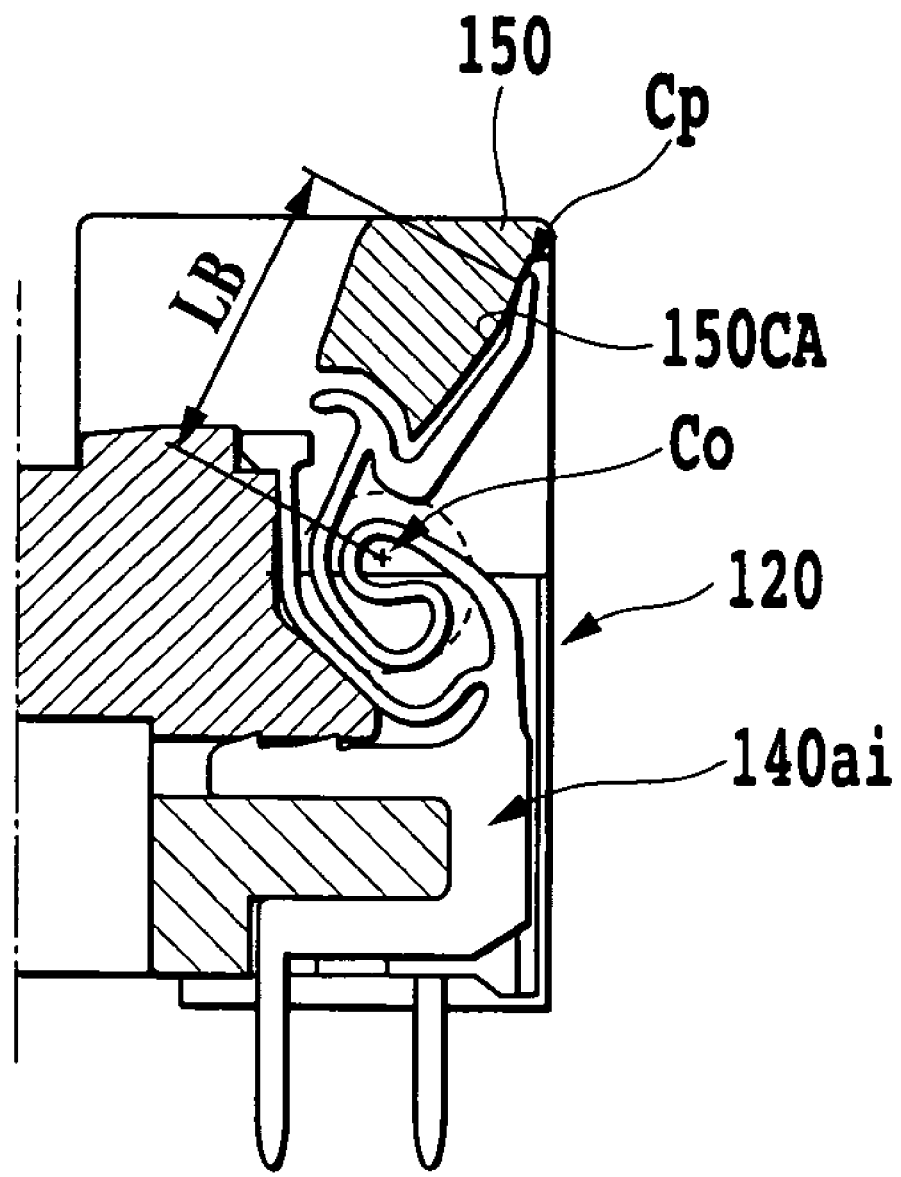
FIG. 47 is a sectional view partially of the prior art device relating to that shown in FIGS. 44A and 44B.

Accordingly, when the tip end of the engagement end section extends via the slit 130Si to the upper end of the cam surface 130CA of the cover member 130 to be projected outside, the distance LA is larger than a distance LB in a contact terminal 140*a* of the prior art apparatus shown in FIG. 47 corresponding thereto, and the operative force for descending the cover member 130 becomes smaller. In FIG. 47, a cam surface 150CA is formed at a lower end of a frame portion of a cover member along a longer side thereof. The contact terminals 140a thereof are arranged opposite to each other to be in a line symmetry relative to a center axis of the socket body 120.

Then, the semiconductor element 136 sucked and held by the conveyor arm is lowered through the opening 130a and positioned in the accommodating section 120a. Subsequently, the cover member 130 is elevated from the opening position to the uppermost position due to the bias of the coil springs when the tip end of the robot moves upward while being in contact with the upper surface of the cover member 130.

At this time, the contact terminals 124ai and 126ai are made to rotate generally at the same timing to nip the terminals of the semiconductor element 136 by the contacts 124C and the stationary contacts 124F.

When the inspection signal is input to the input/output section of the printed wiring board 22 while maintaining the cover member 130 at the uppermost position, this inspection signal is transmitted to the semiconductor element 136 via the contact terminals 124ai and 126ai. If the abnormality is detected in a circuit of the semiconductor element, the abnormality-detecting signal is issued from the semiconductor element 136 and fed to an external device for diagnosing faults via the input/output section.

When the test of the semiconductor element 136 has been finished, the tip end of the robot for removing the semiconductor element 136 and mounting a fresh semiconductor element 136 is in contact with the upper surface of the cover member 130 to push the same downward against the bias of the coil springs. The semiconductor element 136 thus tested is taken out by the conveyor arm, while the fresh semiconductor element 136 to be tested is mounted in the same manner as described above.

Figure 48:
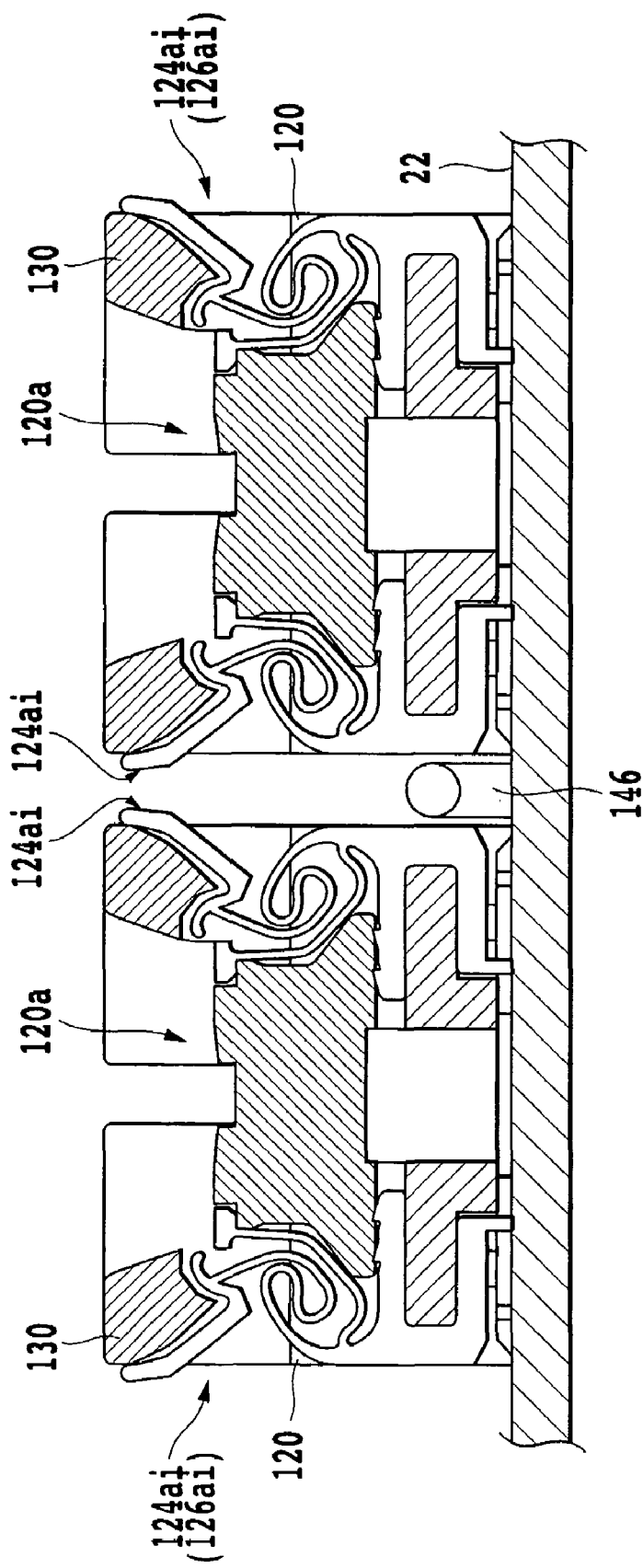
FIG. 48 is a sectional view showing a plurality of sockets for a semiconductor device shown in FIGS. 44A and 44B arranged parallel to each other.
Figure 49:
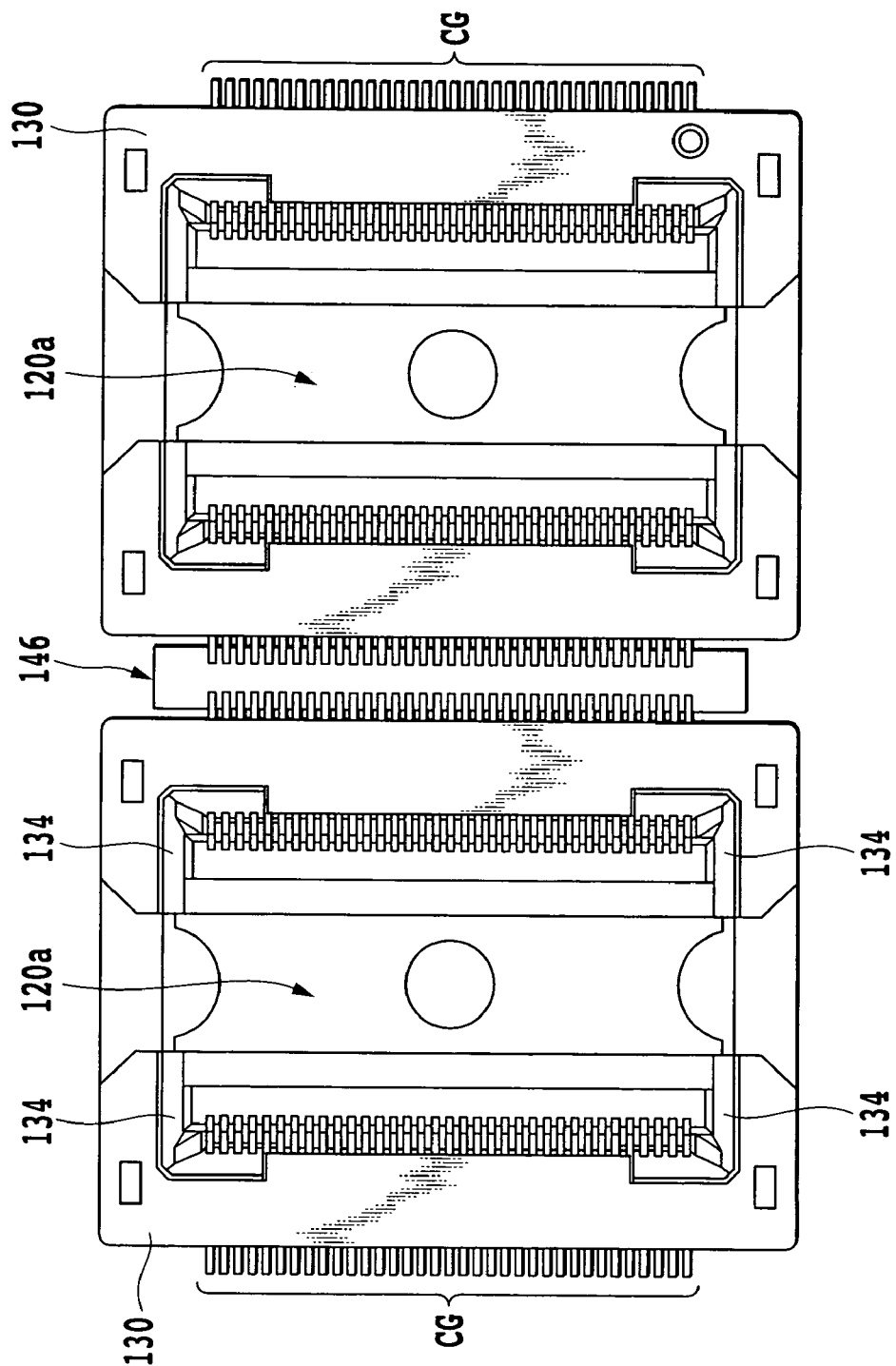
FIG. 49 is a plan view of FIG. 48.

FIGS. 48 and 49 illustrate a state in which a plurality of the above-mentioned inventive semiconductor device sockets of the eighth embodiment are arranged on the printed wiring board 22. In this regard, in FIGS. 48 and 49, the same constituent elements as those in the embodiment shown in FIGS. 44A and 44B are denoted by the same reference numerals and the explanation thereof will be eliminated. FIG. 48 shows a state in which the cover member 130 is at the lowermost position.

The adjacent semiconductor device sockets are arranged in one row at a predetermined pitch so that the engagement end sections in the curved sections of the contact terminals 124ai and 126ai of the respective semiconductor device sockets are close to each other via a gap. At this time, an electric part 146 such as a capacitor is disposed on the printed wiring board 22 in a space between the adjacent semiconductor device sockets. Accordingly, a dead space on the printed wiring board 22 is effectively usable.

Figure 50:
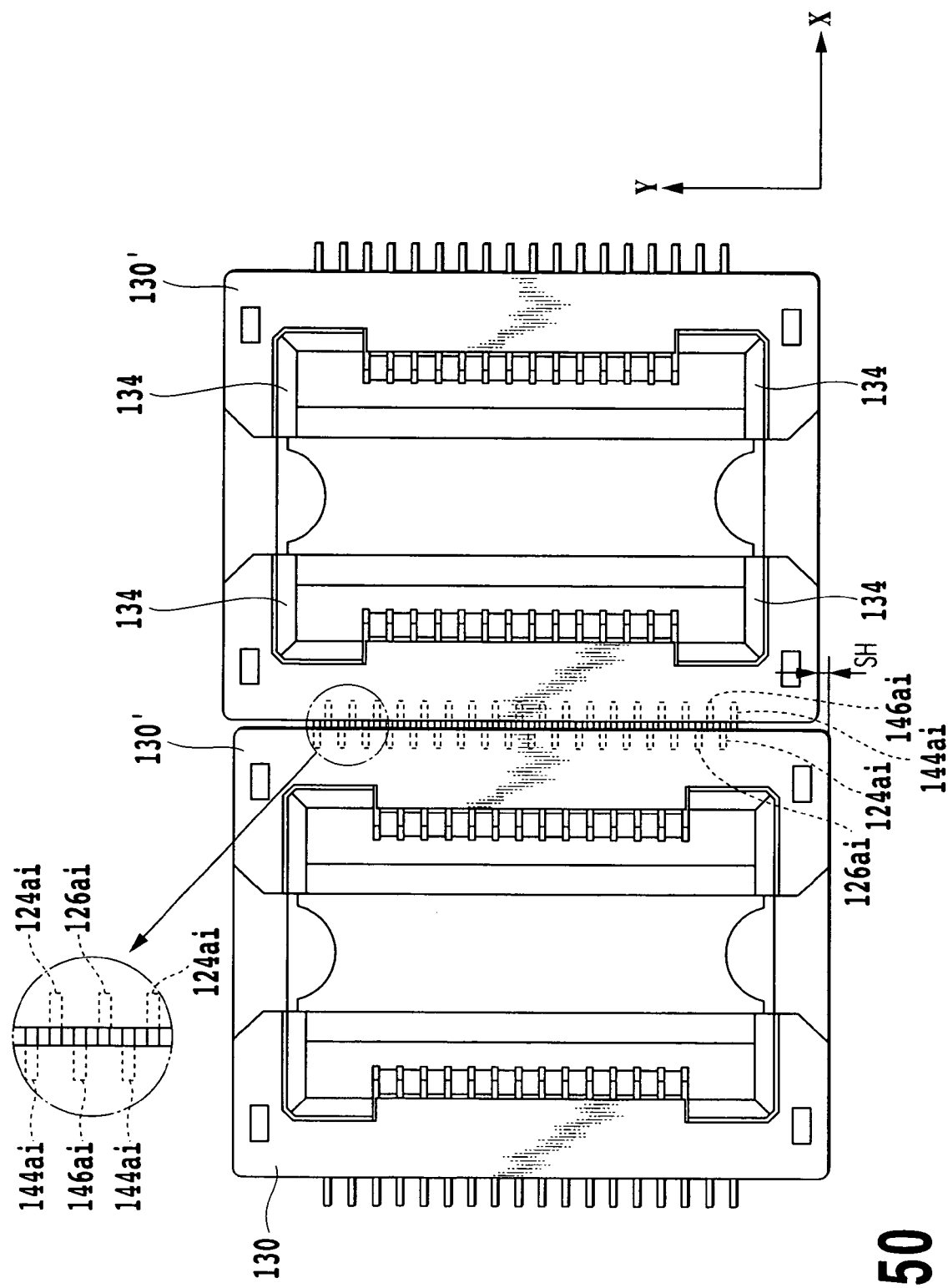
FIG. 50 is a sectional view of a ninth embodiment of the socket for a semiconductor device in accordance with the present invention.
Figure 51:
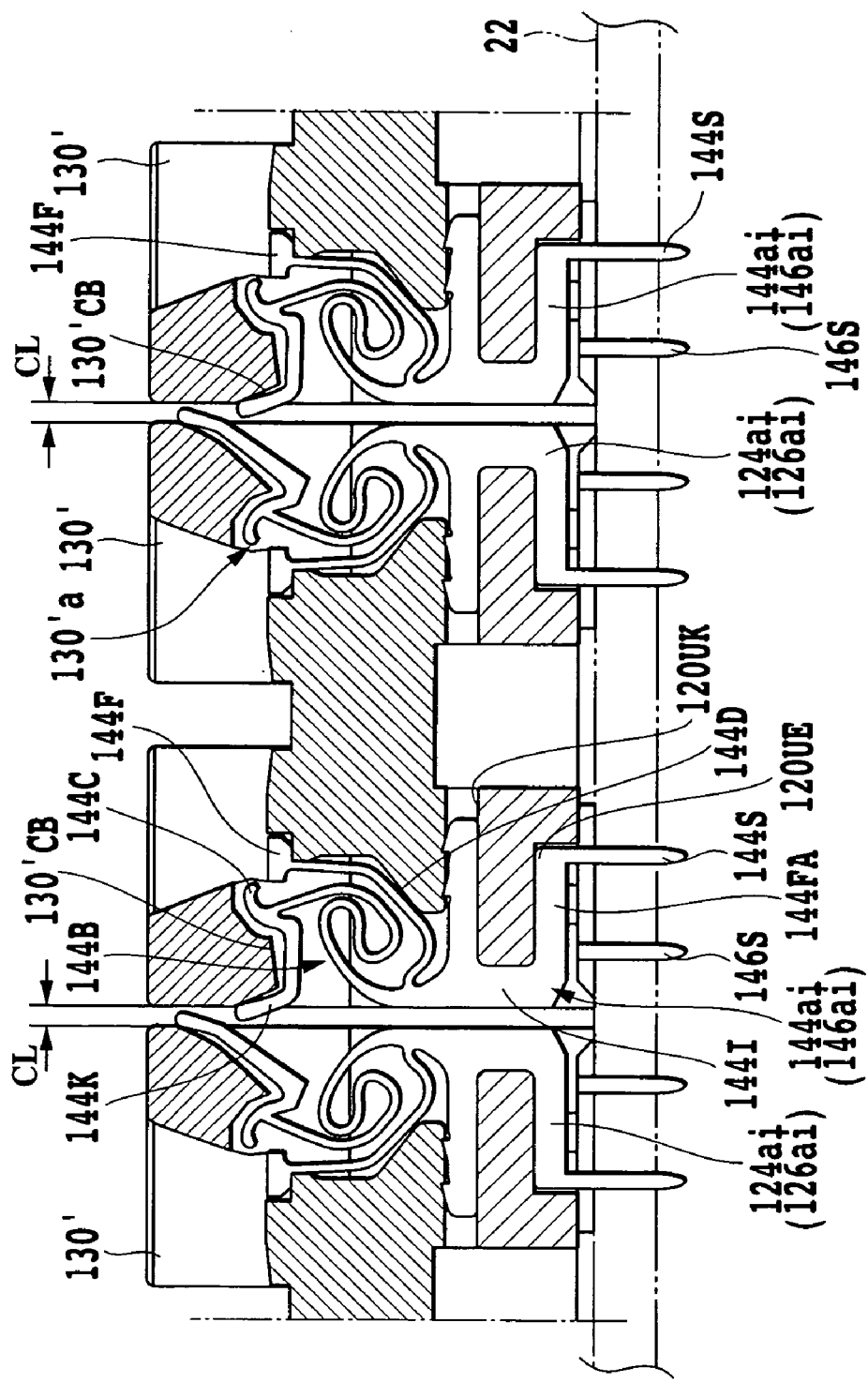
FIG. 51 is a sectional view showing a plurality of sockets for a semiconductor device shown in FIG. 50 arranged parallel to each other.

FIGS. 50 and 51 show a ninth embodiment of the inventive semiconductor device socket. In this regard, in FIGS. 50 and 51, the same reference numerals are used for denoting the same constituent elements and the explanation thereof will be eliminated.

While the contact terminals 124ai and 126ai are arranged in a line symmetry while interposing the accommodating section 120a in the embodiment shown in FIGS. 44A and 44B, a group containing the above-mentioned contact terminals 124ai and 126ai is disposed on the right side of the accommodating section 120a and a group containing contact terminals 144ai and 146ai having shapes different from the contact terminals 124ai and 126ai is disposed on the left side of the accommodating section 120a in the embodiment shown in FIGS. 50 and 51.

In FIGS. 50 and 51, a plurality of semiconductor device sockets are arranged parallel to each other at positions on the printed wiring board 22 corresponding to the respective electro-conductive layers between end surfaces on the longer side at a predetermined gap CL in the X-coordinate direction shown in FIG. 50 to be closer than the embodiment shown in FIG. 39. FIG. 51 shows a state in which the cover member 130 is at the lowermost position. Also, the adjacent semiconductor device sockets are deviated from each other by a predetermined dimension SH in the Y-coordinate direction vertical to the X-coordinate direction so that a position of the contact terminal 124ai in one semiconductor device socket is between the contact terminals 144ai and 146ai in the adjacent other semiconductor device socket. As a result, since a distance between a row of one semiconductor device sockets and the other semiconductor device sockets adjacent to the former becomes shorter, a dead space is minimized to realize the high-density mounting of the semiconductor device sockets.

As shown in FIG. 50, the contact terminal 144ai is arranged in alternate with the contact terminal 146ai (i=1 to n, n is a positive integer).

The contact terminal 144ai is made, for example, of a thin metallic sheet material to have a stationary terminal section 144S soldered to the electrode section of the printed wiring board 22, a stationary section coupled to the stationary terminal section 144S, a curved section 144B contiguous to the stationary section and having a contact 144C as a movable contact, and a curved section 144D having a stationary contact section 144F for nipping the respective contact of the above-mentioned semiconductor element 136 in association with the contact 144C. In this regard, FIG. 51 shows a state in which the contact 144C and the stationary contact section 144F are away from each other. The contact terminal 144ai is arranged to be in a line symmetry with the contact terminal 124ai relative to a center axis of the socket body 120.

A proximal end of the stationary terminal section 144S is formed at one end of one branch 144FA of the stationary section to be integral therewith. The stationary section includes a branch 144FA to be inserted together with the stationary terminal section 144S into a recess 120UE of the socket body 120, a branch 144FB to be press-fit into a through-hole 120UK of the socket body 120, and a connecting section 144I coupling one end of the branch 144FA to one end of the other branch 144FB.

The curved section 144B is of a generally S-shape as shown in FIG. 51 in the leftside contact terminal 144ai. One end of the curved section 144B is coupled to the connecting section 144I. An engagement end section 144K selectively engageable with a cam surface 130'CB of a cover member 130 described later is formed at the other end of the curved section 144B.

Figure 52:
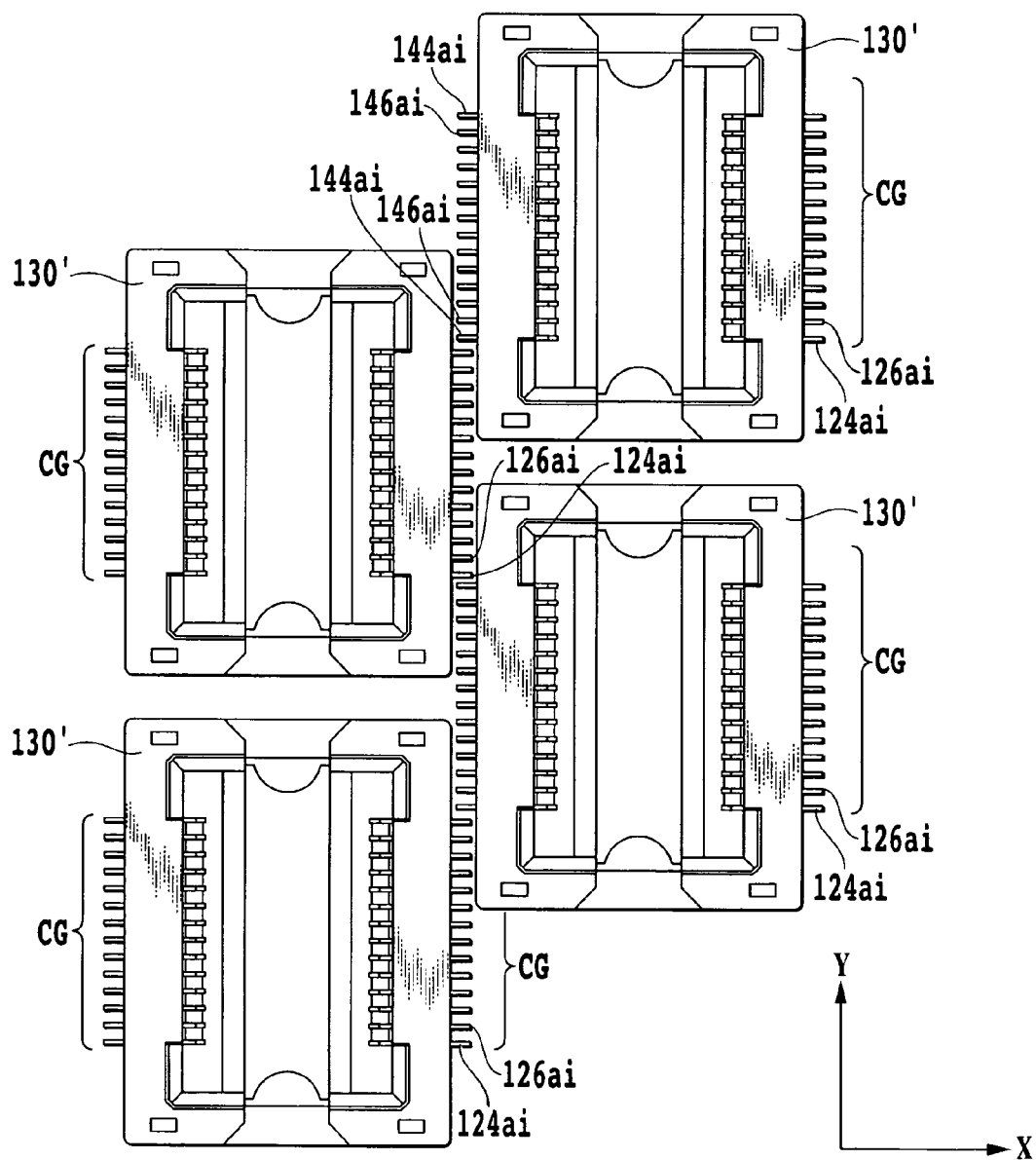
FIG. 52 is a plan view showing a plurality of sockets for a semiconductor device shown in FIG. 50 arranged in a staggered manner.

As shown in FIG. 51, a length of the engagement end section 144K is determined such that when the cam surface 130'CB of the cover member 130' is lowered to a predetermined position, a tip end thereof is projected outside from a slit of the cover member 130' described later and reaches the outer edge of the cover member 130' contiguous to the cam surface 130'CB. Also, a shape of the engagement end section 144K is different from a shape of the engagement end section 124K of the contact terminal 124ai so that an angle at which a proximal end thereof intersects the other end of the curved section 144B is larger than the corresponding angle in the engagement end section 124K. Accordingly, as shown in FIG. 52, when the cover member 130' is lowered to a predetermined position, a position of a tip end of the engagement end section 144K is lower in a gap CL than that of a tip end of the engagement end section 144K in the adjacent semiconductor device socket so as not to interfere with each other.

In a portion of the curved section 144B closer to the connecting section 144I than the engagement end section 144K, a contact 144C projected toward the flat surface of the socket body 120 and the stationary contact section 144F are formed.

One end of the curved section 144D having the stationary contact section 144F is adjacent to one end of the curved section 144B in the connecting section 144I and connected thereto. The elongate curved section 144D is disposed in the slit 120S at a position inner than the curved section 144B. A contact surface of the stationary contact section 144F with which is in contact the contact 144C is arranged on the side surface of the socket body 120 so that it is generally in the same plane as the flat surface.

Thereby, as shown in FIG. 51, when the cam surface 130'CB of the cover member 130' described later is lowered, the engagement end section 144K of the curved section 144B is separated from the accommodating section 120a and the stationary contact section 144F, while the contact 144C is separated from the flat surface of the socket body 120 to a position in readiness. On the other hand, when the cam surface 130'CB of the cover member 130' is elevated, the engagement end section 144K of the curved section 144B approaches the accommodating section 120a while sliding along the cam surface 130'CB, and the contact 144C approaches the flat surface of the socket body 120 and the stationary contact section 144F.

Accordingly, when the engagement end section 144K of the curved section 144B is not engaged with the cam surface 130'CB of the cover member 130', the contact 144C is in contact with the flat surface of the socket body 120 or the terminal of the semiconductor element 136.

On the other hand, the contact terminal 146ai is made of a thin metallic sheet material to have a stationary terminal section 146S soldered to the electrode section of the printed wiring board 22, a stationary section coupled to a proximal end of the stationary terminal section 146S, and a curved section coupled to a connecting portion of the stationary section and having a contact as a movable contact.

Since the contact terminal 146ai has the same constituent elements as the above-mentioned contact terminal 144ai except for the stationary terminal section 146S, the explanation of the common constituent elements will be eliminated.

A proximal end of the stationary terminal section 146S is formed at an end of one branch of the stationary section to be integral therewith. At this time, an axial length of the stationary terminal section 146S is equal to an axial length of the stationary terminal section 44S of the contact terminal 144ai. In this regard, a position of the proximal end of the stationary terminal section 146S in the stationary section is closer to a side surface of the socket body 120 in comparison with a position of the proximal end of the stationary terminal section 144S of the contact terminal 144ai.

Accordingly, also in the contact terminal 146ai, the same operation as that of the contact terminal 144ai described above is carried out in accordance with the upward and downward motion of the cover member 130'.

The frame-like cover member 130' has an opening 130'a in a central region thereof. The opening 130'a allows the semiconductor element 136 to pass through the same during the attachment/detachment of the semiconductor element 136 relative to the accommodating section 120a. On the respective shorter side of the cover member 130', a pair of claws engageable with a groove (not shown) in the socket body 120 in a movable manner are projected toward the outer circumference of the socket body 120. The cover member 130' is biased in the direction away from the socket body 120 by coil springs provided between the cover member 130' and the socket body 120. In this regard, the cover member 130' is maintained at the uppermost position by the engagement of ends of the claws not shown with an end of the groove.

On each of opposite sides of the cover member 130', a plurality of slits (not shown) are formed at a predetermined pitch in correspondence with the engagement end sections of the curved sections of the contact terminals 144ai and 146ai. At a lower end of the frame portion of the cover member 130' in which the slits are formed, a cam surface 130'CB is formed opposite to the cam surface 130'CA along a longer side.

In this structure, when the test of the semiconductor element 136 is carried out, a tip end of an arm of a work robot not shown is in contact with the upper surface of the cover member 130' to move the cover member 130' upward and downward so that the semiconductor element 136 is mounted to and detached from the accommodating section 120a.

In the embodiment shown in the above-described FIG. 50, the adjacent semiconductor device sockets are deviated from each other by a predetermined dimension SH in the Y-coordinate direction vertical to the X-coordinate direction so that a position of the contact terminal 124ai in one semiconductor device socket is between the contact terminals 144ai and 146ai in the adjacent other semiconductor device socket.

However, this is not indispensable, but as shown in FIG. 52, one contact terminal group CG containing contact terminals 144ai and 146ai in one semiconductor device socket in one row arranged in the Y coordinate direction is disposed in a staggered manner between two contact terminal groups CG containing contact terminals 124ai and 126ai in two semiconductor device sockets in the other row arranged adjacent to the one row in parallel thereto.

Figure 53:
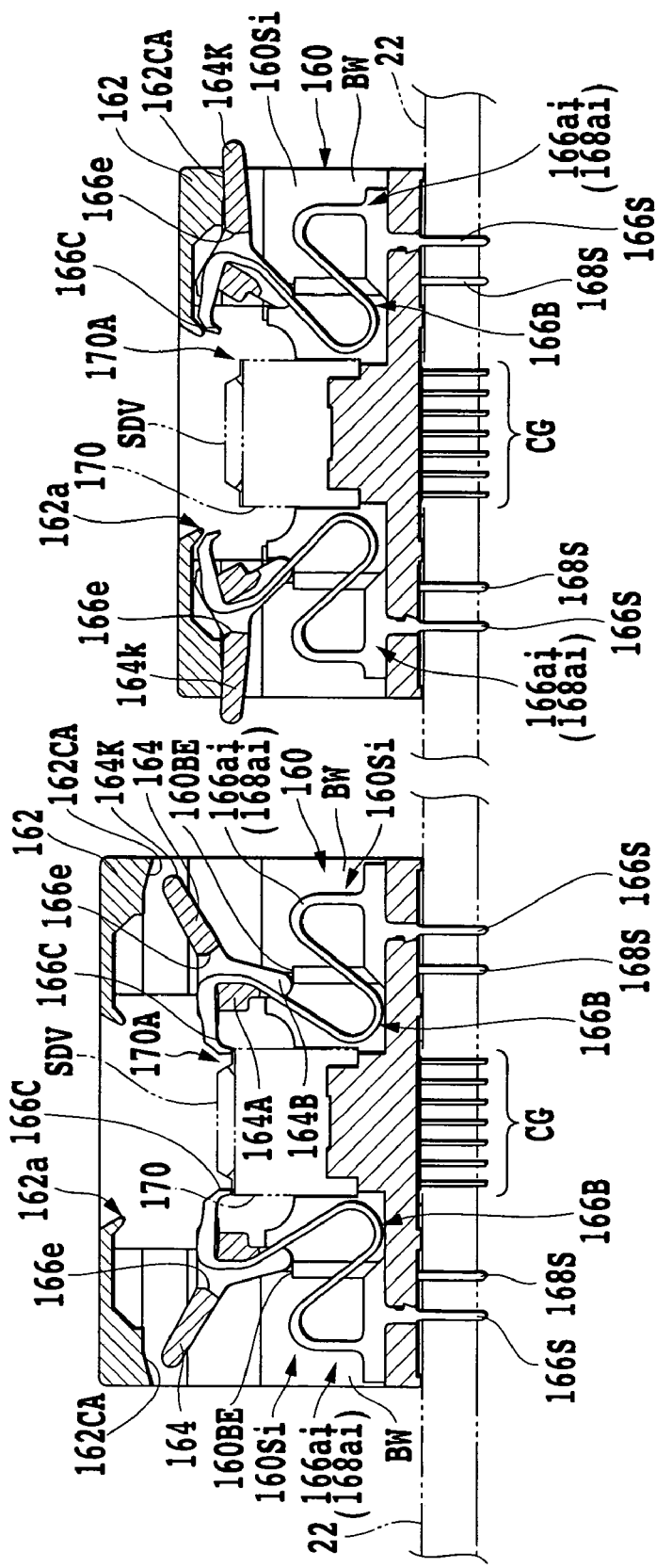
FIGS. 53A and 53B are sectional views, respectively, illustrating a tenth embodiment of the socket for a semiconductor device in accordance with the present invention.

FIGS. 53A and 53B illustrate a tenth embodiment of the inventive semiconductor device socket.

A plurality of the semiconductor device sockets shown in FIGS. 53A and 53B are arranged on the printed wiring board 22 at positions corresponding to the respective electro-conductive layers. In FIGS. 53A and 53B, only one semiconductor device socket is shown as a representative.

The semiconductor device socket includes a socket body 160 to be fixed onto the printed wiring board 22, a contact terminal group CG consisting of a plurality of contact terminals 166ai and 168ai (i=1 to n, n is a positive integer) arranged opposite four sides around a semiconductor device accommodating section 160a in a central region of the socket body 160, for electrically connecting a semiconductor element SDV described later to the printed wiring board 22, a cover member 162 held by the socket body 160 to be movable upward and downward, for transmitting an operative force to a lever mechanism described later, a positioning section 170 held by the socket body 160 in a detachable manner, for accommodating the semiconductor element SDV and locating the terminal group of the semiconductor element SDV to the contact terminals 166ai and 168ai.

Figure 24:
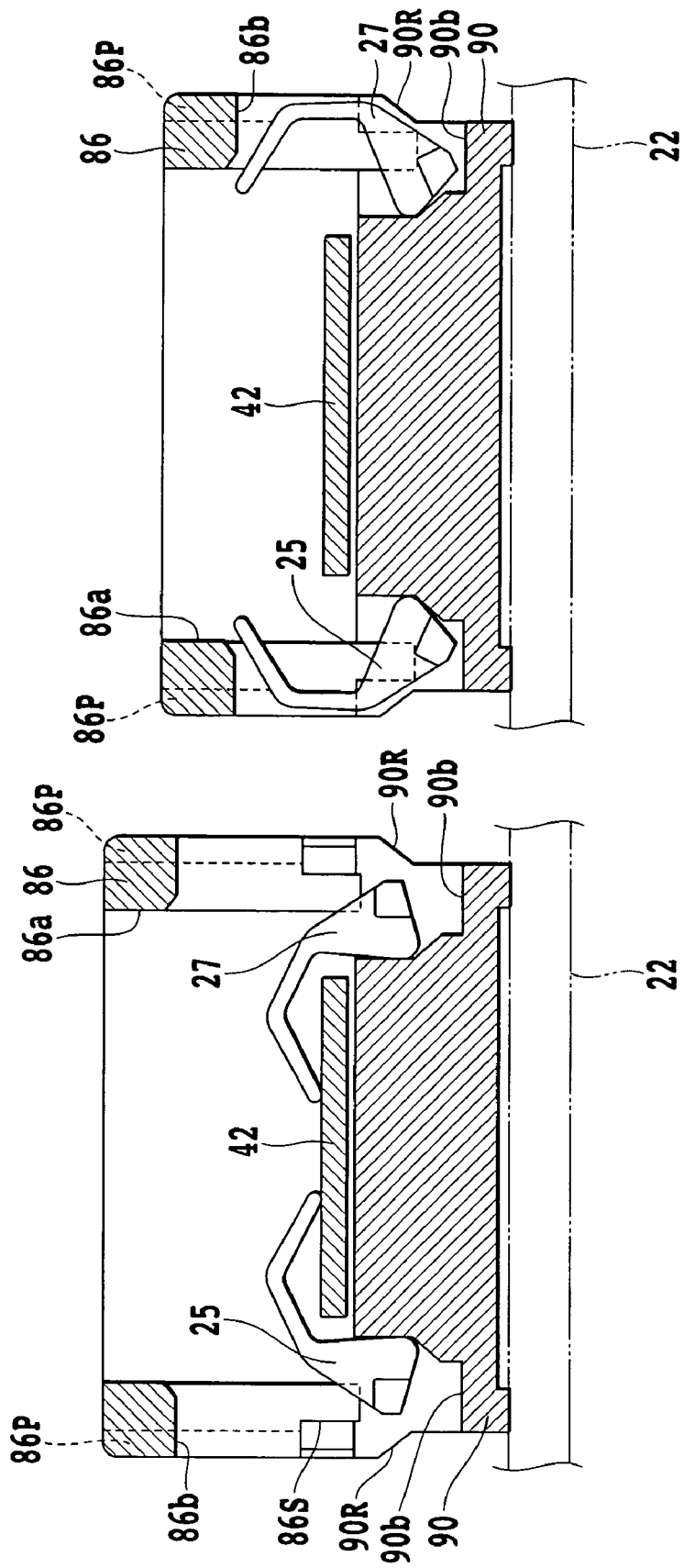
FIGS. 24A and 24B are sectional views, respectively, schematically illustrating a important part of a fourth embodiment of the socket for a semiconductor device in accordance with the present invention.

On the outer circumference of the respective side in the socket body 160, as shown in FIG. 24, two elongate grooves 160G are formed parallel to each other and generally vertical to the surface of the printed wiring board 22. A claw of the cover member 162 described later is engaged with the respective groove 160G in a slidable manner.

In a central region of the socket body 160, the positioning section 170 is formed, having an accommodating section 170A for accommodating the semiconductor element SDV to be tested.

Figure 54:
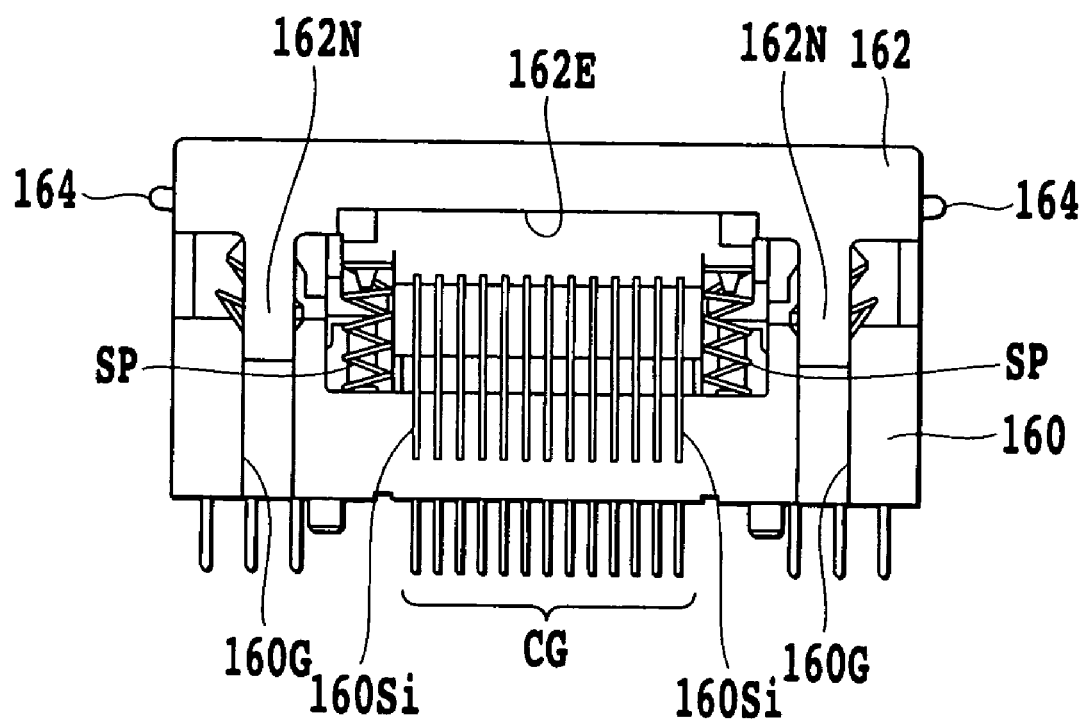
FIG. 54 is a side view of FIGS. 53A and 53B.

As shown in FIGS. 53A and 54, in the respective side wall of the socket body 160 encircling the positioning section 170, slits 160Si (i=1 to n, n is a positive integer) are formed at a predetermined pitch. The respective slits 160Si adjacent to each other are separated from each other by a partitioning wall BW. The respective slits 160Si are formed in correspondence to terminals of the semiconductor element SDV mounted to the accommodating section 170A in the positioning section 170. The number and the pitch of the slits 160Si are determined in accordance with those of the terminals of the semiconductor element SDV. Accordingly, the terminals of the semiconductor element SDV are positioned to the contact sections of the contact terminals described later.

The semiconductor element SDV has, for example, a package of QFP type.

In a contact terminal fixing section in the respective slit 150Si, the contact terminal 166ai and 168ai forming the contact terminal group CG are alternately arranged.

The contact terminal groups CG are provided at four positions in correspondence to the respective sides of the positioning section 170 while encircling the positioning section 170.

The contact terminal 166ai is made, for example, of a thin metallic sheet material to have, as shown in FIG. 53A, a stationary terminal section 166S to be soldered to the electrode section of the printed wiring board 22, a stationary section coupled to an proximal end of the stationary terminal section 166S, and a curved section 166B contiguous to the stationary section and provided at a tip end thereof with a contact 166C as a movable contact.

A proximal end of the stationary terminal section 166S is formed at a position farther from the outer surface of the socket body 160 than a portion of the stationary section to which the curved section 166B is connected. A proximal end of the stationary terminal section 166S is press-fit into a hole provided in the contact terminal section. This hole is formed so that the center axis thereof is vertical to the surface of the printed wiring board 22.

As shown in FIG. 53A, the curved section 166B extends in the vertical direction from the proximal end connected to the stationary section, and then bends generally in a U-shape toward the contact terminal fixing section to the vicinity the positioning section 170.

The contact terminal 168ai is made, for example, of a thin metallic sheet material to have, as shown in FIG. 53A, the same structure as in the contact terminal 166ai, except for a position of the stationary terminal section 168S. A position of a proximal portion of the stationary terminal section 168S is father from the outer surface of the socket body 160 in comparison with a position of the proximal portion of the stationary terminal section 166S in the contact terminal 166ai.

The lever mechanism includes a lever member 164 held for rotation by each of four bearings 160BE provided at four position around the positioning section 170.

The lever member 164 includes a proximal portion 164B engaged for rotation with a generally arcuate bearing surface in the bearing 160BE, an engagement end section 164K, one end of which is formed integral with the proximal portion and in contact with the cam surface of the cover member 162 as well as rotating thereby, and an arm 164A engaged with a bending portion of the curved section of the contact terminal 166ai and 168ai.

The proximal portion 164B has an arcuate lower end supported by a generally arcuate bearing surface in the bearing 160BE. Also, the proximal portion 164B has an opening 166e between the engagement end section 164K and the arm section 164A, into which a bending portion of the curved section in contact terminal 166ai and 168ai is inserted.

The arm section 164A extends generally in the vertical direction to the paper surface while maintaining the same width as that of the engagement end section 164K. The engagement end section 164K is formed to intersect the proximal portion 164B at a predetermined angle. Also, a tip end of the engagement end section 164K is inclined upward so that an extending line thereof intersects the cover member 162. A projected length of the engagement end section 164K from the proximal portion 164B is selected, as shown in FIG. 53B, so that when the cover member 162 is lowered to a predetermined position, a tip end of the engagement end section 164K is projected from the outer circumference of the cover member 162 and the socket body 160 at a predetermined dimension.

Thereby, as shown in FIG. 53B, when the cam surface 162CA of the cover member 162 described later is lowered, the engagement end section 164K of the lever member 164 is made to rotate to move away from the accommodating section 170A by the cam surface 162CA. The contact portion 166C is gone away from the outer edge of the accommodating section 170A to move to a position in readiness. On the other hand, when the cam surface 162CA of the cover member 162 is elevated, as shown in FIG. 53A, the engagement end section 164K of the lever member 164 approaches the accommodating section 170A while sliding along the cam surface 162CA, and the contact 166C approaches the periphery of the accommodating section 170A.

Accordingly, as shown in FIG. 53A, when the engagement end section 166K of the lever member 166 is disengaged from the cam surface 162CA of the cover member 162, the contact 166C is in contact with the periphery of the accommodating section 170A or the terminal of the semiconductor element 136.

Also in the engagement end section of the contact terminal 168ai, the same operation as in the above-mentioned contact terminal 166ai is carried out in accordance with the upward and downward motion of the cover member 162.

The frame-like cover member 162 has an opening 162a in a central region thereof. The opening 162a allows the semiconductor element SDV to pass through the same when the semiconductor element is mounted to or removed from the accommodating section 170A. On the respective side of the cover member 162, a pair of claws 162N engageable with a groove 160G of the socket body 160 in a movable manner are projected toward the outer circumference of the socket body 160, as shown in FIG. 54. The cover member 162 is biased in the direction away from the socket body 160 by coil springs provided between the cover member 162 and the socket body 160. In this regard, the cover member 162 is maintained at the uppermost position by the engagement of an end of the claw 162N with an end of the groove 160G.

As shown in FIG. 54, on the respective side of the cover member 162, a cut 162E is formed in correspondence to the engagement end section 164K of the lever member 162. At a lower end of the frame portion of the cover member 162 forming the respective cuts 162E, the cam surface 162CA is formed. On the periphery of the opening 162a, four reliefs contiguous to the cam surface 162CA are formed. As shown in FIG. 53B, in the respective relief, part of the lever member 164 and a tip end portion of the contact terminals 166ai and 168ai are present when the cover member 162 is lowered to the predetermined position.

When the test of the semiconductor element SDV is carried out under such a condition, a tip end of an arm of a work robot not shown is initially in contact with the upper surface of the cover member 162 to push the latter downward against the bias of the coil springs SP described above and the curved sections of the contact terminals 166ai and 168ai. Thus, the contact terminals 166ai and 168ai disposed around the accommodating section 170A are away from the lever member 164 to be an open state. Then, the semiconductor element SDV to be tested is sucked and held by a conveyor arm of a conveyor robot not shown, and transported to a position directly above the opening 162a of the cover member 162.

Figure 66:
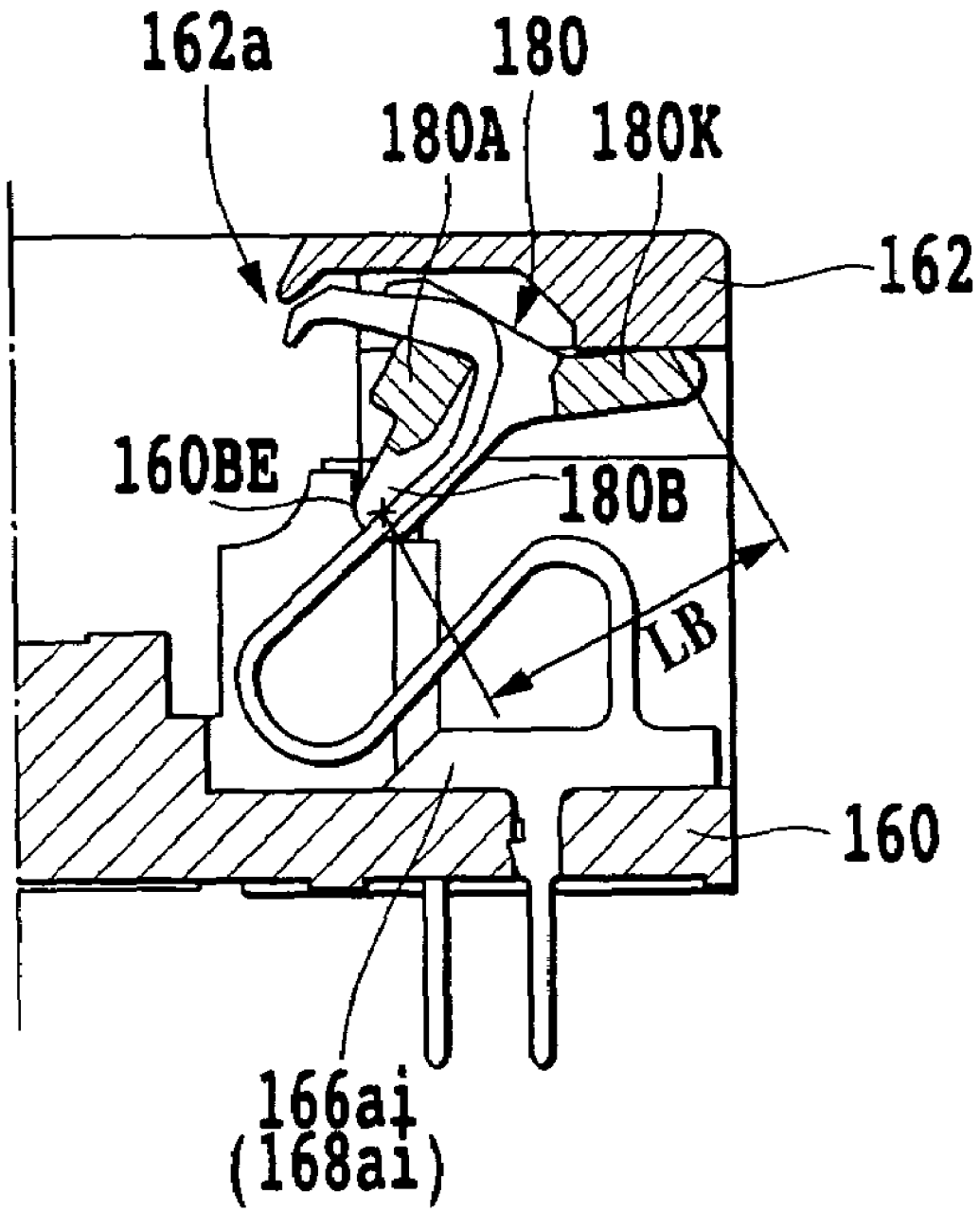
FIG. 66 is a sectional view partially of the prior art apparatus relating to the embodiment shown in FIGS. 53A and 53B.
Figure 67:
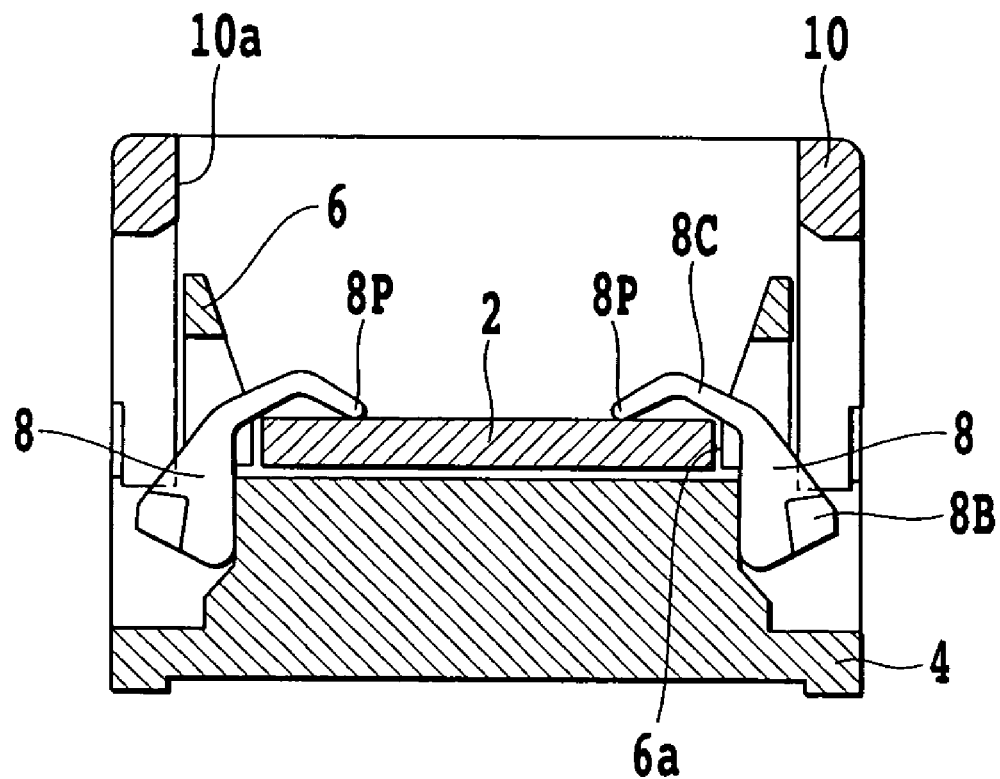
FIG. 67 is an illustration made available for explaining the structure and the operation of a important part of the prior art socket for a semiconductor device.

At this time, part of the engagement end section 164K of the lever member 164 is projected outward from a state retreated inside shown in FIG. 53A. The operative force to lower the cover member 162 must be larger than a resultant force of pressures applied to contact points (points of application) at which tip ends of the engagement end sections 164K of the lever members 164 are brought into contact with the cam surface 162CA of the cover member 162 when the contact 166C of the contact terminal 166ai and a tip end of the lever member 164 are made to rotate in the clockwise direction. Since the pressure applied to the contact point (point of application) is the multiplication of a spring constant of the curved section of the contact terminals 166ai and 168ai with the displacement of the rotary angle, it is inversely proportional to a distance LA from the contact point Cp to the rotary center Co of the proximal portion 164B of the lever member 164. Accordingly, by extending the length of the engagement end section 164K of the lever member 164 until the tip end thereof is projected outside via the cut 162E, the distance LA becomes longer than the corresponding distance LB of the lever member 180 in the conventional apparatus as shown in FIG. 66, whereby the operative force for descending the cover member 162 is reduced in comparison with the conventional apparatus. The lever member 180 includes a proximal portion 180B engaged in a rotatable manner with a generally arcuate bearing surface in the bearing section 160BE, an engagement end section 180K formed integral with the proximal portion at one end and brought into contact in a rotatable manner with the cam surface of the cover member 162, and an arm section 180A engaged with the curved sections 166B of the contact terminals 166ai and 168ai.

Next, the semiconductor element SDV sucked and held by the conveyor arm is lowered through the opening 162a of the cover member 162, and positioned and mounted to the accommodating section 170A. Subsequently, the cover member 162 is elevated while the tip end of an arm of the work robot is in contact with the upper surface of the cover member 162, and reaches to the uppermost position from the opened position due to the bias of the coil springs SP and the recovery force of the contact terminals 180ai and 182ai.

At this time, the contact terminals 166ai and 168ai are made to rotate generally at the same timing to press the terminals of the semiconductor element SDV by the contacts 166C.

When an inspection signal is input into the input/output section of the printed wiring board 22 while maintaining the cover member 162 at the uppermost position, the inspection signal is fed to the semiconductor element SDV via the contact terminals 166ai and 168ai. When the abnormality is detected in a circuit thereof, an abnormality-detecting signal issued from the semiconductor element SDV is fed to an external device for diagnosing faults via the input/output section.

When the test of the semiconductor element SDV has finished, the tip end of the arm of the work robot is brought into contact with the upper surface of the cover member 162 in the same manner as described before and pushes the cover member downward against the bias of the coil springs SP for the purpose of removing the semiconductor element SDV and mounting a fresh semiconductor element SDV. The tested semiconductor element SDV is taken out by the conveyor arm and the fresh semiconductor element SDV to be tested is mounted as described above.

Figure 56:
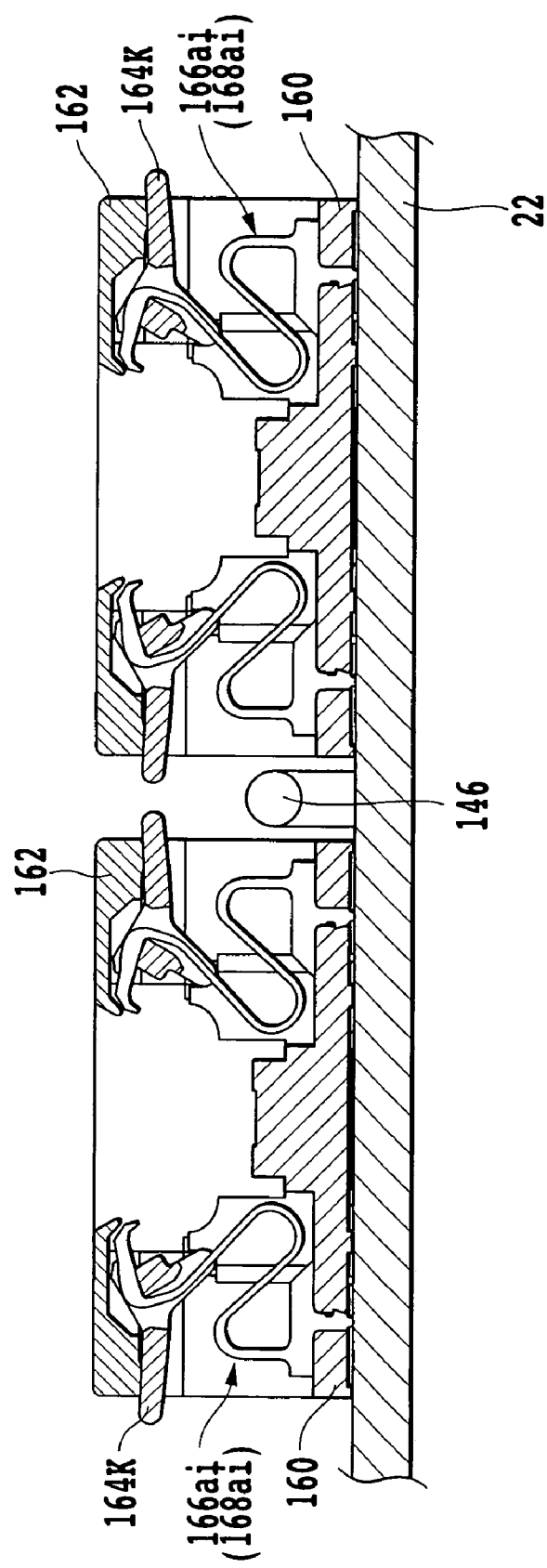
FIG. 56 is a sectional view of a plurality of sockets for a semiconductor device shown in FIGS. 53A and 53B arranged parallel to each other.
Figure 57:
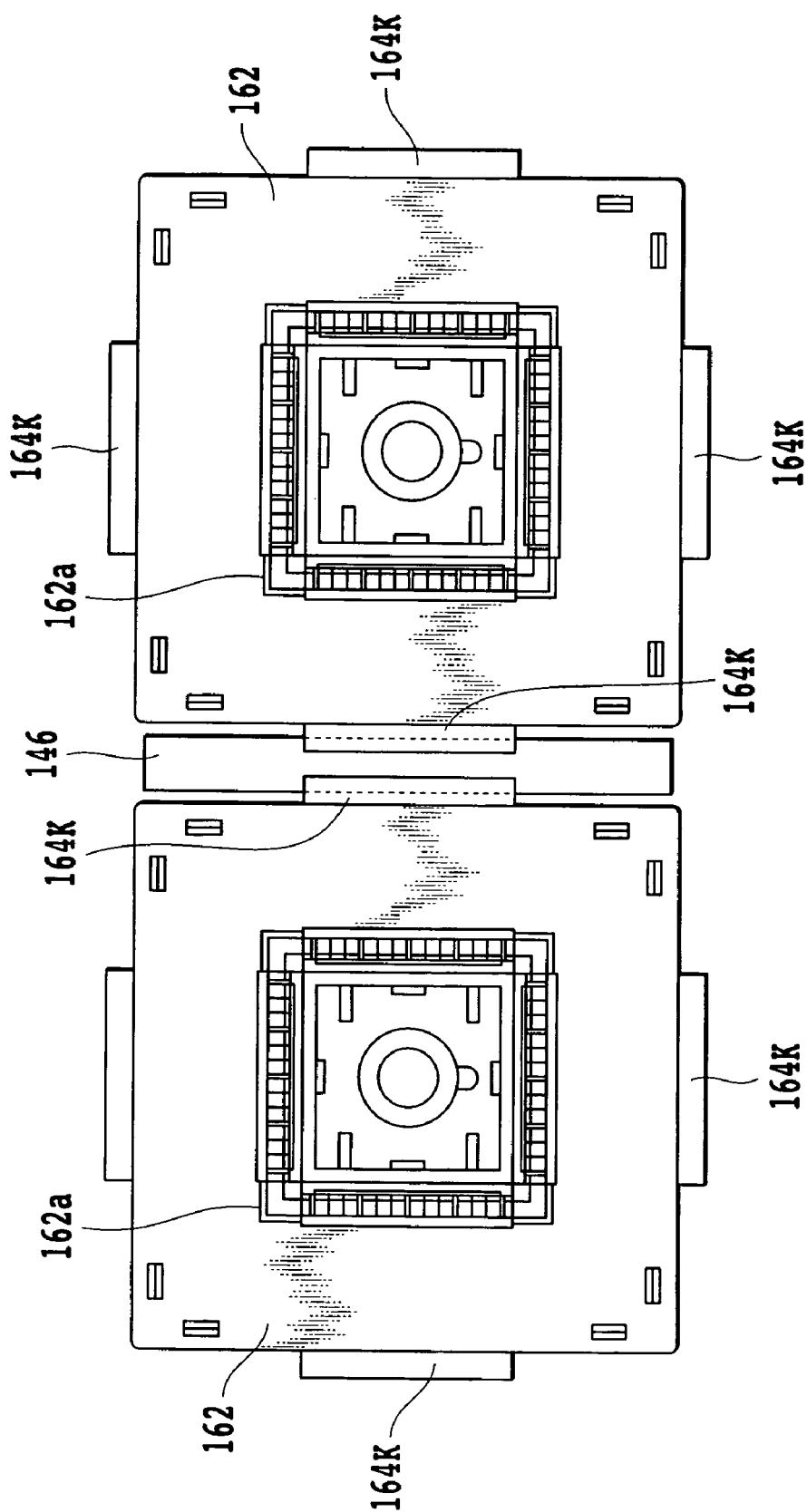
FIG. 57 is a plan view of FIG. 56.

FIGS. 56 and 57 shows a state in which a plurality of the inventive semiconductor device sockets of the tenth embodiment described above are arranged on the printed wiring board 22. In this regard, in FIGS. 56 and 57, the same constituent elements as in FIGS. 53A and 53B are denoted by the same reference numerals and the explanation thereof will be eliminated. FIG. 56 shows a state in which the cover member 162 is at the lowermost position.

The adjacent semiconductor device sockets are arranged in one row at a predetermined gap as shown in FIGS. 56 and 57 so that the engagement end sections 164K of the lever members 164 in the respective semiconductor device sockets are close to each other via the gap. At this time, an electric part 146 such as a capacitor is disposed on the printed wiring board 22 in a space between the adjacent semiconductor device sockets. Accordingly, a dead space on the printed wiring board 22 is effectively usable.

Figure 58:
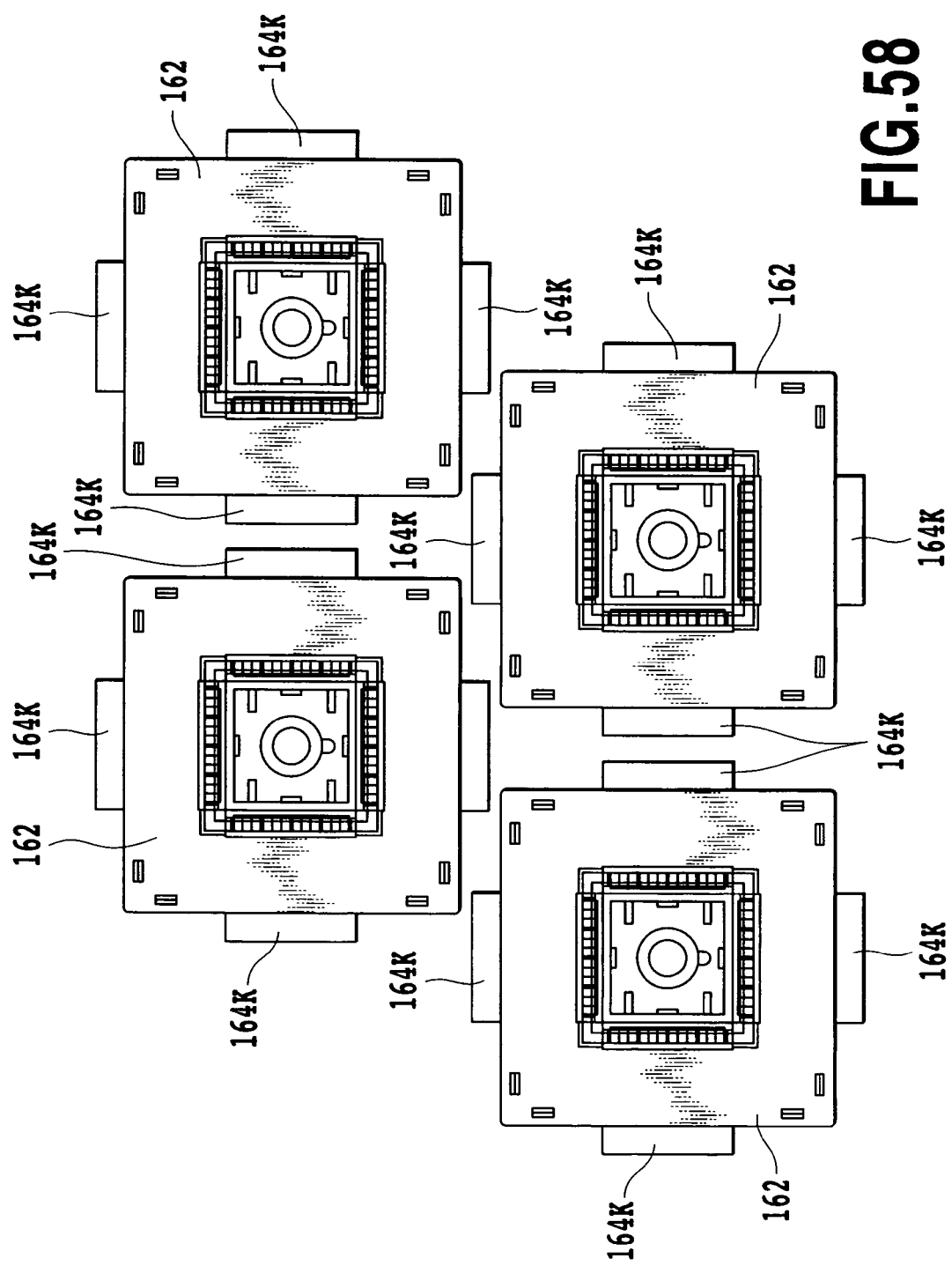
FIG. 58 is a plan view of a plurality of sockets for a semiconductor device shown in FIGS. 53A and 53B arranged in a staggered manner.

In this regard, as shown in FIG. 58, when three semiconductor device sockets or more are arranged, the engagement end section 164K of the lever member 164 in one semiconductor device socket in one row is disposed between the adjacent semiconductor device sockets in the other row adjacent to the one row. That is, for example, in FIG. 58, a center line of the semiconductor device socket in the other row is located at a position apart leftward therefrom by half a distance between centers of the adjacent semiconductor device sockets.

Figure 59:
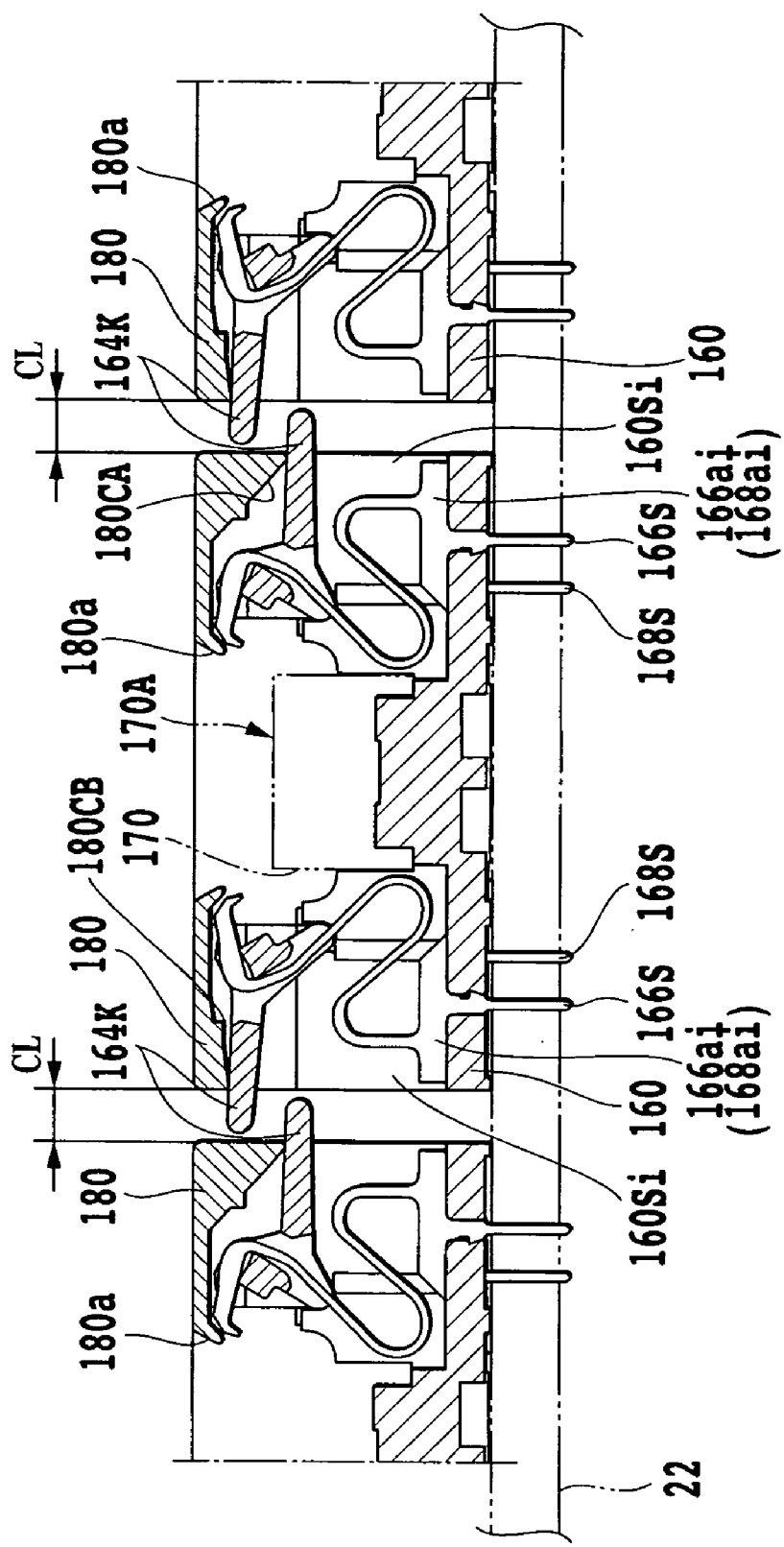
FIG. 59 is a sectional view of an eleventh embodiment of the socket for a semiconductor device in accordance with the present invention.

FIG. 59 illustrates an eleventh embodiment of the inventive semiconductor device socket. In this regard, in FIG. 59, the same constituent elements as in FIGS. 53A and 53B are denoted by the same reference numerals and the explanation thereof will be eliminated. FIG. 59 shows a state in which the cover member 180 is at the lowermost position.

A plurality of semiconductor device sockets are disposed in a predetermined direction on the printed wiring board 22 at positions corresponding to the respective electro-conductive layers thereof at a predetermined gap CL smaller than in the case shown in FIG. 56. As a result, since the mutual distance between one row of the semiconductor device sockets and the other row adjacent to the former becomes shorter, a dead space is reduced to realize the high-density mounting of the semiconductor device sockets.

The frame-like cover member 180 has an opening 180a in a central region thereof. The opening 180a allows the semiconductor element SDV to pass through the same during the attachment/detachment of the semiconductor element SDV relative to the accommodating section 170A. On the respective side of the cover member 180, a pair of claws engageable with a groove 160G of the socket body 160 in a movable manner are projected toward the outer circumference of the socket body 160. The cover member 180 is biased to be away from the socket body 160 by coil springs provided between the cover member 180 and the socket body 160. In this regard, the uppermost position of the cover member 180 is maintained by the engagement of the claws with the groove 160G.

On the respective side of the cover member 180, a predetermined cut is provided in correspondence to the engagement end section 164K of the lever member 164 as shown in FIG. 59. On the inner periphery of a lower end of the frame portion of the cover member 180 forming the cuts, cam surfaces 180CA and 180CB are formed.

In FIG. 59, the cam surface 180CA in the semiconductor device socket located at a center is formed, for example, on the right side farther in the direction vertical to the paper surface (not shown). On the other hand, the cam surface 180CB is formed on the left side closer in the direction vertical to the paper surface (not shown).

The cam surface 180CA has a slant lowering rightward at a predetermined inclination while widening in the widthwise direction of the respective side of the cover member 180. The cam surface 180CB has a slant lowering leftward at a predetermined inclination while widening in the widthwise direction of the respective side of the cover member 180. The inclination of the cam surface 180CB is smaller than that of the cam surface CA. A height of a portion of the cam surface CA intersecting the outer circumference of the cover member 180 from the surface of the printed wiring board 22 is lower than a height of a portion of the cam surface CB intersecting the outer circumference of the cover member 180.

Figure 55:
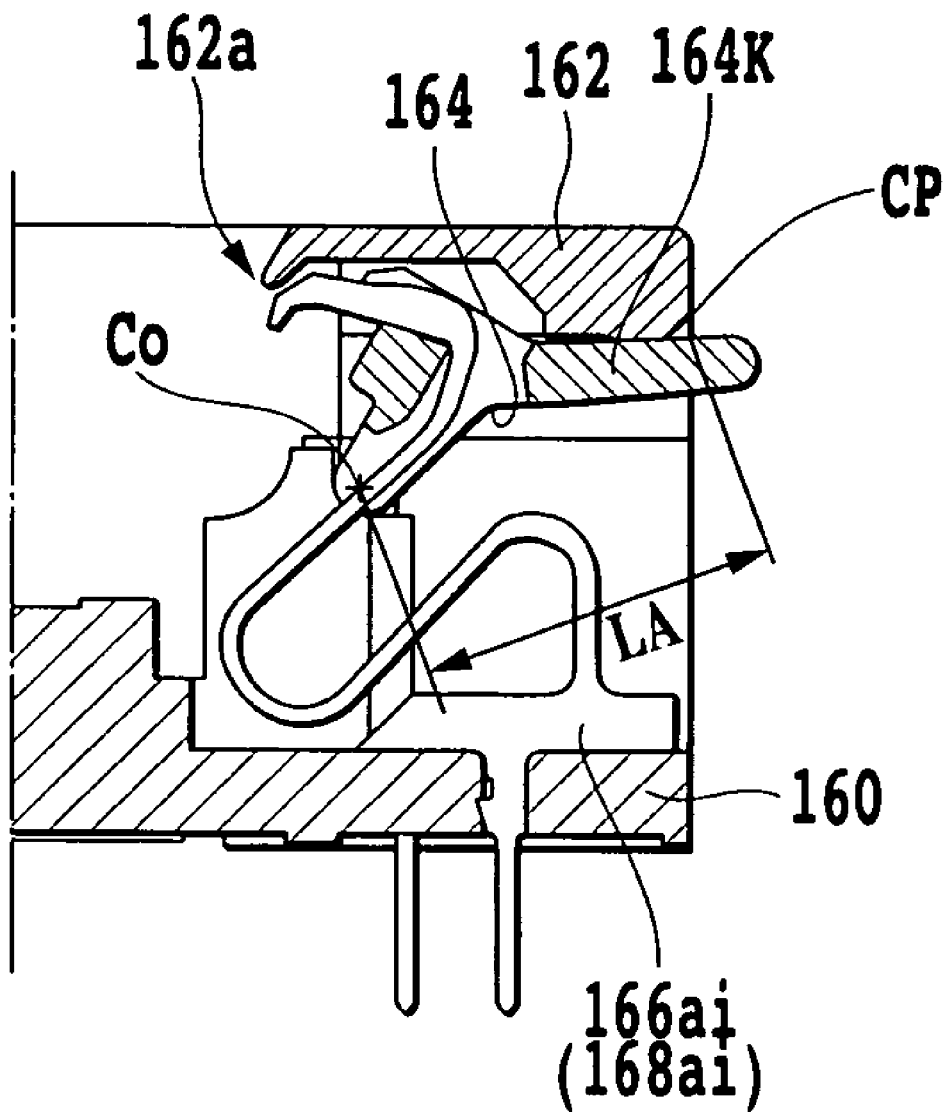
FIG. 55 is a sectional view partially of FIGS. 53A and 53B made available for illustrating the operation thereof.

On the periphery of the opening 180a, four reliefs contiguous to the cam surfaces 180CA and 180CB are formed. In the respective relief, as shown in FIG. 55, part of the lever member 154 and tip ends of the contact terminals 166ai and 168ai are disposed when the cover member 180 is lowered to a predetermined position.

Accordingly, when the cover member 180 is at the lowermost position, as shown in FIG. 59, there is no risk in that parts of the engagement end sections 164K of the lever members 164 projected outward in the adjacent semiconductor device sockets interfere with each other.

While the lever members 164 are provided so that the engagement end sections 164K of the lever members 164 in the adjacent semiconductor device sockets are directly opposite to each other in the embodiment shown in FIG. 58, this is not indispensable, but a widthwise center line of the lever member 164 may not coincide with the center axis of the socket body 160.

Figures 60A, 60B:
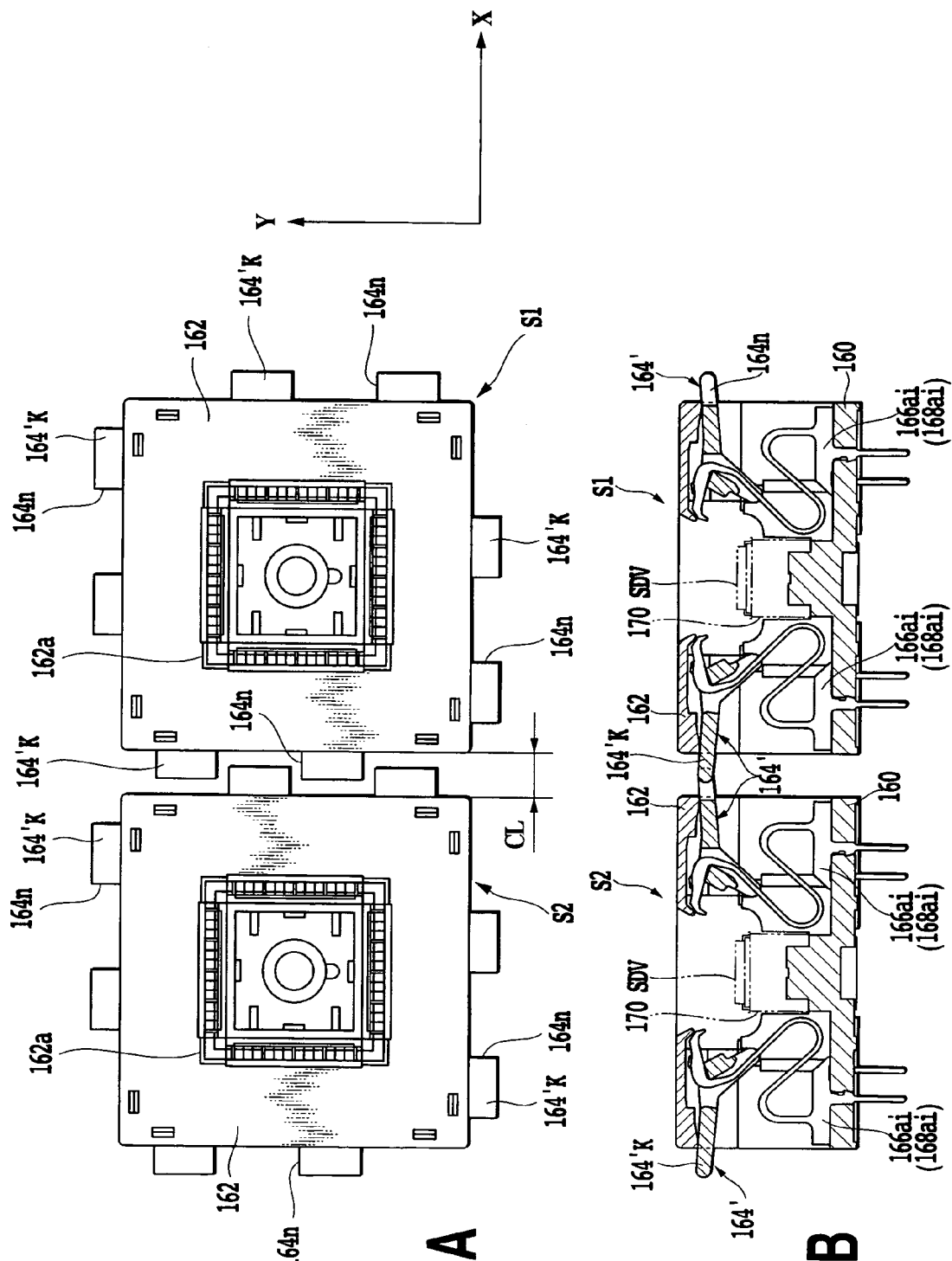
FIGS. 60A and 60B are a plan view and a sectional view, respectively, illustrating one modification of the embodiment shown in FIGS. 53A and 53B.

That is, when a plurality of semiconductor device sockets are arranged in the X-coordinate direction shown in FIG. 60A, the engagement end section 164'K of the lever member 164' located on a right side in the X-coordinate direction in one semiconductor device socket Si may be deviated to one side in the Y-coordinate direction relative to a center axis of the socket body 160, and the engagement end section 164'K of the lever member 164' located on a left side opposite to the former may be deviated to the other side in the Y-coordinate direction relative to a center axis of the socket body 160. Also, the engagement end section 164'K of one lever member 164' in the Y-coordinate direction in one semiconductor device socket Si may be deviated to a right side in the X-coordinate direction relative to a center axis of the socket body 160, and the engagement end section 164'K of the lever member 164' located opposite thereto may be deviated to the left side in the X-coordinate direction relative to a center axis of the socket body 160. At this time, as shown in FIG. 60B, heights of the opposite engagement end sections 164'K from the bottom of the socket body 160 are determined to be equal to each other. In this regard, FIG. 60B shows a state in which the cover member 162 is at the lowermost position.

Accordingly, since a gap CL between the socket bodies 160 in the adjacent semiconductor device sockets becomes smaller than the corresponding gap in the embodiment shown in FIG. 56, a dead space is further reduced.

In the embodiment shown in FIGS. 61A and 61B, a length of the engagement end section 165K of the lever member 165 is longer in each of a plurality of adjacent semiconductor device sockets S1 and S2 than that of the engagement end section 164'K of the lever member 164' in the above-mentioned embodiment. The cover member 162' has a recess Re in which a tip end of the engagement end section 165K in the opposite cover member is inserted when the cover member 164' is at the lowermost position. In the embodiment shown in FIGS. 61A and 61B, other constituent elements are the same as those in the embodiment shown in FIGS. 60A and 60B.

In FIG. 61A, the engagement end section 165K of the lever member 165 located on a right side in the X-coordinate direction in one semiconductor device socket Si may be deviated to one side in the Y-coordinate direction relative to a center axis of the socket body 160, and the engagement end section 165K of the lever member 165 located on a left side opposite to the former is deviated to the other side in the Y-coordinate direction relative to a center axis of the socket body 160. Also, the engagement end section 165K of one lever member 164 in the Y-coordinate direction in one semiconductor device socket Si is deviated to a right side in the X-coordinate direction relative to a center axis of the socket body 160, and the engagement end section 165 of the lever member 165 located opposite thereto may be deviated to the left side in the X-coordinate direction relative to a center axis of the socket body 160. At this time, the respective engagement end section 165K is bifurcated to have a cut 165n. In this regard, FIG. 61A shows a state in which the engagement end section 165K is projected outward when the cover member 162' is at the lowermost position.

The adjacent semiconductor device socket S2 has the same structure as in the semiconductor device socket S1, the engagement end sections 165K opposite to each other is disposed close to each other so that when the cover member 162' is at the lowermost position, one branch of the mating engagement end section 165K is inserted into the cut 165n. At this time, as shown in FIG. 61B, heights of the opposite engagement end sections 164K from the bottom of the socket body 160 are determined to be equal to each other. In this regard, FIG. 61B shows a state in which the cover member 162' is at the lowermost position.

Accordingly, even if a length of the engagement end section 165K is selected to be longer than a length of the engagement end section 164'K of the lever member 164' in the embodiment shown in FIG. 56, a gap CL' between the socket bodies 160 in the adjacent semiconductor device sockets 160 is smaller than the corresponding gap in the embodiment shown in FIG. 56.

FIGS. 62A and 62B show a twelfth embodiment of the inventive semiconductor device socket.

A plurality of semiconductor device sockets shown in FIGS. 62A and 62B are arranged on the printed wiring board 22 at positions corresponding to the respective electro-conductive layers. In FIGS. 62A and 62B, only one semiconductor device socket is shown.

The semiconductor device socket includes a socket body 184 fixed onto a printed wiring board 22, a contact terminal group CG arranged on opposite four sides of a semiconductor accommodating section 186A provided in a central portion of the socket body 184 and consisting of a plurality of contact terminals 166*ai* and 168*ai* (i=1 to n, n is a positive integer) for electrically connecting a semiconductor element SDV to the printed wiring board 22, a cover member 182 held by the socket body 184 to be movable upward and downward for transmitting the operative force to a lever mechanism described later, and a positioning section 186 held by the socket body 184 in a detachable manner, for accommodating the semiconductor element SDV to be tested and locating a terminal group of the semiconductor element SDV relative to the contact terminals 166*ai* and 168*ai*. In this regard, in FIGS. 62A and 62B, the same constituent elements as in FIGS. 53A and 53B are denoted by the same reference numerals and the explanation thereof will be eliminated.

Figure 63:
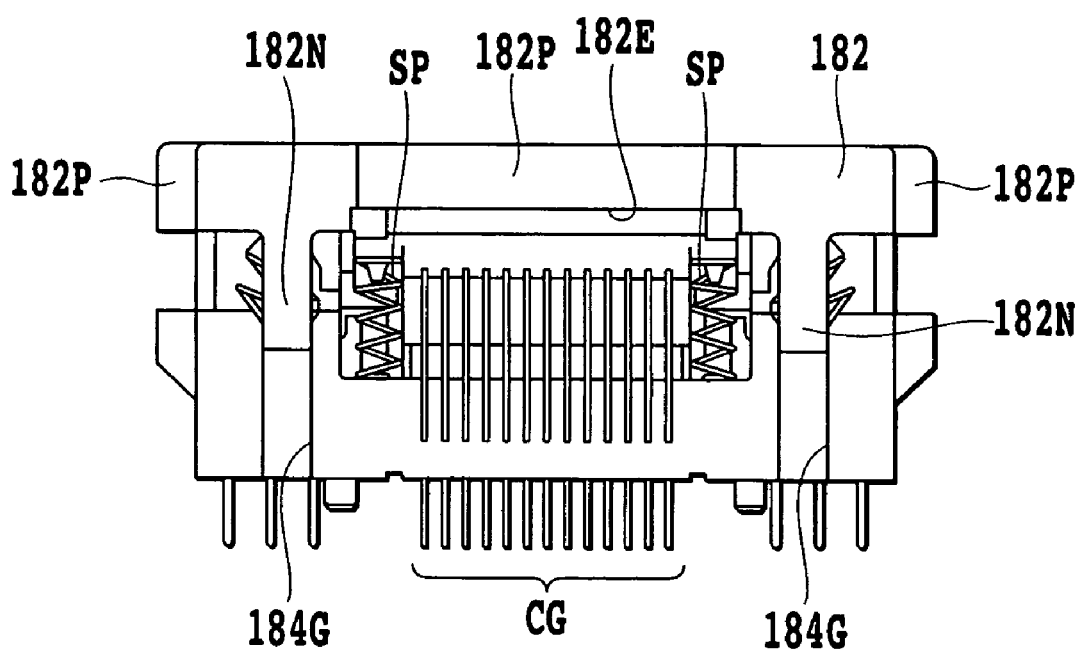
FIG. 63 is a side view of the embodiment shown in FIGS. 62A and 62B.

On the outer circumference of the respective side of the socket body 184, two elongate grooves 184G are formed parallel to each other and generally vertical to the surface of the printed wiring board 22. To the respective groove 184G, claws 182N of the cover member 182 described later is engaged in a slidable manner, as shown in FIG. 63.

As shown in FIG. 62A, in a central region of the socket body 184, the positioning section 186 having the accommodating section 186A for accommodating the semiconductor element SDV to be tested is disposed.

As shown in FIGS. 62A and 62B, in the respective side wall of the socket body 160 encircling the positioning section 186, slits 184Si (i=1 to n, n is a positive integer) for allowing contact terminals described later are formed at a predetermined pitch. The adjacent slits 184Si are separated by a partitioning wall BW. In the partitioning wall BW, a widening section 184*e* obliquely bulged upward from a lower portion thereof is formed.

The respective slit 184S is formed in correspondence to a terminal of the semiconductor element SDV mounted to the accommodating section 186A of the positioning section 186. The number and the pitch of the slits 184Si are determined in accordance with those of the terminals of the semiconductor element SDV. Accordingly, the terminals of the semiconductor element SDV are positioned to the contacts of the contact terminals.

The semiconductor element SDV has a package, for example, of QFP type.

A length of the respective side of the frame-like cover member 182 is selected to be generally equal to the outer dimension of the socket body 160. The cover member 182 has an opening 182*a* in a central region thereof. The opening 182*a* allows the semiconductor element SDV to pass through the same during the attachment/detachment of the semiconductor element SDV relative to the accommodating section 186A. On the respective side of the cover member 182, as shown in FIG. 59, a pair of claws 182N engageable with the groove 184G of the socket body 184 are projected toward the outer circumference of the socket body 184. The cover member 182 is biased by coil springs SP provided between the cover member 182 and the socket body 184 to be away from the socket body 184. In this regard, the cover member 182 is maintained at the uppermost position by the engagement of an end of the claw 182N with an end of the groove 184G.

On the respective side of the cover member 182, a cut 182E and a projection 182P are formed in correspondence to the engagement end section 164K of the lever member 164. A length of the side of the cover member 182 including the projection 182P is determined such that when the cover member 182 is at the lowermost position, as shown in FIG. 62B, a tip end of the engagement end section 164K is not projected outside. At a lower end of the frame portion of the cover member 182E having the cuts 182E, a cam surface 182CA is formed. On the periphery of the opening 182*a*, four reliefs contiguous to the cam surface 182CA are formed. As shown in FIG. 62B, part of the lever member 164 and tip ends of the contact terminals 166*ai* and 168*ai* are present when the cover member 182 is lowered to a predetermined position.

Figure 64:
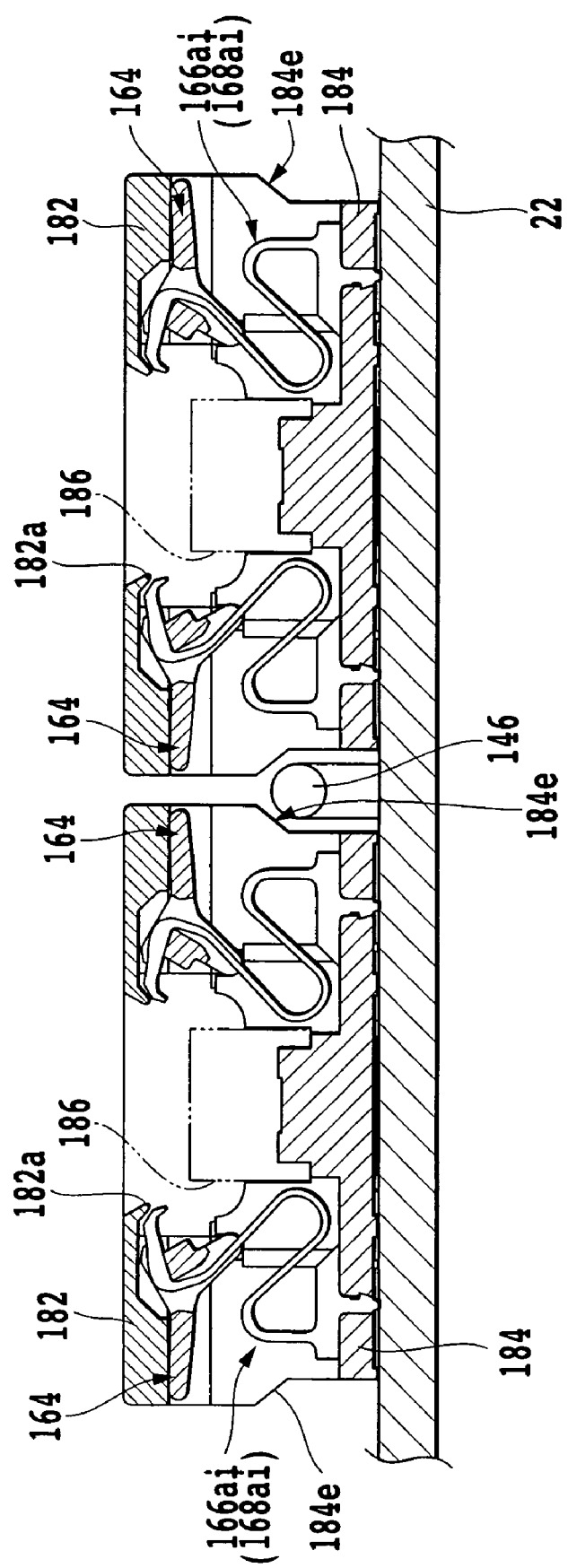
FIG. 64 is a sectional view of a plurality of sockets for a semiconductor device arranged parallel to each other.
Figure 65:
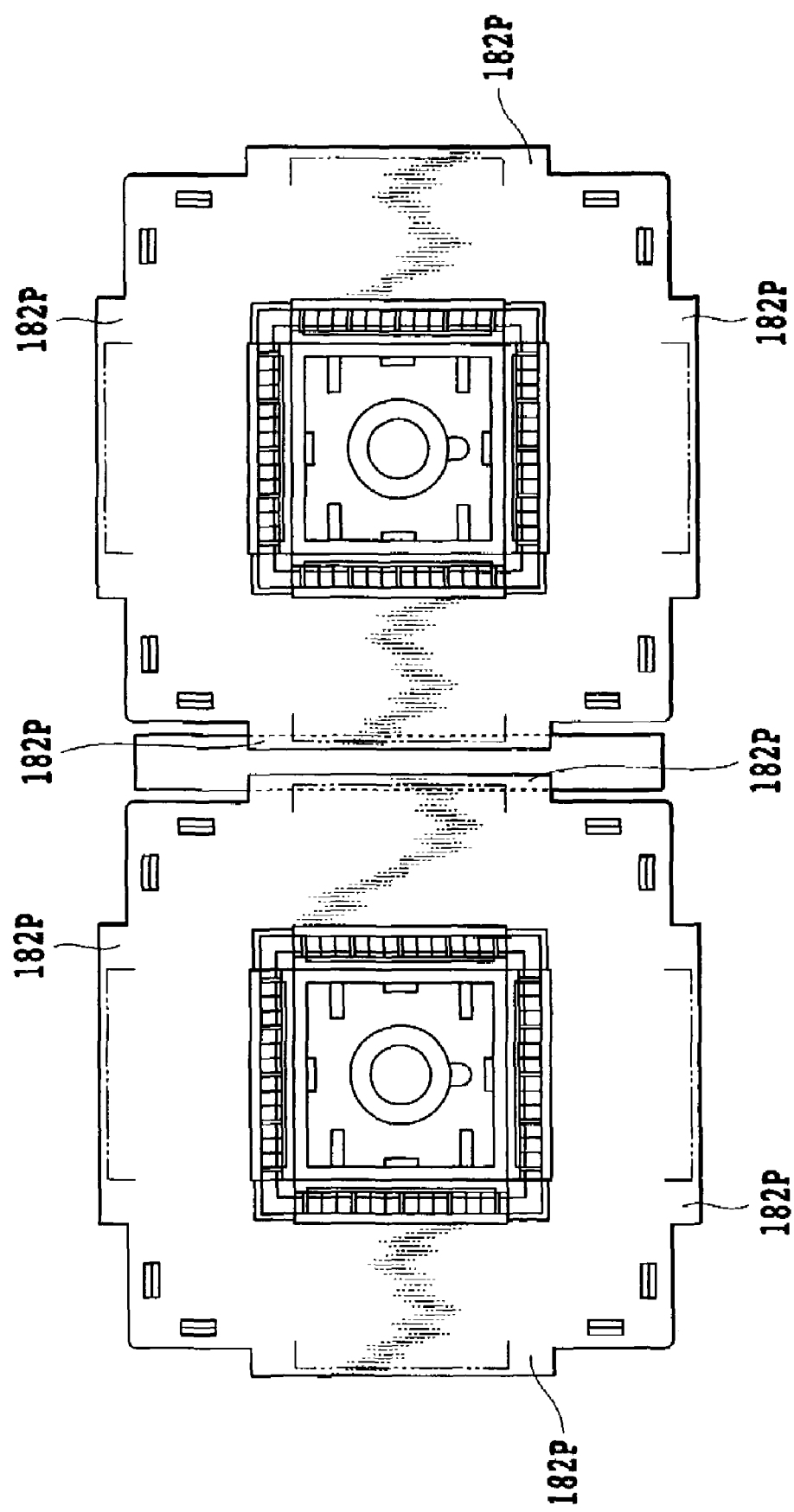
FIG. 65 is a plan view of FIG. 64.

FIGS. 64 and 65 show a state in which a plurality of the inventive semiconductor device sockets according to the tenth embodiment are arranged on the printed wiring board 22. In this regard, in FIGS. 64 and 65, the same constituent elements as in FIGS. 62A and 62B are denoted by the same reference numerals and the explanation thereof will be eliminated. FIG. 64 shows a state in which the cover member 182 is at the lowermost position.

As shown in FIGS. 64 and 65, the adjacent semiconductor device sockets are arranged in one row so that the engagement end sections 164K of the lever members 164 in the respective semiconductor device sockets are close to each other via a gap. At this time, in a space encircled by the widening sections 184*e* in the adjacent semiconductor device sockets, an electric part 146 such as a capacitor is disposed on the printed wiring board 22. Accordingly, a dead space on the printed wiring board 22 is effectively usable.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A socket for a semiconductor device, comprising:
   a socket body having a semiconductor device placement section for selectively accommodating a semiconductor device for electrical connection with contact terminals, said semiconductor device being one of a plurality of semiconductor devices having contour dimensions different from one another;
   a pressing member having a touch portion brought in contact with said semiconductor device and pressing said semiconductor device toward said contact terminals, said pressing member being driven by a pressing member driving mechanism in accordance with the attachment or detachment of said semiconductor device relative to said semiconductor device placement section, for holding said semiconductor device in said semiconductor device placement section; and
   wherein, when said pressing member driving mechanism moves said touch portion of said pressing member to a position in which said touch portion of said pressing member does not contact said semiconductor device upon the attachment or detachment of said semiconductor device, a portion of said pressing member is bulged outwardly from an end of said socket body via an opening of said socket body.

2. A socket for a semiconductor device as claimed in claim 1, wherein
   said pressing member is a first pressing member, said first pressing member having a first proximal end supported in a moveably rotational manner at one end of said socket body, said touch portion is a first touch portion and is coupled to said first proximal end, and the movement of said first proximal end causes said first touch portion to contact said semiconductor device so that said semiconductor device is pressed toward said contact terminals, the socket further comprising:

a second pressing member for holding said semiconductor device in said semiconductor device placement section in association with said first pressing member, said second pressing member having a second proximal end supported in a moveably rotational manner at another end of said socket body, said second pressing member having a second touch portion coupled to said second proximal end, wherein the movement of said second proximal end causes said second touch portion to contact said semiconductor device so that said semiconductor device is pressed toward said contact terminals.

3. A socket for a semiconductor device, comprising:

a socket body having a semiconductor device placement section for selectively accommodating a semiconductor device for electrical connection with contact terminals, said semiconductor device being one of a plurality of semiconductor devices having contour dimensions different from one another;

a pressing member having a touch portion brought in contact with said semiconductor device and pressing said semiconductor device toward said contact terminals, for holding said semiconductor device in said semiconductor device placement section; and a cover member supported by said socket body in a movable manner for bringing said touch portion of said pressing member into contact with or away from said semiconductor device in accordance with the attachment or detachment of said semiconductor device relative to said semiconductor device placement section;

wherein, said cover member and said socket body have openings, respectively, so that when said cover member causes said touch portion of said pressing member to move to a position in which said touch portion of said pressing member does not contact said semiconductor device, a portion of said pressing member is bulged outwardly from an end of said socket body via one or more of the openings of the socket body.

4. A socket for a semiconductor device comprising:

a socket body having a semiconductor device placement section for selectively accommodating a semiconductor device for electrical connection with contact terminals, said semiconductor device being one of a plurality of semiconductor devices having contour dimensions different from one another;

a first pressing member having a first touch portion brought in contact with said semiconductor device and pressing said semiconductor device toward said contact terminals, said pressing member being driven by a pressing member driving mechanism in accordance with the attachment or detachment of said semiconductor device relative to said semiconductor device placement section, for holding said semiconductor device in said semiconductor device placement section;

a second pressing member for holding said semiconductor device in said semiconductor device placement section in association with said first pressing member, and wherein, when said pressing member driving mechanism moves said first touch portion of said pressing member to a position in which said first touch portion of said pressing member does not contact said semiconductor device upon the attachment or detachment of said semiconductor device, a portion of said first pressing member is bulged outwardly from an end of said socket body via an opening of said socket body, said first pressing member has a first proximal end supported in a moveably rotationally manner at one end of said socket body, said second pressing member has a second proximal end supported in a moveably rotationally manner at another end of said socket body and a touch portion in contact with said semiconductor device so that said semiconductor device is pressed toward said contact terminals, and said second pressing member has a recess for allowing a portion of said first pressing member to enter.

* * * * *